United States Patent
Suzawa et al.

(10) Patent No.: US 8,912,040 B2
(45) Date of Patent: Dec. 16, 2014

(54) METHOD FOR MANUFACTURING SEMICONDUCTOR DEVICE

(75) Inventors: Hideomi Suzawa, Atsugi (JP); Shinya Sasagawa, Chigasaki (JP); Taiga Muraoka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/012,987

(22) Filed: Jan. 25, 2011

(65) Prior Publication Data

US 2011/0117698 A1    May 19, 2011

Related U.S. Application Data

(63) Continuation of application No. 12/580,512, filed on Oct. 16, 2009, now Pat. No. 7,915,075.

(30) Foreign Application Priority Data

Oct. 22, 2008  (JP) ................. 2008-271598

(51) Int. Cl.
 *H01L 21/00*      (2006.01)
 *H01L 21/16*      (2006.01)
 *H01L 29/786*     (2006.01)
 *H01L 27/12*      (2006.01)

(52) U.S. Cl.
 CPC ........ *H01L 29/7869* (2013.01); *H01L 27/1225* (2013.01)
 USPC .................... 438/104; 438/158; 257/E21.414

(58) Field of Classification Search
 USPC ........... 438/46, 104, 149, 158–165, 355, 770; 257/43, E21.301, E21.314, E21.414, 257/E21.485
 See application file for complete search history.

(56) References Cited

U.S. PATENT DOCUMENTS

| | | |
|---|---|---|
| 5,256,897 A | 10/1993 | Hasegawa et al. |
| 5,338,959 A | 8/1994 | Kim et al. |

(Continued)

FOREIGN PATENT DOCUMENTS

| | | |
|---|---|---|
| CN | 1941299 | 4/2007 |
| CN | 101278403 | 10/2008 |

(Continued)

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

(Continued)

*Primary Examiner* — Alexander Ghyka
*Assistant Examiner* — Abdulfattah Mustapha
(74) *Attorney, Agent, or Firm* — Eric J. Robinson; Robinson Intellectual Property Law Office, P.C.

(57) ABSTRACT

An object is to establish a processing technique in manufacture of a semiconductor device in which an oxide semiconductor is used. A gate electrode is formed over a substrate, a gate insulating layer is formed over the gate electrode, an oxide semiconductor layer is formed over the gate insulating layer, the oxide semiconductor layer is processed by wet etching to form an island-shaped oxide semiconductor layer, a conductive layer is formed to cover the island-shaped oxide semiconductor layer, the conductive layer is processed by dry etching to form a source electrode, and a drain electrode and part of the island-shaped oxide semiconductor layer is removed by dry etching to form a recessed portion in the island-shaped oxide semiconductor layer.

54 Claims, 29 Drawing Sheets

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 5,755,938 A | 5/1998 | Fukui et al. |
| 5,847,410 A | 12/1998 | Nakajima |
| 6,051,453 A | 4/2000 | Takemura |
| 6,124,606 A | 9/2000 | Boer et al. |
| 6,294,274 B1 | 9/2001 | Kawazoe et al. |
| 6,310,362 B1 | 10/2001 | Takemura |
| 6,359,672 B2 | 3/2002 | Gu et al. |
| 6,534,832 B2 | 3/2003 | Takemura |
| 6,558,987 B2 | 5/2003 | Lee |
| 6,563,174 B2 | 5/2003 | Kawasaki et al. |
| 6,586,346 B1 | 7/2003 | Yamazaki et al. |
| 6,680,242 B2 | 1/2004 | Ohtsu et al. |
| 6,727,522 B1 | 4/2004 | Kawasaki et al. |
| 6,762,802 B2 | 7/2004 | Ono et al. |
| 6,838,308 B2 | 1/2005 | Haga |
| 6,900,872 B2 | 5/2005 | Kang |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,067,843 B2 | 6/2006 | Carcia et al. |
| 7,071,037 B2 | 7/2006 | Suzawa et al. |
| 7,105,868 B2 | 9/2006 | Nause et al. |
| 7,145,174 B2 | 12/2006 | Chiang et al. |
| 7,199,846 B2 | 4/2007 | Lim |
| 7,211,825 B2 | 5/2007 | Shih et al. |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,301,211 B2 | 11/2007 | Yamazaki et al. |
| 7,323,356 B2 | 1/2008 | Hosono et al. |
| 7,339,187 B2 | 3/2008 | Wager et al. |
| 7,358,592 B2 | 4/2008 | Ueno |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,470,607 B2 | 12/2008 | Carcia et al. |
| 7,501,293 B2 | 3/2009 | Ito et al. |
| 7,507,618 B2 | 3/2009 | Dunbar |
| 7,544,967 B2 | 6/2009 | Kim et al. |
| 7,566,904 B2 | 7/2009 | Ishii |
| 7,575,966 B2 | 8/2009 | Lai et al. |
| 7,576,394 B2 | 8/2009 | Furuta et al. |
| 7,601,984 B2 | 10/2009 | Sano et al. |
| 7,608,531 B2 | 10/2009 | Isa et al. |
| 7,611,930 B2 | 11/2009 | Yamazaki et al. |
| 7,622,371 B2 | 11/2009 | Pan et al. |
| 7,635,889 B2 | 12/2009 | Isa et al. |
| 7,645,478 B2 | 1/2010 | Thelss et al. |
| 7,663,302 B2 | 2/2010 | Shin et al. |
| 7,674,650 B2 | 3/2010 | Akimoto et al. |
| 7,691,666 B2 | 4/2010 | Levy et al. |
| 7,714,329 B2 | 5/2010 | Suzawa et al. |
| 7,732,251 B2 | 6/2010 | Hoffman et al. |
| 7,732,819 B2 | 6/2010 | Akimoto et al. |
| 7,733,015 B2 | 6/2010 | Saito |
| 7,749,825 B2 | 7/2010 | Honda |
| 7,767,106 B2 | 8/2010 | Chang |
| 7,767,505 B2 | 8/2010 | Son et al. |
| 7,772,021 B2 | 8/2010 | Lee et al. |
| 7,791,072 B2 | 9/2010 | Kumomi et al. |
| 7,791,082 B2 | 9/2010 | Iwasaki |
| 7,795,613 B2 | 9/2010 | Ito et al. |
| 7,829,444 B2 | 11/2010 | Yabuta et al. |
| 7,863,611 B2 | 1/2011 | Abe et al. |
| 7,867,636 B2 | 1/2011 | Nakagawara et al. |
| 7,868,326 B2 | 1/2011 | Sano et al. |
| 7,872,259 B2 | 1/2011 | Den et al. |
| 7,884,360 B2 | 2/2011 | Takechi et al. |
| 7,910,490 B2 | 3/2011 | Akimoto et al. |
| 7,919,365 B2 | 4/2011 | Kim et al. |
| 7,919,445 B2 | 4/2011 | Mellies |
| 7,932,521 B2 | 4/2011 | Akimoto et al. |
| 7,935,964 B2 | 5/2011 | Kim et al. |
| 7,940,345 B2 | 5/2011 | Yamazaki |
| 7,982,215 B2 | 7/2011 | Inoue et al. |
| 7,998,372 B2 | 8/2011 | Yano et al. |
| 8,013,331 B2 | 9/2011 | Wakita |
| 8,022,405 B2 | 9/2011 | Yamazaki |
| 8,030,195 B2 | 10/2011 | Inoue et al. |
| 8,030,655 B2 | 10/2011 | Yamazaki |
| 8,084,307 B2 | 12/2011 | Itagaki et al. |
| 8,134,156 B2 | 3/2012 | Akimoto |
| 8,158,464 B2 | 4/2012 | Akimoto |
| 8,168,544 B2 | 5/2012 | Chang |
| 8,207,756 B2 | 6/2012 | Shionoiri et al. |
| 8,212,953 B2 | 7/2012 | Hosoya |
| 8,222,098 B2 | 7/2012 | Honda |
| 8,236,635 B2 | 8/2012 | Suzawa et al. |
| 8,242,494 B2 | 8/2012 | Suzawa et al. |
| 8,274,077 B2 | 9/2012 | Akimoto et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,343,799 B2 | 1/2013 | Ito et al. |
| 8,368,079 B2 | 2/2013 | Akimoto |
| 8,415,198 B2 | 4/2013 | Itagaki et al. |
| 8,420,442 B2 | 4/2013 | Takechi et al. |
| 8,525,165 B2 | 9/2013 | Akimoto |
| 2001/0030323 A1 | 10/2001 | Ikeda |
| 2001/0046027 A1 | 11/2001 | Tai et al. |
| 2002/0044111 A1 | 4/2002 | Yamazaki et al. |
| 2002/0056838 A1 | 5/2002 | Ogawa |
| 2002/0185466 A1 | 12/2002 | Furuta et al. |
| 2003/0189401 A1 | 10/2003 | Kido et al. |
| 2003/0218215 A1 | 11/2003 | Takemura |
| 2004/0004220 A1 | 1/2004 | Suzuki |
| 2006/0000802 A1 | 1/2006 | Kumar et al. |
| 2006/0046512 A1 | 3/2006 | Nakamura et al. |
| 2006/0113541 A1 | 6/2006 | Takemura |
| 2006/0197092 A1 | 9/2006 | Hoffman et al. |
| 2006/0208977 A1 | 9/2006 | Kimura |
| 2006/0238135 A1 | 10/2006 | Kimura |
| 2006/0244107 A1 | 11/2006 | Sugihara et al. |
| 2006/0267141 A1 | 11/2006 | Saito |
| 2007/0017898 A1 | 1/2007 | Kumar et al. |
| 2007/0030434 A1 | 2/2007 | Hirabayashi et al. |
| 2007/0052025 A1 | 3/2007 | Yabuta |
| 2007/0072439 A1 | 3/2007 | Akimoto et al. |
| 2007/0087487 A1* | 4/2007 | Honda .................. 438/149 |
| 2007/0090365 A1 | 4/2007 | Hayashi et al. |
| 2007/0096816 A1 | 5/2007 | Paul et al. |
| 2007/0108446 A1 | 5/2007 | Akimoto |
| 2007/0120785 A1 | 5/2007 | Kimura |
| 2007/0146566 A1 | 6/2007 | Hosoya |
| 2007/0152217 A1 | 7/2007 | Lai et al. |
| 2007/0170434 A1 | 7/2007 | Inoue et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0249104 A1 | 10/2007 | Lin |
| 2007/0252928 A1 | 11/2007 | Ito et al. |
| 2007/0272922 A1 | 11/2007 | Kim et al. |
| 2007/0287296 A1 | 12/2007 | Chang |
| 2007/0298554 A1 | 12/2007 | Long et al. |
| 2008/0006877 A1 | 1/2008 | Mardilovich et al. |
| 2008/0038882 A1 | 2/2008 | Takechi et al. |
| 2008/0087981 A1* | 4/2008 | Matsuno .................. 257/510 |
| 2008/0106191 A1 | 5/2008 | Kawase |
| 2008/0129195 A1 | 6/2008 | Ishizaki et al. |
| 2008/0166834 A1 | 7/2008 | Kim et al. |
| 2008/0176364 A1 | 7/2008 | Yang et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0233730 A1 | 9/2008 | Yu et al. |

(56) References Cited

U.S. PATENT DOCUMENTS

| | | |
|---|---|---|
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1* | 12/2008 | Akimoto et al. ............ 257/43 |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0001375 A1 | 1/2009 | Yamazaki et al. |
| 2009/0002591 A1 | 1/2009 | Yamazaki et al. |
| 2009/0008638 A1 | 1/2009 | Kang et al. |
| 2009/0008639 A1 | 1/2009 | Akimoto et al. |
| 2009/0009677 A1 | 1/2009 | Yamazaki et al. |
| 2009/0033818 A1 | 2/2009 | Nakajima et al. |
| 2009/0057683 A1 | 3/2009 | Nakajima et al. |
| 2009/0061574 A1 | 3/2009 | Nakajima et al. |
| 2009/0065771 A1 | 3/2009 | Iwasaki et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0142887 A1 | 6/2009 | Son et al. |
| 2009/0148970 A1 | 6/2009 | Hosoya et al. |
| 2009/0149030 A1 | 6/2009 | Chang |
| 2009/0152506 A1 | 6/2009 | Umeda et al. |
| 2009/0152541 A1 | 6/2009 | Maekawa et al. |
| 2009/0174834 A1* | 7/2009 | Choi et al. ............ 349/46 |
| 2009/0186437 A1 | 7/2009 | Akimoto |
| 2009/0186445 A1 | 7/2009 | Akimoto |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0025678 A1 | 2/2010 | Yamazaki et al. |
| 2010/0051941 A1 | 3/2010 | Tanaka |
| 2010/0051949 A1 | 3/2010 | Yamazaki et al. |
| 2010/0059742 A1 | 3/2010 | Shieh et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0102315 A1 | 4/2010 | Suzawa et al. |
| 2010/0105162 A1 | 4/2010 | Suzawa et al. |
| 2010/0105163 A1 | 4/2010 | Ito et al. |
| 2010/0105164 A1 | 4/2010 | Ito et al. |
| 2010/0109002 A1 | 5/2010 | Itagaki et al. |
| 2010/0117075 A1 | 5/2010 | Akimoto et al. |
| 2010/0123136 A1 | 5/2010 | Lee et al. |
| 2010/0136743 A1 | 6/2010 | Akimoto et al. |
| 2010/0163876 A1 | 7/2010 | Inoue et al. |
| 2010/0283055 A1 | 11/2010 | Inoue et al. |
| 2010/0301329 A1 | 12/2010 | Asano et al. |
| 2011/0062433 A1 | 3/2011 | Yamazaki |
| 2011/0062436 A1 | 3/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2011/0198595 A1 | 8/2011 | Yamazaki |
| 2011/0278577 A1 | 11/2011 | Yamazaki |
| 2012/0009742 A1 | 1/2012 | Yamazaki |
| 2012/0097964 A1 | 4/2012 | Honda |
| 2012/0270348 A1 | 10/2012 | Hosoya |
| 2012/0286266 A1 | 11/2012 | Suzawa et al. |
| 2012/0286267 A1 | 11/2012 | Suzawa et al. |
| 2013/0105793 A1 | 5/2013 | Ito et al. |
| 2013/0237012 A1 | 9/2013 | Takechi et al. |

FOREIGN PATENT DOCUMENTS

| | | |
|---|---|---|
| EP | 1612840 A | 1/2006 |
| EP | 1 737 044 | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998374 A | 12/2008 |
| EP | 1998375 A | 12/2008 |
| EP | 2 226 847 | 9/2010 |
| JP | 60-017962 | 1/1985 |
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 03-231472 | 10/1991 |
| JP | 05-251705 | 9/1993 |
| JP | 08-264794 | 10/1996 |
| JP | 09-199474 A | 7/1997 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 3411408 | 6/2003 |
| JP | 3430335 | 7/2003 |
| JP | 2004-031409 A | 1/2004 |
| JP | 2004-103957 | 4/2004 |
| JP | 2004-273614 | 9/2004 |
| JP | 2004-273732 | 9/2004 |
| JP | 2007-073560 A | 3/2007 |
| JP | 2007-096055 | 4/2007 |
| JP | 2007-123861 | 5/2007 |
| JP | 2007-250983 | 9/2007 |
| JP | 2007-284342 A | 11/2007 |
| JP | 2007-299913 | 11/2007 |
| JP | 2007-335505 | 12/2007 |
| JP | 2008-041695 | 2/2008 |
| JP | 2008-042067 | 2/2008 |
| JP | 2008-042088 A | 2/2008 |
| JP | 2008-053356 A | 3/2008 |
| JP | 2008-130814 A | 6/2008 |
| TW | 200539342 | 12/2005 |
| TW | 200601429 | 1/2006 |
| TW | 200733398 | 9/2007 |
| TW | 200839847 | 10/2008 |
| WO | WO 2004/114391 | 12/2004 |
| WO | WO-2007/043493 | 4/2007 |
| WO | WO-2007/058329 | 5/2007 |
| WO | WO 2007/119386 | 10/2007 |
| WO | WO-2007/148601 | 12/2007 |
| WO | WO-2008/023553 | 2/2008 |
| WO | WO-2008/062720 | 5/2008 |

OTHER PUBLICATIONS

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$, (m = 3, 4, and 5), $InGaO_3(ZnO)_3$, and

(56) References Cited

OTHER PUBLICATIONS $Ga_2O_3(ZnO)_m$ ($m$ = 7, 8, 9, and 16) in the $In_2O_3$-$ZnGa_2O_4$-$ZnO$ System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Lee et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Kurokawa et al., "UHF RFCPUS on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid—Cholesteric Liquid Crystal Transition: The "Blue Phase"," Physics Letters, Sep. 10, 1973, vol. 45A, No. 2, pp. 115-116.

Cho et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display With Driver Circuit Using Amorphous In-Ga-Zn-Oxide TFTs," IDW '09: Proceedings of the 16$^{th}$ International Display Workshops, 2009, pp. 689-692.

Park et al., "Amorphous Indium-Gallium-Zinc Oxide TFTs and Their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel Using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDS," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 in. QVGA Amoled Display Using In-Ga-Zn-Oxide TFTs With a Novel Passivation Layer," SID Digest '09: SID International Symposium Digest of Technical Papers, May 31, 2009, pp. 284-287.

Miyasaka, "58.2 Invited Paper: SUFTLA Flexible Microelectronics on Their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO

(56) References Cited

OTHER PUBLICATIONS $(Ga_2O_3-In_2O_3-ZnO)$ TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, the Japan Society of Applied Physics.

Park et al., "High performance amorphous oxide thin film transistors with self-aligned top-gate structure," IEDM 09: Technical Digest of International Electron Devices Meeting, Dec. 7, 2009, pp. 191-194.

Nakamura, "Synthesis of Homologous Compound with New Long-Period Structure," NIRIM Newsletter, Mar. 1, 1995, vol. 150, pp. 1-5.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review. B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), 2007, vol. 76, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review. B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the $6^{th}$ International Display Workshops, Dec. 3, 2008, pp. 581-584.

Kim et al., "High-Performance oxide thin film transistors passivated by various gas plasmas," $214^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Chinese Office Action (Application No. 201110044658.9) Dated Nov. 23, 2012.

Song, I. et al., Short Channel Characteristics of Gallium-Indium-Zinc-Oxide Thin Film Transistors for Three-Dimensional Stacking Memory IEEE Electron Device Letters, vol. 29, No. 6, pp. 549-552, Jun. 2008.

Kim.C et al., "A Novel Four-Mask-Count Process Architecture for TFT-LCDS,", SID Digest '00 : SID International Symposium Digest of Technical Papers, 2000, vol. 31, pp. 1006-1009.

Song.J et al., "34.1: Advanced Four-Mask Process Architecture for the A-SI TFT Array Manufacturing Method,", SID Digest '02 : SID International Symposium Digest of Technical Papers, 2002, vol. 33, pp. 1038-1041.

Park.J et al "High-performance amorphous gallium indium zinc oxide thin-film transistors through N2O plasma passivation,", Appl. Phys. Lett. (Applied Physics Letters), Aug. 7, 2008, vol. 93, pp. 053505-1-053505-3.

Chinese Office Action (Application No. 200910206584.7) Dated Feb. 16, 2013.

Taiwanese Office Action (Application No. 100105338) Dated Sep. 25, 2013.

Taiwanese Office Action (Application No. 98135432) Dated Aug. 28, 2013.

Chinese Office Action (Application No. 200910206584.7) Dated Oct. 16, 2014.

\* cited by examiner

FIG. 4
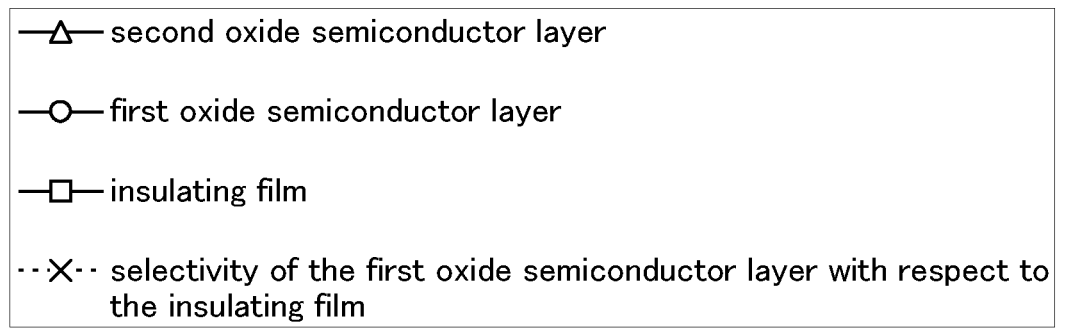
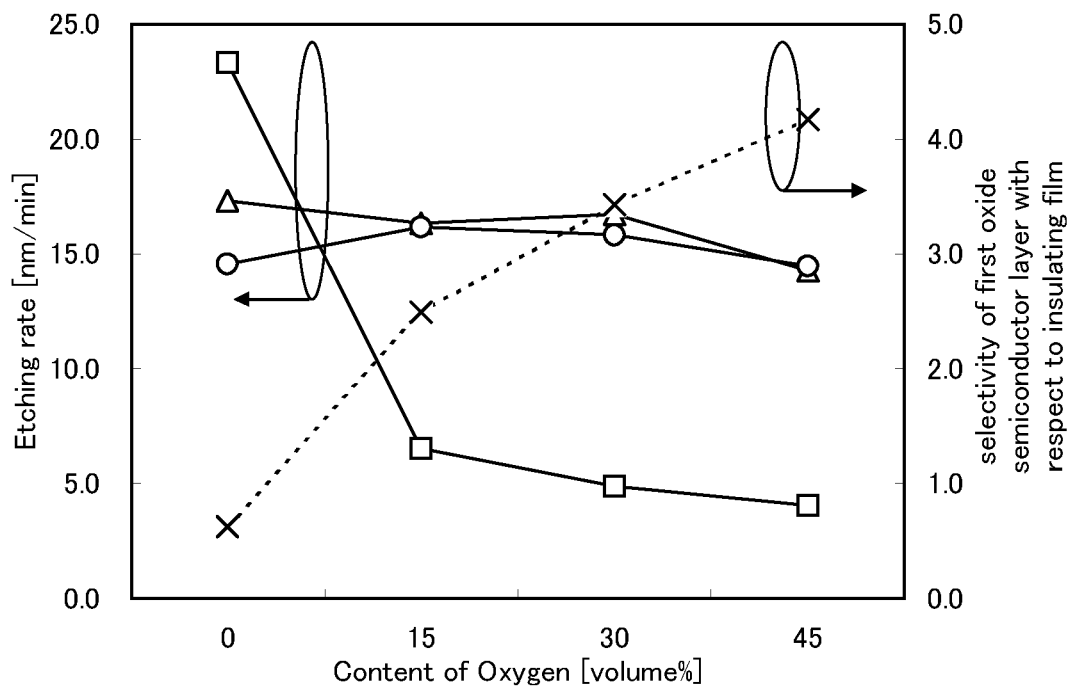

FIG. 11A1 　　　　　FIG. 11A2
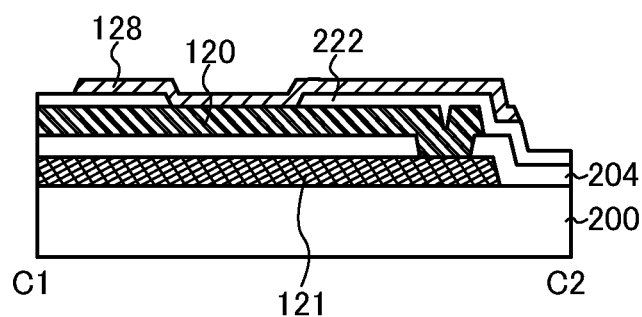
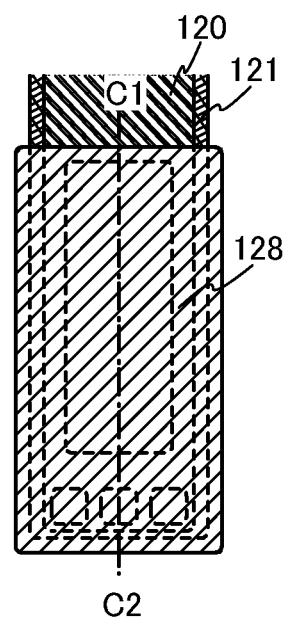
FIG. 11B1 　　　　　FIG. 11B2
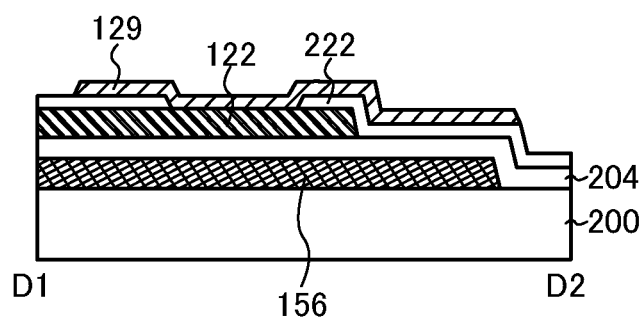
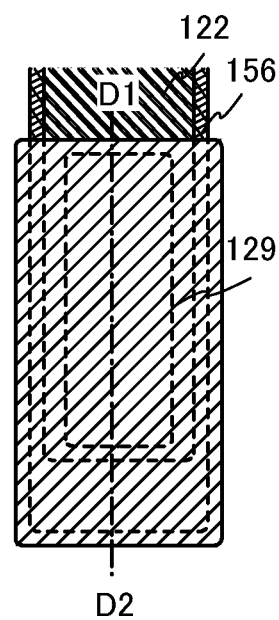

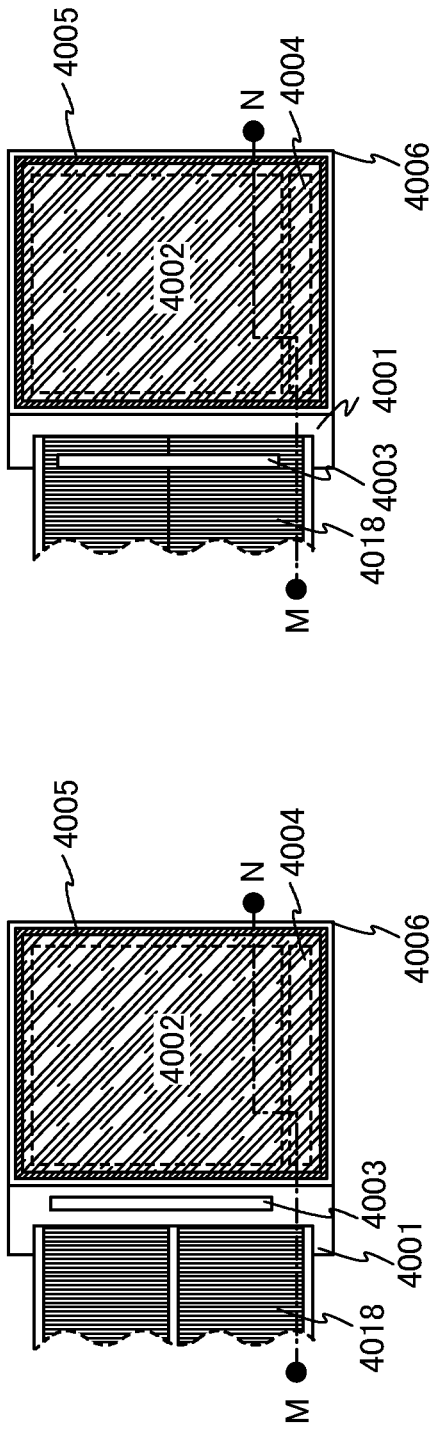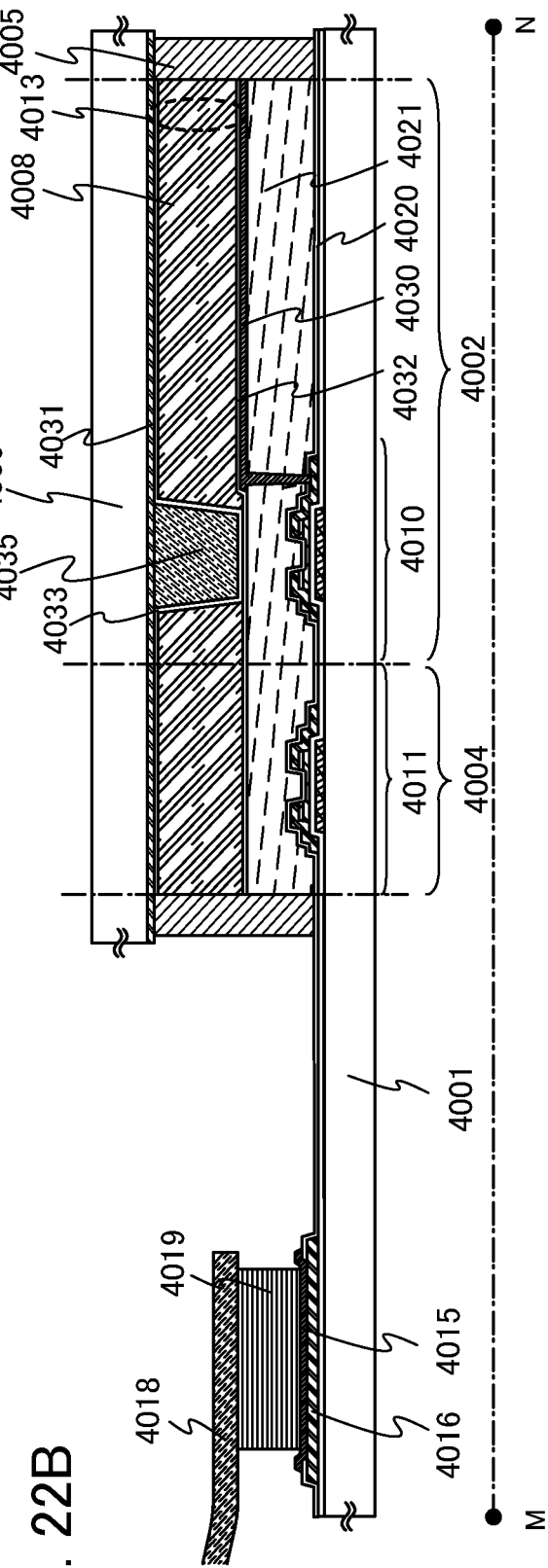

METHOD FOR MANUFACTURING SEMICONDUCTOR DEVICE

BACKGROUND OF THE INVENTION

1. Field of the Invention

The present invention relates to a method for manufacturing a semiconductor device in which an oxide semiconductor is used.

2. Description of the Related Art

In recent years, a technique for forming a thin film transistor (also referred to as a TFT) using an oxide semiconductor and applying the thin film transistor to an electron device and the like has attracted attention. For example, a technique for forming a switching element of an image display device and the like using zinc oxide or an In—Ga—Zn—O based oxide semiconductor as an oxide semiconductor film is disclosed in Patent Document 1 and Patent Document 2.

Etching treatment is a typical technique for processing an oxide semiconductor (see Patent Document 3 and Patent Document 4); however, there are problem. For example, wet etching is unsuitable for miniaturization of an element since wet etching is isotropic etching. In addition, since a chemical solution is used in wet etching, there is a disadvantage in controllability. On the other hand, dry etching has advantages of miniaturization and controllability; however, there is a disadvantage in that an etching rate is small, so that it takes much time to perform treatment. In addition, there is a possibility that variation occurs in a surface to be etched depending on a device used.

REFERENCE

[Patent Document 1] Japanese Published Patent Application No. 2007-123861.
[Patent Document 2] Japanese Published Patent Application No. 2007-96055.
[Patent Document 3] Japanese Published Patent Application No. 2008-41695
[Patent Document 4] Japanese Published Patent Application No. 2008-42067.

SUMMARY OF THE INVENTION

In this manner, some techniques for processing an oxide semiconductor have already existed. However, a processing technique which satisfies conditions required for manufacturing a semiconductor device with the use of an oxide semiconductor has not been established yet.

Further, a rare metal such as indium is used for an oxide semiconductor. In a conventional processing technique including etching, the major portion of an oxide semiconductor layer including such an expensive metal which is deposited is removed and wasted. Therefore, it is difficult to reduce a cost for manufacturing a semiconductor device in which an oxide semiconductor is used by the conventional processing technique. In addition, measure against problems in resource saving is required.

In view of the aforementioned problems, an object is to establish a processing technique in manufacture of a semiconductor device in which an oxide semiconductor is used. Further, another object is to provide a method for manufacturing a semiconductor device useful for the resource saving.

According to one embodiment of the present invention, an island-shaped oxide semiconductor layer functioning as an active layer and a conductive layer covering the island-shaped oxide semiconductor layer are processed by dry etching using a gas including chlorine and oxygen. For example, the conductive layer is processed by dry etching to form a source electrode and a drain electrode, and part of the oxide semiconductor layer is removed by the dry etching to form a recessed portion in the island-shaped oxide semiconductor layer. At this time, a gate insulating layer located below the island-shaped oxide semiconductor layer is preferably formed using a material including silicon oxide.

Alternatively, an oxide semiconductor layer over the gate insulating layer is processed by wet etching so as to be the island-shaped oxide semiconductor layer.

Details thereof are described below.

According to an embodiment of the present invention disclosed, a gate electrode is formed over a substrate; a gate insulating layer is formed over the gate electrode; an oxide semiconductor layer is formed over the gate insulating layer; the oxide semiconductor layer is processed by wet etching to form an island-shaped oxide semiconductor layer; a conductive layer covering the island-shaped oxide semiconductor layer is formed; the conductive layer is processed by first dry etching to form a source electrode and a drain electrode and a part of the island-shaped oxide semiconductor layer is removed by second dry etching to form a recessed portion in the island-shaped oxide semiconductor layer, or the conductive layer is processed by dry etching to form a source electrode and a drain electrode and a part of the island-shaped oxide semiconductor layer is removed by the dry etching.

According to another embodiment of the present invention disclosed, a gate electrode is formed over a substrate; a gate insulating layer is formed over the gate electrode; a first oxide semiconductor layer is formed over the gate insulating layer; a second oxide semiconductor layer whose conductivity is higher than a conductivity of the first oxide semiconductor layer is formed over the first oxide semiconductor layer; the first oxide semiconductor layer and the second oxide semiconductor layer are processed by wet etching to form a first island-shaped oxide semiconductor layer and a second island-shaped oxide semiconductor layer; a conductive layer is formed to cover the second island-shaped oxide semiconductor layer; the conductive layer is processed by first dry etching to form a source electrode and a drain electrode and a part of the first island-shaped oxide semiconductor layer and a part of the second island-shaped oxide semiconductor layer are removed by second dry etching to form a recessed portion in the first island-shaped oxide semiconductor layer, or the conductive layer is processed by dry etching to form a source electrode and a drain electrode and a part of the first island-shaped oxide semiconductor layer and a part of the second island-shaped oxide semiconductor layer are removed by the dry etching to form a recessed portion in the first island-shaped oxide semiconductor layer.

In the above description, the oxide semiconductor layer (including the first oxide semiconductor layer and the second oxide semiconductor layer) may include indium, gallium, and zinc. In addition, the conductive layer can be formed using a material whose etching rate in the dry etching is higher than that of a material used for the oxide semiconductor layer (including the first oxide semiconductor layer and the second oxide semiconductor layer).

The above dry etching can be performed using a gas including chlorine. In this case, a material including silicon oxide is preferably used for the gate insulating layer and the gas including chlorine preferably includes oxygen. Further, the content of the oxygen in the gas including chlorine may be 15 volume % or more.

Further, a metal element as can be collected from a wasted solution obtained after wet etching.

According to another embodiment of the present invention disclosed, a gate electrode is formed over a substrate; a gate insulating layer is formed over the gate electrode; an island-shaped oxide semiconductor layer is formed over the gate insulating layer; a conductive layer is formed to cover the island-shaped oxide semiconductor layer; the conductive layer is processed by dry etching using a gas including chlorine and oxygen to form a source electrode and a drain electrode and (at the same time) part of the oxide semiconductor layer is removed by the dry etching to form a recessed portion in the island-shaped oxide semiconductor layer.

In the above description, the oxide semiconductor layer may include indium, gallium, and zinc. In addition, the conductive layer can be formed using a material whose etching rate in the dry etching is higher than that of a material used for the oxide semiconductor layer. A material including silicon oxide is preferably used for the gate insulating layer. The content of the oxygen in the gas including chlorine and oxygen may be 15 volume % or more Note that "etching rate" refers to an amount of a film which is etched per unit time (an amount of a film to be etched). Accordingly "a film whose etching rate is high" represents a film which is easily etched, and "a film whose etching rate is low" represents a film which is difficult to be etched. In addition, "the etching selectivity between an A layer and a B layer can be obtained" means that when the A layer and the B layer are etched, there is a sufficient difference between the etching rate of the A layer and the etching rate of the B layer, so that a larger amount of one of the A layer and the B layer can be etched than the other, for example.

Note that an example of oxide semiconductors which can be used in this specification includes $InMO_3(ZnO)_m$ (m>0). Here, "M" is a metal element or a plurality of metal elements selected from gallium (Ga), iron (Fe), nickel (Ni), manganese (Mn) and cobalt (Co). For example, when M includes Ga, only Ga is included, or the above metal element is included in addition to Ga, for example, M includes Ga and Na, Ga and Fe, or the like. Further, in the above oxide semiconductor, a transition metal element such as Fe or Ni, or an oxide of the transition metal may be included as an impurity element in addition to the element included as M. In this specification, among the above oxide semiconductors, an oxide semiconductor including at least gallium as M is referred to as an In—Ga—Zn—O based oxide semiconductor, and a thin film using the material is referred to as an In—Ga—Zn—O based non-single-crystal film in some cases.

Note that a semiconductor device in this specification refers to all devices which function by utilizing semiconductor characteristics. Display devices, semiconductor circuits, and electronic devices are all semiconductor devices.

According to an embodiment of the present invention disclosed, the island-shaped oxide semiconductor layer functioning as an active layer and the conductive layer covering the island-shaped oxide semiconductor layer are processed by dry etching, whereby the semiconductor device can be miniaturized and performance of the semiconductor device is improved. Further the oxide semiconductor layer above the gate insulating layer is processed by wet etching into an island-shaped oxide semiconductor, so that throughput can be improved.

In addition, etching of the oxide semiconductor layer over the gate insulating layer, which does not need control of the etching relatively, is performed by wet etching and channel etching which needs miniaturization and control of etching is performed by dry etching, so that throughput can be improved in the whole manufacturing process and higher performance of the semiconductor device can be achieved.

Further, wet etching is employed when the oxide semiconductor layer is processed so as to have an island shape, and a material such as indium included in the oxide semiconductor layer is collected from a wasted solution after the etching and reused, so that the resources can be effectively used and cost can be reduced.

BRIEF DESCRIPTION OF THE DRAWINGS

FIG. 4 is a graph showing the dependence of an etching rate and a selectivity on an oxygen content.

FIGS. 11A1, 11A2, 11B1, and 11B2 illustrate the semiconductor device according to Embodiment 3.

FIGS. 22A1, 22A2, and 22B illustrate a semiconductor device according to Embodiment 5.

DETAILED DESCRIPTION OF THE INVENTION

Figure 1A:
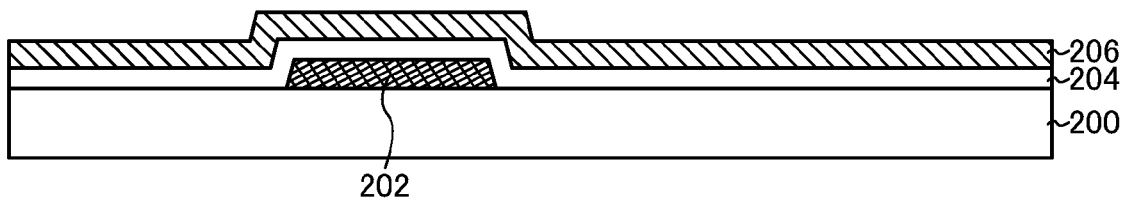
FIGS. 1A, 1B, 1C, 1D, and 1E illustrate a semiconductor device according to Embodiment 1.
Figure 1B:
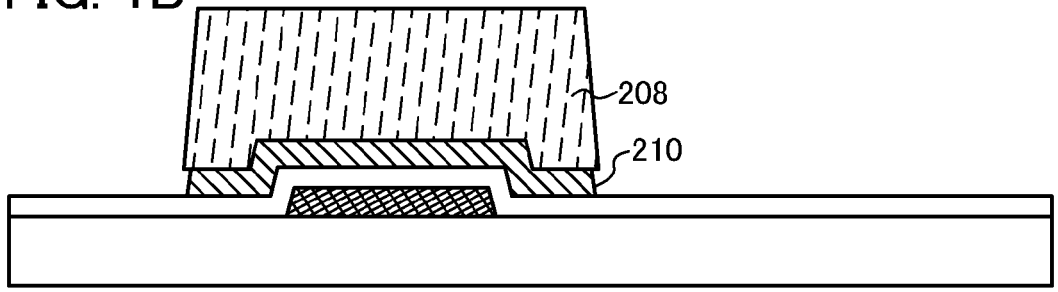

The embodiments are described in detail with reference to the accompanying drawings. Note that the present invention is not limited to description of the embodiments below. It is easily understood by those skilled in the art that the mode and detail can be variously changed unless departing from the scope and spirit of the invention. Any structure of the different embodiments can be implemented in combination appropriately. Note that the same portions or portions having a similar function are denoted by the same reference numerals, and repetitive description thereof is omitted.

Embodiment 1

In this embodiment, an example of a method for manufacturing a semiconductor device is described with reference to FIGS. 1A to 1E.

First, a gate electrode 202 is formed over a substrate 200 having an insulating surface and then a gate insulating layer 204 and an oxide semiconductor layer 206 are formed over the gate electrode 202 (see FIG. 1A).

As the substrate 200 having an insulating surface, for example, a glass substrate having a visible light transmitting property, which is used for a liquid crystal display device or the like, can be used. The glass substrate is preferably an alkali-free glass substrate. As an alkali-free glass substrate, for example, a glass material such as aluminosilicate glass, aluminoborosilicate glass, or barium borosilicate glass is used. In addition, as the substrate 200 having an insulating surface, an insulating substrate which is formed of an insulator, such as a ceramic substrate, a quartz substrate, or a sapphire substrate; a semiconductor substrate which is formed of a semiconductor material such as silicon and whose surface is covered with an insulating material; a conductive substrate which is formed of a conductor such as metal or stainless steel and whose surface is covered with an insulating material; or the like can also be used.

A conductive layer is formed over the entire surface of the substrate 200 and then the conductive layer is selectively etched using a resist mask formed by a photolithography method, so that the gate electrode 202 can be formed. At this time, in order to improve the coverage of the gate electrode 202 with the gate insulating layer 204 formed later and preventing disconnection, the gate electrode 202 is preferably etched so that end portions thereof have a tapered shape. Note that the gate electrode 202 includes an electrode and a wiring, such as a gate wiring, formed using the conductive layer.

The gate electrode 202 is desirably formed using a low resistance conductive material such as aluminum (Al) or copper (Cu). Note that in the case where aluminum is used for the wiring and the electrode, aluminum has disadvantages such as low heat resistance and a tendency to be corroded when aluminum is used by itself; therefore, aluminum is preferably used in combination with a heat-resistant conductive material.

As the heat-resistant conductive material, an element selected from titanium (Ti), tantalum (Ta), tungsten (W), molybdenum (Mo), chromium (Cr), neodymium (Nd), and scandium (Sc), an alloy including the above element as its component, an alloy film including a combination of these elements, or a nitride including the above element as its component is used. A film formed using such a heat-resistant conductive material and aluminum (or copper) are stacked, so that the wiring and the electrode can be formed.

The gate insulating layer 204 can be formed using a silicon oxide film, a silicon oxynitride film, a silicon nitride film, a silicon nitride oxide film, an aluminum oxide film, a tantalum oxide film, or the like. Alternatively, the gate insulating layer 204 may be formed using a stack of these films. The film can be formed to a thickness of 50 nm to 250 nm inclusive by a sputtering method or the like. For example, as the gate insulating layer 204, a silicon oxide film can be formed to a thickness of 100 nm by a sputtering method.

Note that before the oxide semiconductor layer 206 is formed over the gate insulating layer 204, a surface of the gate insulating layer 204 may be subjected to plasma treatment. Dust attaching to the surface of the gate insulating layer 204 can be removed by the plasma treatment.

Plasma treatment can be performed in such a manner that an inert gas such as an argon (Ar) gas is introduced into a vacuum chamber, and a bias voltage is applied to a processing object (here, the substrate 200 over which the gate insulating layer 204 is formed) so that a plasma state is generated. In this case, electrons and cations of Ar exist in the plasma and cations of Ar are accelerated in a cathode direction (toward the substrate 200 side). The accelerated cations of Ar collide with the surface of the gate insulating layer 204, whereby the surface of the gate insulating layer 204 is etched by sputtering so as to be reformed. In place of an argon gas, a helium gas may be used. Alternatively, the plasma treatment may be performed in an argon atmosphere to which oxygen, hydrogen, nitrogen, and/or the like is added. Further alternatively, the plasma treatment may be performed in an argon atmosphere to which $Cl_2$, $CF_4$, and/or the like is added. Such plasma treatment described above is also referred to as "reverse sputtering" in some cases.

The oxide semiconductor layer 206 can be formed using an In—Ga—Zn—O based non-single-crystal film. For example, the oxide semiconductor layer 206 is formed by a sputtering method using an oxide semiconductor target including In, Ga, and Zn ($In_2O_3$:$Ga_2O_3$:ZnO=1:1:1). For example, the following conditions may be employed for the sputtering: a distance between the substrate 200 and the target is 30 mm to 500 mm; the pressure is 0.1 Pa to 2.0 Pa; the DC power source is 0.25 kW to 5.0 kW (when the target with a size of 8-inch in diameter is used); and the atmosphere is an argon atmosphere, an oxygen atmosphere, or a mixed atmosphere of argon and oxygen.

Note that a pulsed DC power source is preferably used because dust can be reduced and thickness can be uniformed. In addition, the above plasma treatment is performed and then the oxide semiconductor layer 206 is formed without being exposed to the air, so that dust or moisture can be prevented from attaching to an interface between the gate insulating layer 204 and the oxide semiconductor layer 206. The thickness of the oxide semiconductor layer 206 may be approximately 5 nm to 200 nm.

As the above sputtering method, an RF sputtering method in which a high frequency power source is used as a sputtering power source, a DC sputtering method, a pulsed DC sputtering method in which direct current bias is applied in pulses, or the like can be employed.

Alternatively, a multi-target sputtering apparatus in which a plurality of targets which are formed of different materials from each other may be used. In a multi-target sputtering apparatus, a stack of different films can be formed in one chamber, or one film can be formed by sputtering using plural kinds of materials at the same time in one chamber. Alternatively, a method using a magnetron sputtering apparatus in which a magnetic field generating system is provided inside the chamber (a magnetron sputtering method), an ECR sputtering method in which plasma generated by using a micro wave is used, or the like may be employed. Further alternatively, a reactive sputtering method in which a target substance and a sputtering gas component are chemically reacted with each other to form a compound thereof at the time of film formation, a bias sputtering method in which a voltage is applied also to the substrate at the time of film formation, or the like may be employed.

Next, a resist mask 208 is formed over the oxide semiconductor layer 206. Then the oxide semiconductor layer 206 is selectively etched using the resist mask 208, so that an island-shaped oxide semiconductor layer 210 is formed (see FIG. 1B).

Here, the island-shaped oxide semiconductor layer 210 is formed by removing an unnecessary portion of the oxide semiconductor layer 206 by wet etching with the use of ITO07N (manufactured by Kanto Chemical Co., Inc.) or a mixed solution of acetic acid, nitric acid, and phosphoric acid. Note that after the above etching, the resist mask 208 is removed. In addition, an etchant for the wet etching is not limited to the above solution as long as the oxide semiconductor layer 206 can be etched using the etchant.

As the above etching, wet etching is preferably employed. This is because a large area can be processed uniformly in a short time by wet etching. Note that when wet etching is employed, a material such as indium can be collected from a wasted solution obtained after etching and reused. Also in view of effective use of resources, wet etching is preferably employed as the above etching. On the other hand, even when dry etching is employed, the island-shaped oxide semiconductor layer 210 can be formed. Therefore, dry etching should not be excluded from the above etching.

Figure 1C:
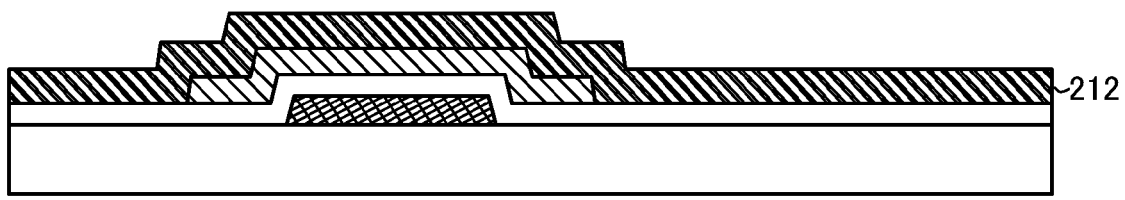

Next, a conductive layer 212 is formed over the island-shaped oxide semiconductor layer 210 (see FIG. 1C).

The conductive layer 212 can be formed by a sputtering method, a vacuum evaporation method, or the like, using a metal including an element selected from aluminum (Al), copper (Cu), titanium (Ti), tantalum (Ta), tungsten (W), molybdenum (Mo), chromium (Cr), neodymium (Nd), and scandium (Sc), an alloy including any of the above elements, nitride including any of the above elements, or the like. Note that in the case where heat treatment (e.g., heat treatment at approximately 200° C. to 600° C.) is performed after formation of the conductive layer 212, the conductive layer 212 preferably has a given heat resistant property.

For example, the conductive layer 212 can be formed with a single-layer structure of a titanium film. Alternatively, the conductive layer 212 is formed with a stacked-layer structure. For example, the conductive layer 212 can be formed with a stacked-layer structure of an aluminum film and a titanium film. Further alternatively, a three-layer structure of a titanium film, an aluminum film including neodymium (Al—Nd), and a titanium film may be employed. Further alternatively, the conductive layer 212 may be formed with a single-layer structure of an aluminum film including silicon.

Next, resist masks 214a, 214b, and 214c are formed over the conductive layer 212. Then, the conductive layer 212 is selectively etched so that conductive layers 216a, 216b, and 218 are formed, and part of the island-shaped oxide semiconductor layer 210 (a part near a surface thereof) is removed (channel-etched), so that a recessed portion 220 is formed in the island-shaped oxide semiconductor layer 210 (see FIG. 1D).

Figure 1D:
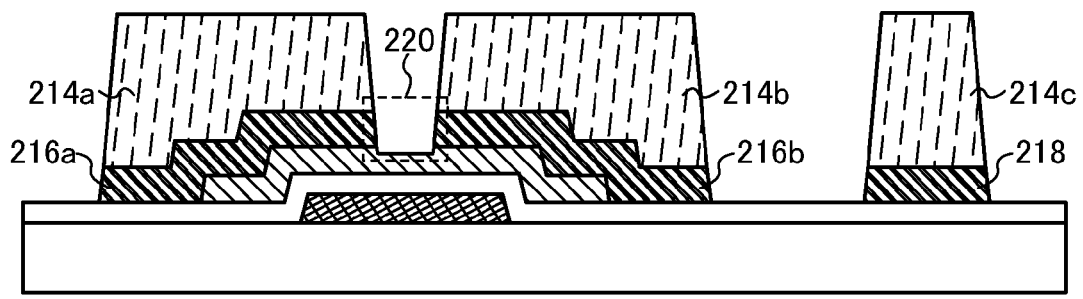

The recessed portion 220 formed by removing the part of the island-shaped oxide semiconductor layer 210 corresponds a region between the conductive layer 216a and the conductive layer 216b. Therefore, the conductive layer 216a functions as one of a source electrode and a drain electrode of the transistor, and the conductive layer 216b functions as the other of the source electrode and the drain electrode. As illustrated in FIG. 1D, the recessed portion 220 is formed by removing the part of the oxide semiconductor layer 210, whereby the conductive layer 216a and the conductive layer 216b are electrically insulated from each other without fault. In addition, the conductive layer 218 functions as a wiring electrically connects elements such as the transistor.

Note that after the above etching, the resist masks 214a, 214b, and 214c are removed.

As the etching at this time, dry etching is preferably employed. By employing dry etching, a wiring structure or the like can be miniaturized as compared to the case of using wet etching. In addition, because controllability of etching is high by employing dry etching, removal of the part of the island-shaped oxide semiconductor layer 210 (formation of the recessed portion 220) can be performed with high controllability.

As the above dry etching, in particular, dry etching using a gas including chlorine is preferably employed. By etching using a gas including a chlorine, variation of etching in the surface can be reduced as compared to the case of using a gas without chlorine.

The above gas including chlorine is more preferable when oxygen is added thereto. This is because, by using a gas including chlorine and oxygen, etching selectivity between the gate insulating layer 204 and the island-shaped oxide semiconductor layer 210 are easily obtained and damage to the gate insulating layer 204 can be reduced sufficiently. Note that in this case, a material including silicon oxide, such as silicon oxide, a silicon oxynitride, or silicon nitride oxide is preferably used as the gate insulating layer 204. In addition, when an oxygen gas content in the etching gas is set to 15 volume % or more, etching selectivity between the island-shaped oxide semiconductor layer 210 and the gate insulating layer 204 becomes large, so that damage to the gate insulating layer 204 can be effectively reduced.

As the gas used for the dry etching, a chlorine-based gas such as boron chloride ($BCl_3$), silicon chloride ($SiCl_4$), or carbon tetrachloride ($CCl_4$); a fluorine-based gas such as carbon tetrafluoride ($CF_4$), sulfur fluoride ($SF_6$), nitrogen fluoride ($NF_3$), or trifluoromethane ($CHF_3$); hydrogen bromide (HBr); oxygen ($O_2$); any of these gases to which a rare gas such as helium (He), or argon (Ar) is added; or the like can be used as well as chlorine ($Cl_2$).

In addition, as a material for the conductive layer 212, a material whose etching rate is higher than that of the island-shaped oxide semiconductor layer 210 is preferably used. This is because when the conductive layer 212 and the island-shaped oxide semiconductor layer 210 are etched at one time by dry etching, the etching rate of the island-shaped oxide semiconductor layer 210 is made smaller than that of the conductive layer 212, so that the island-shaped oxide semiconductor layer 210 can be prevented from being etched excessively. As a result, elimination of the oxide semiconductor layer 210 can be prevented.

After that, heat treatment is preferably performed at 200° C. to 600° C., typically 300° C. to 500° C. Here, heat treatment is performed at 350° C. under a nitrogen atmosphere for 1 hour. By this heat treatment, rearrangement at an atomic level of the In—Ga—Zn—O based oxide semiconductor included in the island-shaped oxide semiconductor layer 210 is performed. This heat treatment (including photo annealing and the like) is important because this heat treatment enables release of distortion which interrupts transfer of carriers in the island-shaped oxide semiconductor layer 210. Note that there is no particular limitation on timing of the above heat treatment as long as the heat treatment is performed after formation of the oxide semiconductor layer 206.

In addition, the recessed portion 220 of the exposed part of the island-shaped oxide semiconductor layer 210 may be subjected to oxygen radical treatment. By performing the oxygen radical treatment, the thin film transistor in which the island-shaped oxide semiconductor layer 210 is a channel formation region can be normally off. Further, by performing radical treatment, damage to the island-shaped oxide semiconductor layer 210 due to etching can be repaired. The radical treatment is preferably performed under an $O_2$ atmosphere; an $N_2O$ atmosphere; an $N_2$, He, or Ar atmosphere including oxygen; or the like. In addition, radical treatment may be performed under an atmosphere which is the above atmosphere to which $Cl_2$ and/or $CF_4$ is added. Note that radical treatment is preferably performed without application of a bias voltage on the substrate 100 side.

Figure 1E:
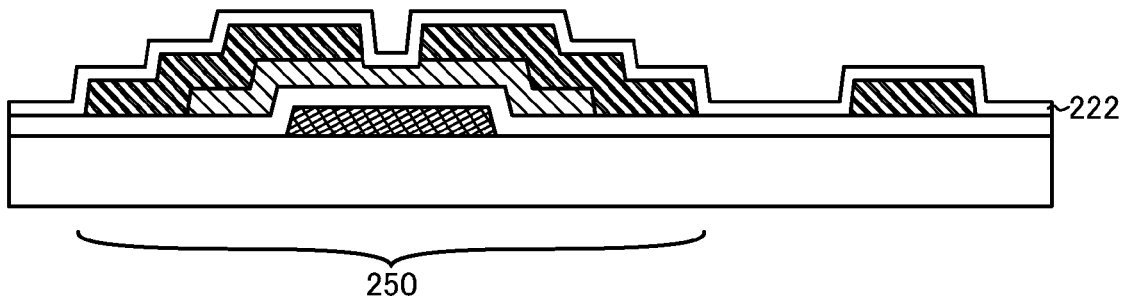

Next, a protective insulating layer 222 is formed so as to cover the thin film transistor 250 including the gate electrode 202, the island-shaped oxide semiconductor layer 210, the conductive layer 216a, the conductive layer 216b, and the like (see FIG. 1E). The protective insulating layer 222 may be formed by a sputtering method or the like using a material including silicon nitride, silicon oxide, silicon nitride oxide, silicon oxynitride, aluminum oxide, tantalum oxide, or the like.

After that, various kinds of electrodes and wirings are formed, so that the semiconductor device is completed.

As described above, in this embodiment, the island-shaped oxide semiconductor layer functioning as an active layer and the conductive layer covering the island-shaped oxide semiconductor layer are processed by dry etching, whereby the semiconductor device can be miniaturized and performance of the semiconductor device can be improved. Alternatively, the oxide semiconductor layer over the gate insulating layer is processed by wet etching into the island-shaped oxide semiconductor layer, so that throughput can be improved. In other words, etching of the oxide semiconductor layer over the gate insulating layer (processing for forming the island-shaped oxide semiconductor layer), which does not need controllability of the etching relatively, is performed by wet etching and channel etching, which needs miniaturization and controllability of etching is performed by dry etching, so that throughput of the whole manufacturing process can be improved and high performance of the semiconductor device can be achieved. In addition, wet etching is employed when the oxide semiconductor layer is processed so as to have an island shape, and a material such as indium included in the oxide semiconductor layer is collected from a wasted solution after the etching and reused, so that the resources can be effectively used and cost can be reduced.

According to this embodiment, a semiconductor device having high characteristics can be provided at low cost. Note that this embodiment can be implemented in combination with any of the other embodiments as appropriate.

Embodiment 2

In this embodiment, a method for manufacturing a semiconductor device, which is different from that of the above embodiment, is described with reference to drawings. Note that many steps of the method for manufacturing a semiconductor device in this embodiment are common to those of Embodiment 1. Therefore, repeated description of the common steps is omitted and description of steps different from that of Embodiment 1 is made below.

Figure 2A:
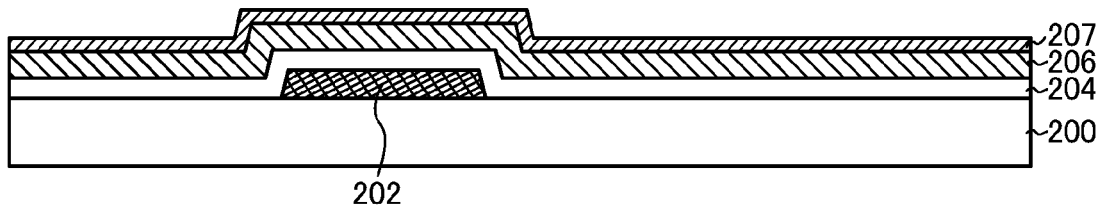
FIGS. 2A, 2B, 2C, 2D, and 2E illustrate a semiconductor device according to Embodiment 2.

First, a gate electrode 202 is formed over a substrate 200 having an insulating surface and then a gate insulating layer 204 is formed over the gate electrode 202. After that, an oxide semiconductor layer 206 and an oxide semiconductor layer 207 are stacked thereover (see FIG. 2A).

The materials and manufacturing method of the gate electrode 202, the gate insulating layer 204, and the oxide semiconductor layer 206 can be referred to Embodiment 1.

The oxide semiconductor layer 207 can be formed using an In—Ga—Zn—O based non-single-crystal film. For example, the oxide semiconductor layer 207 can be formed over the oxide semiconductor layer 206 by a sputtering method using an oxide semiconductor target including In, Ga, and Zn ($In_2O_3$:$Ga_2O_3$:ZnO=1:1:1). At this time, it is preferable that the oxide semiconductor layer 207 is successively formed so that the oxide semiconductor layer 206 is not exposed to the air.

Note that the oxide semiconductor layer 207 can be formed using the target ($In_2O_3$:$Ga_2O_3$:ZnO=1:1:1) used for formation of the oxide semiconductor layer 206. As for sputtering conditions, for example, the temperature can be 20° C. to 100° C., the pressure can be 0.1 Pa to 2.0 Pa, the power is 250 W to 3 kW (in the case of 8-inch $\phi$). In addition, an argon gas is introduced at a flow rate of 40 sccm. By controlling a ratio of components of the target or other sputtering formation conditions as appropriate, the presence or absence, density, and the like of a crystal grain can be controlled. The diameter of the crystal grain can be 1 nm to 10 nm approximately. The thickness of the oxide semiconductor layer 207 may be 2 nm to 20 nm approximately. Needless to say, when the crystal grain is included in the film, the size of the crystal grain does not exceed the thickness of the film.

Here, it is preferable that the formation conditions of the oxide semiconductor layer 206 are different from those of the oxide semiconductor layer 207. For example, the flow rate ratio of an oxygen gas to an argon gas in the formation conditions of the oxide semiconductor layer 206 is larger than the flow rate ratio of an oxygen gas to an argon gas in the formation conditions of the oxide semiconductor layer 207. Specifically, for the formation condition of the oxide semiconductor layer 207, a rare gas (argon, helium, or the like) atmosphere, or an atmosphere including an oxygen gas at 10% or less and a rare gas at 90% or more is employed. For the formation conditions of the oxide semiconductor layer 206, an oxygen atmosphere or an atmosphere in which the flow rate ratio of an oxygen gas to a rare gas is 1 or more is employed.

Note that the oxide semiconductor layer 206 and the oxide semiconductor layer 207 may be formed using different materials.

Figure 2B:
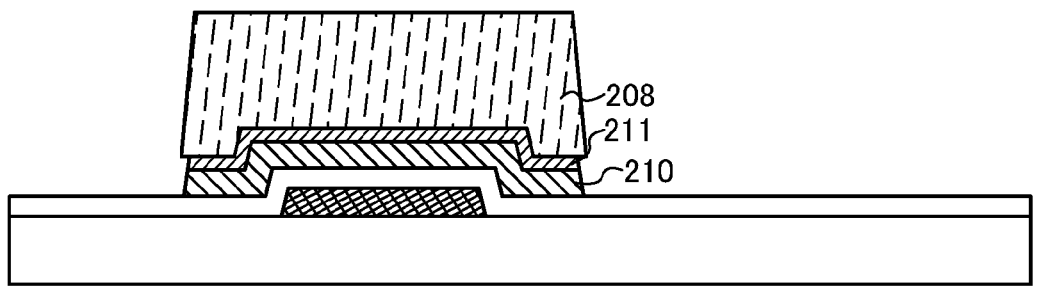

Next, a resist mask 208 is formed over the oxide semiconductor layer 207, and the oxide semiconductor layer 206 and the oxide semiconductor layer 207 are selectively etched using the resist mask 208, so that an island-shaped oxide semiconductor layer 210 and an island-shaped oxide semiconductor layer 211 are formed (see FIG. 2B).

Here, the island-shaped oxide semiconductor layer 210 and the island-shaped oxide semiconductor layer 211 are formed by removing unnecessary portions of the oxide semiconductor layer 206 and the oxide semiconductor layer 207 by wet etching with the use of ITO07N (manufactured by Kanto Chemical Co., Inc.) or a mixed solution of acetic acid, nitric acid, and phosphoric acid. Note that after the above etching, the resist mask 208 is removed. In addition, an etchant for wet etching is not limited to the above solutions as long as the oxide semiconductor layer 206 and the oxide semiconductor layer 207 can be etched using the etchant.

As the above etching, wet etching is preferably employed. This is because a large area can be processed uniformly in a short time by wet etching. Note that when wet etching is employed, a material such as indium can be collected from a wasted solution obtained after etching and reused. Also in view of effective use of resources, wet etching is preferably employed as the above etching. On the other hand, even when dry etching is employed, the island-shaped oxide semiconductor layer 210 and the island oxide semiconductor layer 211 can be formed. Therefore, dry etching should not be excluded from the above etching.

Figure 2C:
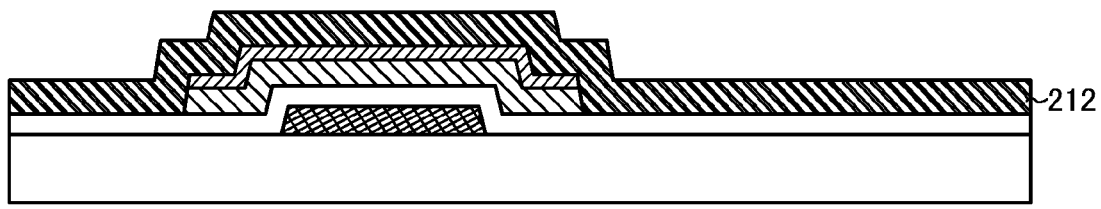

Next, a conductive layer 212 is formed over the island-shaped oxide semiconductor layer 211 (see FIG. 2C). The material and manufacturing method of the conductive layer 212 can be referred to Embodiment 1.

Figure 2D:
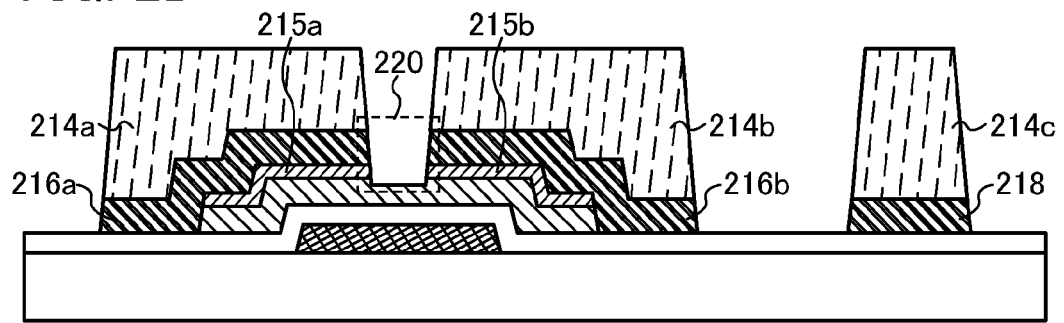

Next, resist masks 214a, 214b, and 214c are formed over the conductive layer 212. Then, the conductive layer 212 is selectively etched, so that conductive layers 216a, 216b, and 218 are formed, and at the same time, the island-shaped oxide semiconductor layer 211 is etched to form semiconductor regions 215a and 215b whose conductivity is high, and part of the island-shaped oxide semiconductor layer 210 (the part near a surface thereof) is removed (channel-etched) (see FIG. 2D).

A recessed portion 220 formed by removing the part of the island-shaped oxide semiconductor layer 210 corresponds to a region which is between the conductive layer 216a and the conductive layer 216b and also between the semiconductor region 215a whose conductivity is high and the semiconductor region 215b whose conductivity is high. Therefore, the conductive layer 216a functions as one of a source electrode and a drain electrode of the transistor, while the conductive layer 216b functions as the other of the source electrode and the drain electrode.

Note that after the above etching, the resist masks 214a, 214b, and 214c are removed.

As the etching at this time, dry etching is preferably employed. By employing dry etching, a wiring structure or the like can be miniaturized as compared to the case of using wet etching. In addition, because controllability of etching is high by employing dry etching, removal of the part of the island-shaped oxide semiconductor layer 210 (formation of the recessed portion 220) can be performed with high controllability.

As the above dry etching, in particular, dry etching using a gas including chlorine is preferably employed. By etching using a gas including a chlorine, variation of etching in the surface can be reduced as compared to the case of using a gas without chlorine.

The above gas including chlorine is more preferably when oxygen is added thereto. This is because, by using a gas including chlorine and oxygen, etching selectivity between the gate insulating layer 204 and the island-shaped oxide semiconductor layer 210 (also the island-shaped oxide semiconductor layer 211) are easily obtained and damage to the gate insulating layer 204 can be reduced sufficiently. Note that in this case, a material including silicon oxide, such as silicon oxide, a silicon oxynitride, or silicon nitride oxide is preferably used as the gate insulating layer 204. In addition, when an oxygen gas content in the etching gas is set to 15 volume % or more, etching selectivity of the island-shaped oxide semiconductor layer 210 to the gate insulating layer 204 becomes large, so that damage to the gate insulating layer 204 can be effectively reduced.

As the gas used for dry etching, a chlorine-based gas such as boron chloride ($BCl_3$), silicon chloride ($SiCl_4$), or carbon tetrachloride ($CCl_4$); a fluorine-based gas such as carbon tetrafluoride ($CF_4$), sulfur fluoride ($SF_6$), nitrogen fluoride ($NF_3$), or trifluoromethane ($CHF_3$); hydrogen bromide (HBr); oxygen ($O_2$); any of these gases to which a rare gas such as helium (He), argon (Ar) is added; or the like can be used as well as chlorine ($Cl_2$).

In addition, as a material for the conductive layer 212, a material whose etching rate is higher than those of the island-shaped oxide semiconductor layer 210 and the island-shaped oxide semiconductor layer 211 is preferably used. This is because when the conductive layer 212, the island-shaped oxide semiconductor layer 210, and the island-shaped oxide semiconductor layer 211 are etched at one time by dry etching, the etching rate of the island-shaped oxide semiconductor layer 210 and the etching rate of the island-shaped oxide semiconductor layer 211 are set to be smaller than that of the conductive layer 212, so that the island-shaped oxide semiconductor layer 210 can be prevented from being etched excessively. In particular, when the island-shaped oxide semiconductor layer 211 whose etching rate is smaller than that of the conductive layer 212 is provided, the island-shaped oxide semiconductor layer 210 can be effectively prevented from being etched excessively.

It is preferable that the etching rate of the island-shaped oxide semiconductor layer 211 is higher than that of the island-shaped oxide semiconductor layer 210 because separation between the semiconductor region 215a whose conductivity is high and the semiconductor region 215b whose conductivity is high, and removal of the part of the island-shaped oxide semiconductor layer 210 can be favorably performed.

After that, heat treatment is preferably performed at 200° C. to 600° C., typically 300° C. to 500° C. In addition, the recessed portion 220 of the exposed part of the island-shaped oxide semiconductor layer 210 may be subjected to oxygen radical treatment. The detail thereof can be referred to Embodiment 1.

Figure 2E:
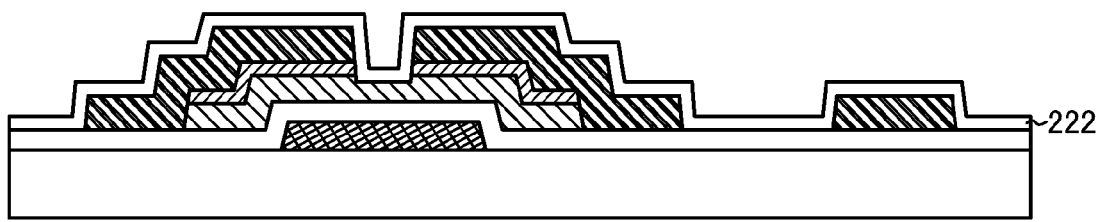

Next, a protective insulating layer 222 is formed so as to cover the thin film transistor 250 including the gate electrode 202, the island-shaped oxide semiconductor layer 210, the island-shaped oxide semiconductor layer 211, the conductive layer 216a, and the conductive layer 216b, and the like (see FIG. 2E). The protective insulating layer 222 may be formed by a sputtering method or the like using a material including silicon nitride, silicon oxide, silicon nitride oxide, silicon oxynitride, aluminum oxide, tantalum oxide, or the like.

After that, various kinds of electrodes and wirings are formed, so that the semiconductor device is completed.

As described above, in this embodiment, the island-shaped oxide semiconductor layer functioning as an active layer and the conductive layer covering the island-shaped oxide semiconductor layer are processed by dry etching, whereby the semiconductor device can be miniaturized and performance of the semiconductor device is improved. Alternatively, the oxide semiconductor layer above the gate insulating layer is processed by wet etching into an island-shaped oxide semiconductor layer, so that throughput can be improved. In other words, etching of the oxide semiconductor layer above the gate insulating layer (processing for forming the island-shaped oxide semiconductor layer), which does not need controllability of etching relatively, is performed by wet etching and channel etching, which needs miniaturization and controllability of etching, is performed by dry etching, so that throughput can be improved in the whole manufacturing process and high performance of the semiconductor device can be achieved. In addition, wet etching is employed when the oxide semiconductor layer is processed so as to have an island shape, and a material such as indium included in the oxide semiconductor layer is collected from a wasted solution after the etching and reused, so that the resources can be effectively used and cost can be reduced.

In addition, in this embodiment, the semiconductor region 215a whose conductivity is high is formed between the island-shaped oxide semiconductor layer 210 and the conductive layer 216a, and the semiconductor region 215b whose conductivity is high is formed between the island-shaped oxide semiconductor layer 210 and the conductive layer 216b.

Figure 3A:
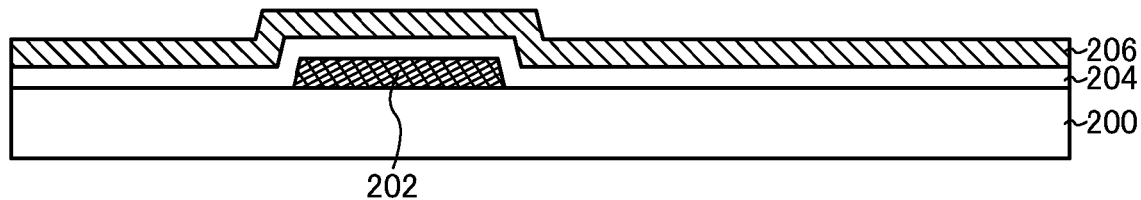
FIGS. 3A, 3B, 3C, 3D, and 3E illustrate a method for manufacturing a semiconductor device according to Embodiment 2.
Figure 3B:
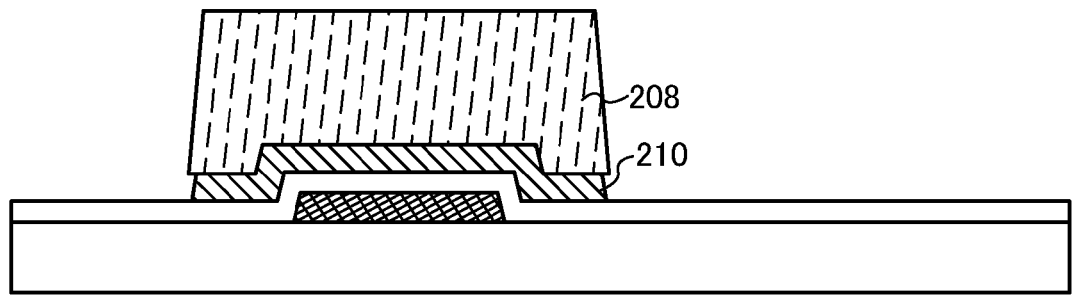
Figure 3C:
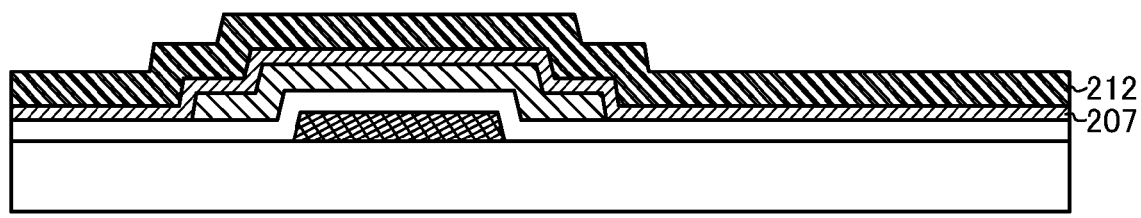
Figure 3D:
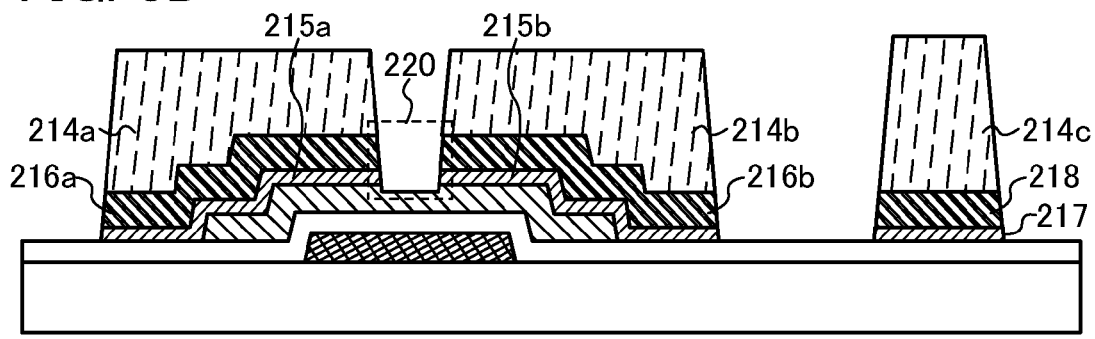
Figure 3E:
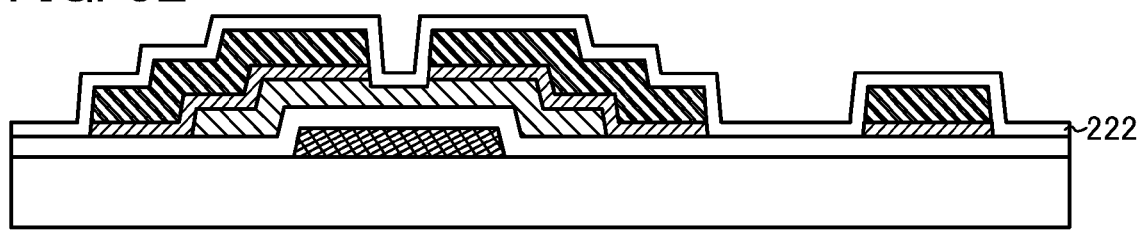
Figure 5:
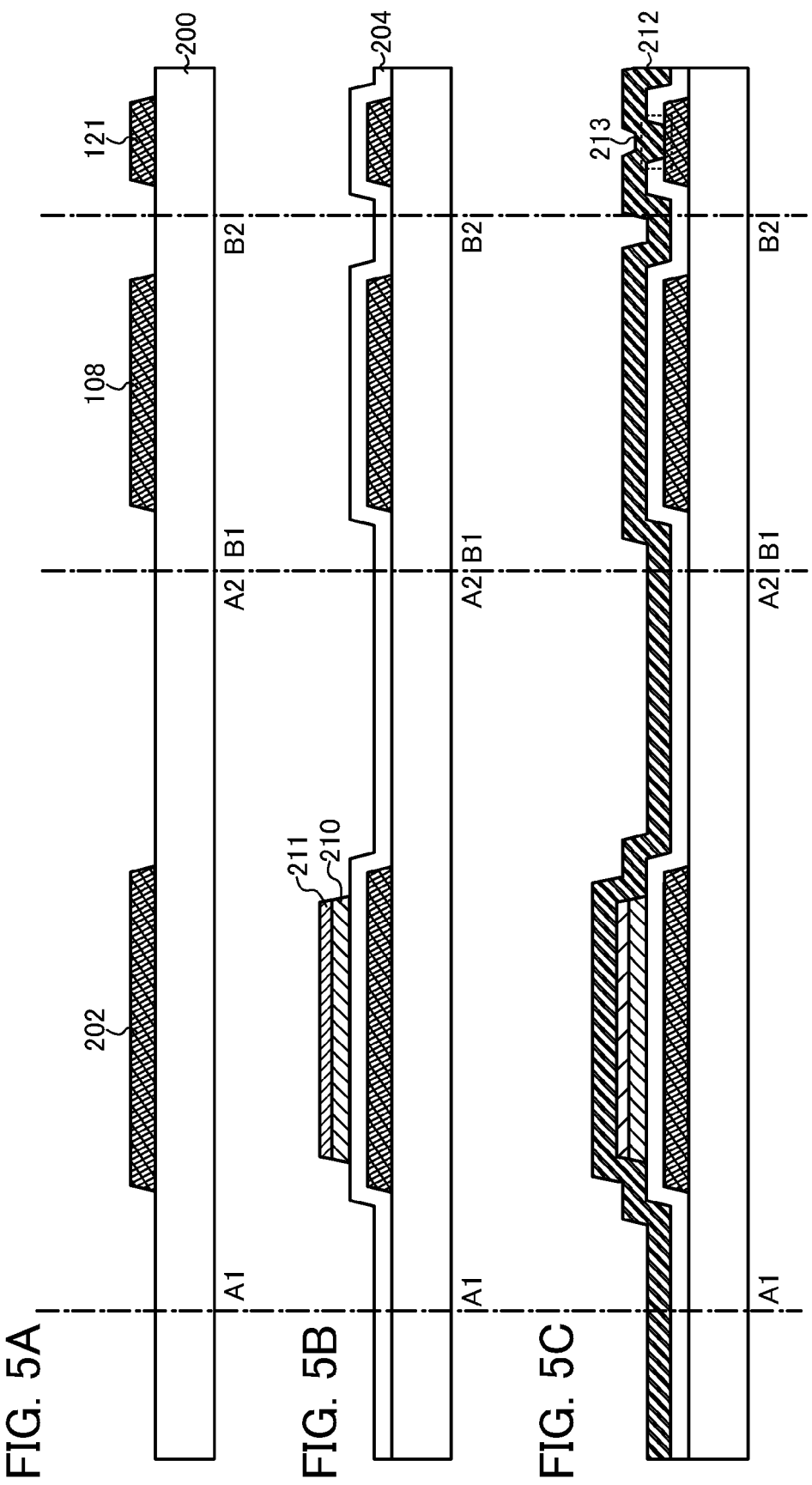
FIGS. 5A, 5B, and 5C illustrate a method for manufacturing a semiconductor device according to Embodiment 3.
Figure 6:
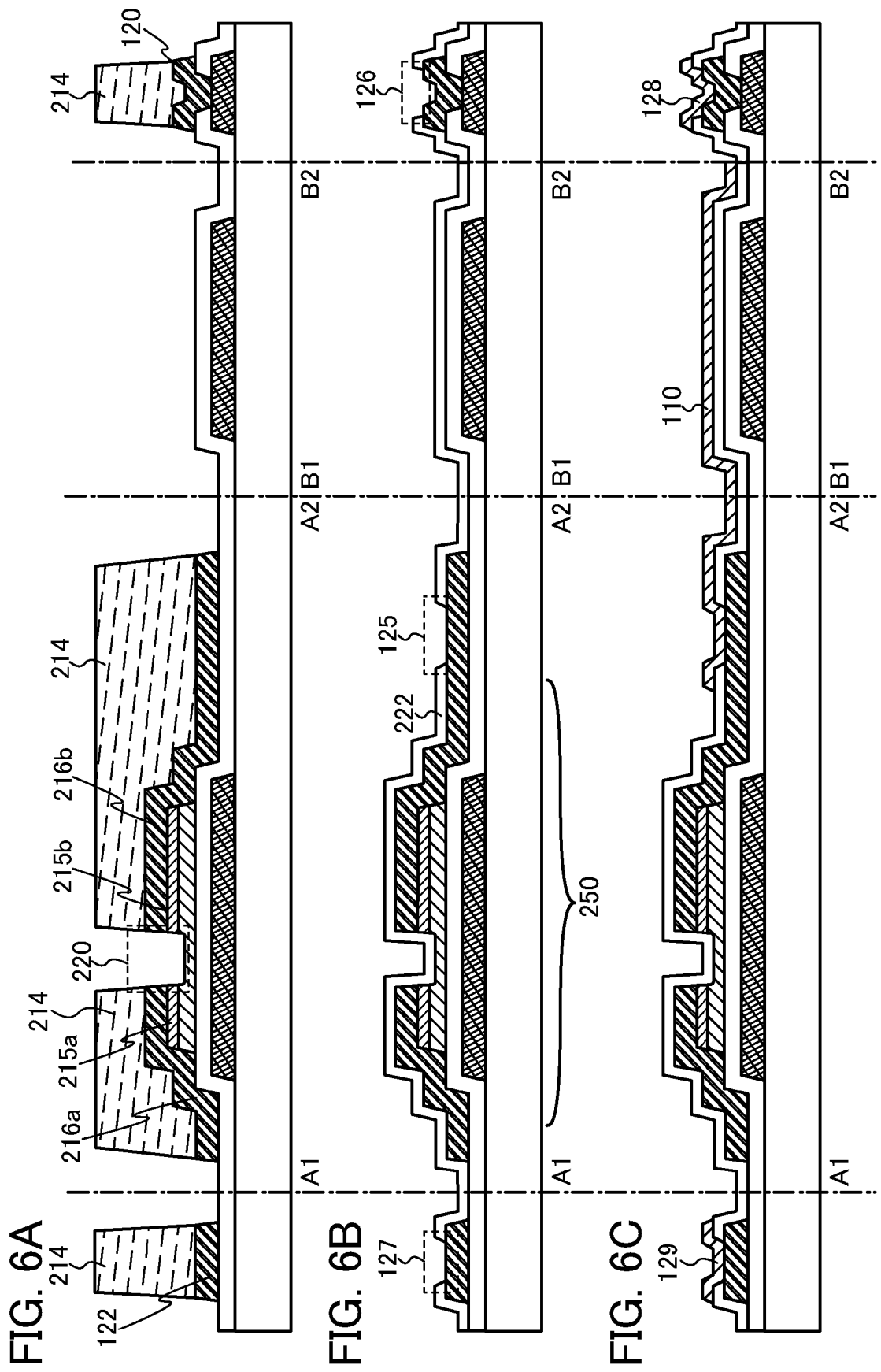
FIGS. 6A, 6B, and 6C illustrate a method for manufacturing the semiconductor device according to Embodiment 3.

Note that this embodiment describes the case where the oxide semiconductor layer 207 is formed over the oxide semiconductor layer 206 and then the oxide semiconductor layer 206 and the oxide semiconductor layer 207 are processed at one time; however, this embodiment is not limited to this manufacturing order. For example, the following process may be employed: the oxide semiconductor layer 206 is formed (see FIG. 3A) and then processed to be the island-shaped oxide semiconductor layer 210 (see FIG. 3B); then, the oxide semiconductor layer 207 and the conductive layer 212 are formed so as to cover the island-shaped oxide semiconductor layer 210 (see FIG. 3C); and the oxide semiconductor layer 207 and the conductive layer 212 are processed at one time (see FIGS. 3D and 3E). In this case, damage to part to be exposed of the gate insulating layer 204 can be reduced at the time of etching the conductive layer 212. In particular, when the oxide semiconductor layer 207 whose etching rate is smaller than that of the conductive layer 212 is provided, damage to the part to be exposed of the gate insulating layer 204 can be effectively reduced.

According to this embodiment, a semiconductor device having high characteristics can be provided at low cost. Note that this embodiment can be implemented in combination with any of the other embodiments as appropriate.

Embodiment 3

In this embodiment, a method for manufacturing a display device which is an example of a usage mode of a semiconductor device is described with reference to drawings. Note that many steps of the manufacturing method described in this embodiment are common to those of Embodiment 1 or Embodiment 2. Therefore, repeated description of the common steps is omitted and description of steps different from that of Embodiment 1 or Embodiment 2 is made below. Note that in the description below, FIGS. 5A to 5C and FIGS. 6A to 6C are cross-sectional views and FIG. 7, FIG. 8, FIG. 9, and FIG. 10 are top views.

Figure 7:
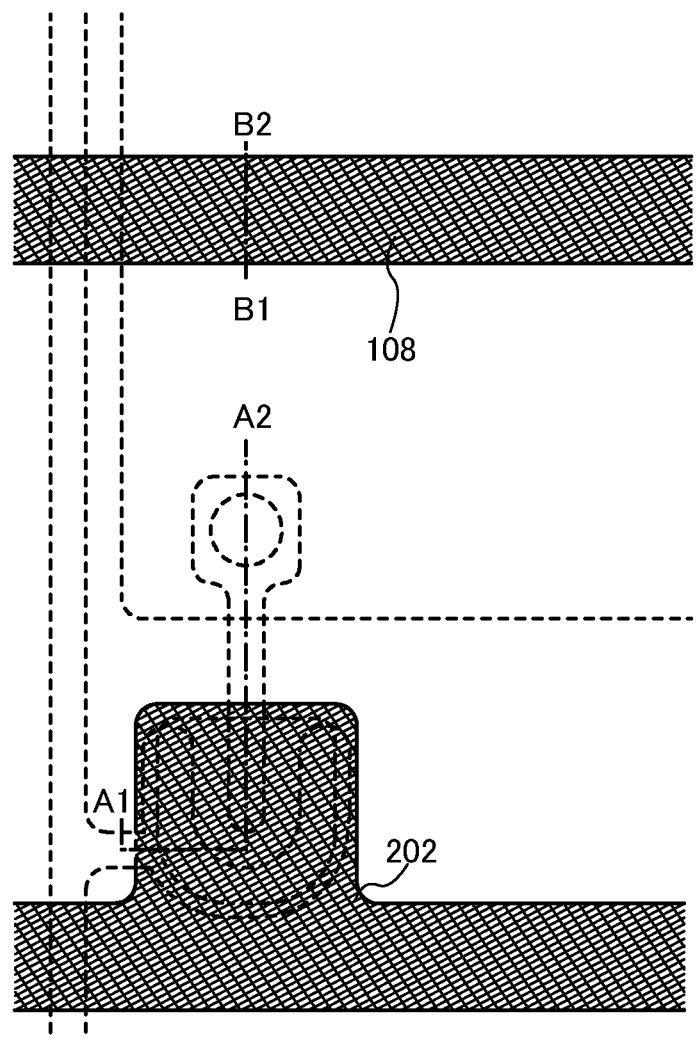
FIG. 7 illustrates a method for manufacturing the semiconductor device according to Embodiment 3.

First, wirings and an electrode (a gate wiring including a gate electrode 202, a capacitor wiring 108, and a first terminal 121) are formed over a substrate 200 having an insulating surface (see FIG. 5A and FIG. 7).

The capacitor wiring 108 and the first terminal 121 can be formed at the same time and using the same material as the gate electrode 202. Note that the material and manufacturing method of the gate electrode 202 can be referred to Embodiment 1.

Figure 8:
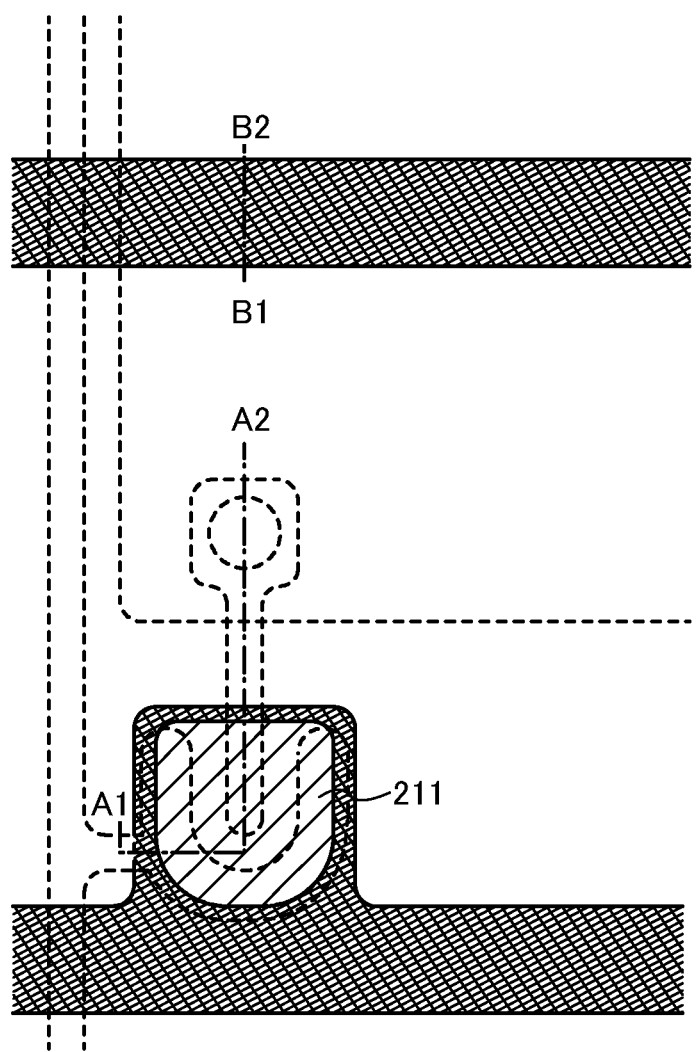
FIG. 8 illustrates a method for manufacturing the semiconductor device according to Embodiment 3.
Figure 9:
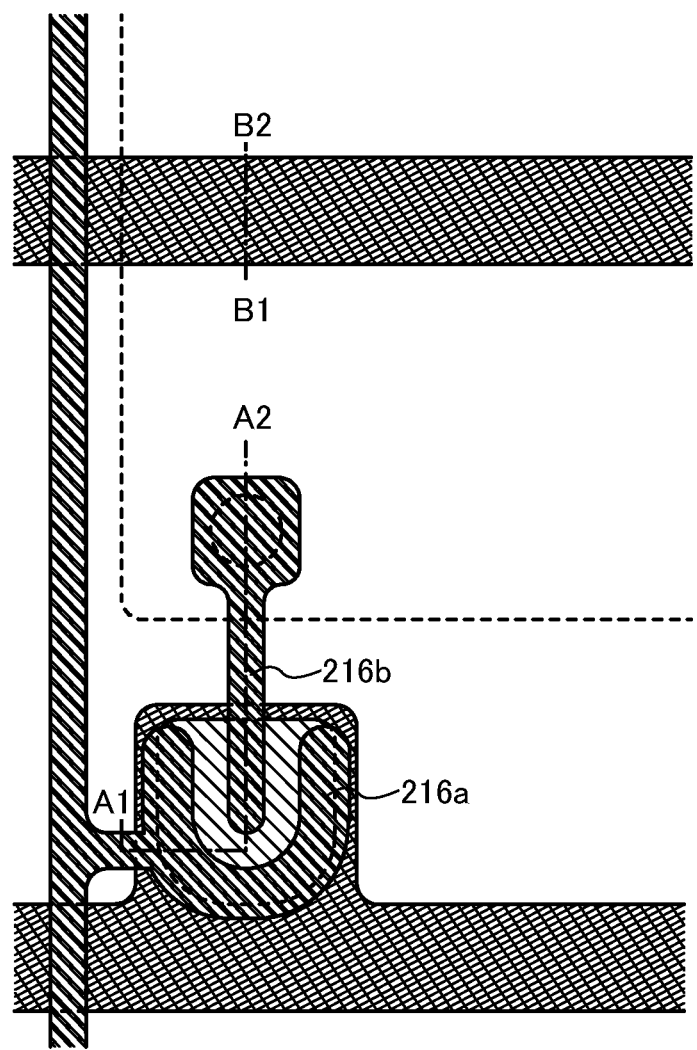
FIG. 9 illustrates a method for manufacturing the semiconductor device according to Embodiment 3.

Next, an island-shaped oxide semiconductor layer 210 and an island-shape oxide semiconductor layer 211 are formed over the gate electrode 202 with a gate insulating layer 204 interposed therebetween (see FIG. 5B and FIG. 8). The materials and manufacturing methods of the island-shaped oxide semiconductor layer 210 and the island-shaped oxide semiconductor layer 211 can be referred to Embodiments 1 and 2.

Next, a contact hole 213 is formed in the gate insulating layer 204 so that the first terminal 121 is exposed. After that, a conductive layer 212 is formed so as to cover the gate insulating layer 204, the island-shaped oxide semiconductor layer 210, and the island-shaped oxide semiconductor layer 211 (see FIG. 5C).

The material and manufacturing method of the conductive layer 212 can be referred to Embodiment 1. Note that in this embodiment, the conductive layer 212 and the first terminal 121 are electrically connected to each other through the contact hole 213.

Next, a resist mask 214 is formed over the conductive layer 212. Then, the conductive layer 212 is selectively etched to form conductive layers 216a and 216b, a connection electrode 120, and a second terminal 122. At the same time, the oxide semiconductor layer 211 is etched to form a semiconductor region 215a whose conductivity is high and a semiconductor region 215b whose conductivity is high, and a part of the oxide semiconductor layer 210 (the part near the surface thereof) is removed to form a recessed portion 220 in the oxide semiconductor layer 210 (see FIG. 6A and FIG. 9).

The second terminal 122 can be formed so as to be electrically connected to a source wiring (the source wiring including the conductive layer 216a or the conductive layer 216b). In addition, the connection electrode 120 can be formed so as to be directly connected to the first terminal 121 through the contact hole 213 formed in the gate insulating layer 204.

As the etching at this time, dry etching is preferably employed. By employing dry etching, a wiring structure or the like can be miniaturized as compared to the case of using wet etching. In addition, because controllability of etching is high by employing dry etching, removal of the part of the island-shaped oxide semiconductor layer 210 (formation of the recessed portion 220) can be performed with high controllability. Note that a gas used for dry etching and the like can be referred to Embodiments described above.

Next, heat treatment is preferably performed at 200° C. to 600° C., typically 300° C. to 500° C. For example, heat treatment is performed at 350° C. under a nitrogen atmosphere for 1 hour. By this heat treatment, rearrangement at an atomic level of the In—Ga—Zn—O based non-single-crystal film included in the island-shaped oxide semiconductor layer 210 is performed. This heat treatment (including photo annealing) is effective because this heat treatment enables release of distortion which interrupts transfer of carriers. Note that there is no particular limitation on timing of the heat treatment as long as the heat treatment is performed after formation of the oxide semiconductor layer 211. For example, the heat treatment may be performed after formation of a pixel electrode.

In addition, the exposed part of the island-shaped oxide semiconductor layer 210 may be subjected to oxygen radical treatment. By performing the oxygen radical treatment, the thin film transistor in which the island-shaped oxide semiconductor layer 210 is a channel formation region can be normally off. Further, by performing radical treatment, damage to the island-shaped oxide semiconductor layer 210 due to etching can be repaired. The radical treatment is preferably performed under an $O_2$ or $N_2O$ atmosphere, or preferably, an $N_2$, He, or Ar atmosphere including oxygen. In addition, radical treatment may be performed under an atmosphere which is the above atmosphere to which $Cl_2$ and/or $CF_4$ is added.

Next, the resist mask 214 is removed, and then, a protective insulating layer 222 is formed to cover a thin film transistor 250. The protective insulating layer 222 is selectively etched, so that a contact hole 125 reaching the conductive layer 216b, a contact hole 126 reaching the connection electrode 120, and a contact hole 127 reaching the second terminal 122 are formed (see FIG. 6B).

Figure 10:
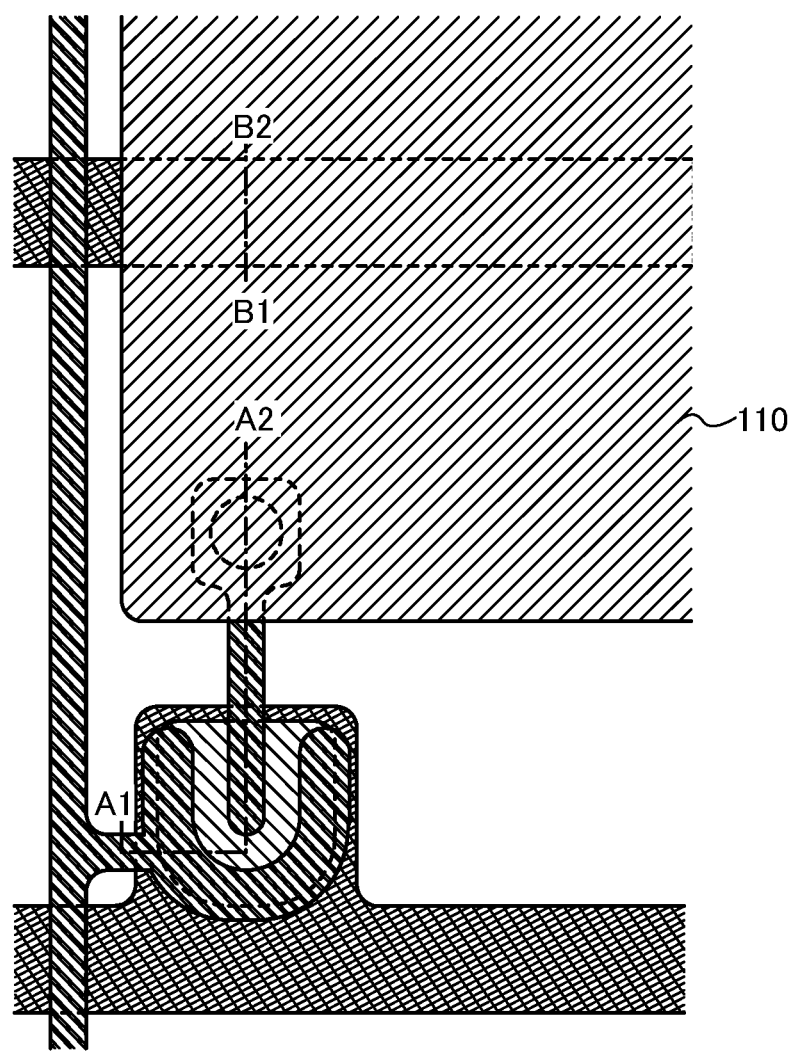
FIG. 10 illustrates the semiconductor device according to Embodiment 3.

After that, a transparent conductive layer 110 electrically connected to the conductive layer 216, a transparent conductive layer 128 electrically connected to the connection electrode 120, and a transparent conductive layer 129 electrically connected to the second terminal 122 are formed (see FIG. 6C and FIG. 10).

The transparent conductive layer 110 functions as a pixel electrode. The transparent conductive layers 128 and 129 serve as electrodes or wirings which are used for connection to an FPC. In particular, the transparent conductive layer 128 formed over the connection electrode 120 can be used as a connection terminal electrode which functions as an input terminal for the gate wiring. The transparent conductive layer 129 formed over the second terminal 122 can be used as a connection terminal electrode which functions as an input terminal for the source wiring.

In addition, the capacitor wiring 108, the gate insulating layer 204, the protective insulating layer 222, and the transparent conductive layer 110 can form a storage capacitor. In this case, the capacitor wiring 108 and the transparent conductive layer 110 serve as electrodes, and the gate insulating layer 204 and the protective insulating layer 222 serve as dielectrics.

The transparent conductive layers 110, 128, and 129 can be formed by a sputtering method, a vacuum evaporation method, or the like, using indium oxide ($In_2O_3$), an alloy of indium oxide and tin oxide ($In_2O_3$—$SnO_2$, hereinafter, abbreviated as ITO), an alloy of indium oxide and zinc oxide ($In_2O_3$—ZnO), or the like. For example, a transparent conductive film is formed and then a resist mask is formed over the transparent conductive film. Then, unnecessary portions are removed by etching, so that the transparent conductive layers 110, 128, and 129 can be formed.

FIGS. 11A1 and 11A2 are a cross-sectional view and a top view of a terminal portion of the gate wiring, respectively. FIG. 11A1 corresponds to the cross-sectional view taken along line C1-C2 in FIG. 11A2. In FIG. 11A1, the transparent conductive layer 128 formed over the protective insulating layer 222 is a connection terminal electrode which functions as an input terminal. In addition, in FIG. 11A1, the first terminal 121 whose material is the same as the material of the gate wiring, and the connection electrode 120 whose material is the same as the material of the source wiring are overlapped with each other with the gate insulating layer 204 interposed therebetween and directly in contact with each other at the terminal portion to be brought into conduction. In addition, the connection electrode 120 and the transparent conductive layer 128 are directly in contact with each other through the contact hole formed in the protective insulating layer 222 and brought into conduction.

FIGS. 11B1 and 11B2 are a cross-sectional view and a top view of a terminal portion of the source wiring at this time, respectively. FIG. 11B1 corresponds to the cross sectional view taken along line D1-D2 in FIG. 11B2. In FIG. 11B1, the transparent conductive layer 129 formed over the protective insulating layer 222 is a connection terminal electrode which functions as an input terminal. In addition, FIG. 11B1 illustrates the case where an electrode 156 whose material is the same as the material of the gate wiring is positioned below the second terminal 122 which is electrically connected to the source wiring and overlaps with the second terminal 122 at the terminal portion with the gate insulating layer 204 interposed therebetween. The electrode 156 is not electrically connected to the second terminal 122. If the electrode 156 is set to a potential different from the potential of the second terminal 122, for example, floating, GND, 0 V, or the like, a capacitor which is useful against noise or static electricity can be formed. In addition, the second terminal 122 is electrically connected to the transparent conductive layer 129 with the protective insulating layer 222 interposed therebetween.

In accordance with the density of pixels, a plurality of the gate wirings, the source wirings, and the capacitor wirings are provided. Further, a plurality of terminals including the first terminal having the same potential as the gate wiring, the second terminal having the same potential as the source wiring, a third terminal having the same potential as the capacitor wiring, and the like are arranged at the terminal portion. The respective numbers of the terminals can be given numbers set by practitioners appropriately.

Through the above process, elements such as an n-channel bottom-gate thin film transistor and a storage capacitor can be completed with the use of six photomasks. In addition, these elements are arranged in matrix so as to correspond to respective pixels, whereby one substrate used for manufacturing an active matrix display device can be obtained. In this specification, such a substrate is referred to as an active matrix substrate, for convenience.

In order to manufacturing an active matrix liquid crystal display device, a liquid crystal layer is formed between an active matrix substrate and a counter substrate provided with a counter electrode, and then, the active matrix substrate and the counter substrate are fixed. Note that a common electrode which is electrically connected to the counter electrode provided for the counter substrate is formed over the active matrix substrate. A fourth terminal which is electrically connected to the common electrode is formed at the terminal portion. This fourth terminal serves as a terminal for setting the common electrode to have a fixed potential, for example, GND or 0 V.

Figure 12:
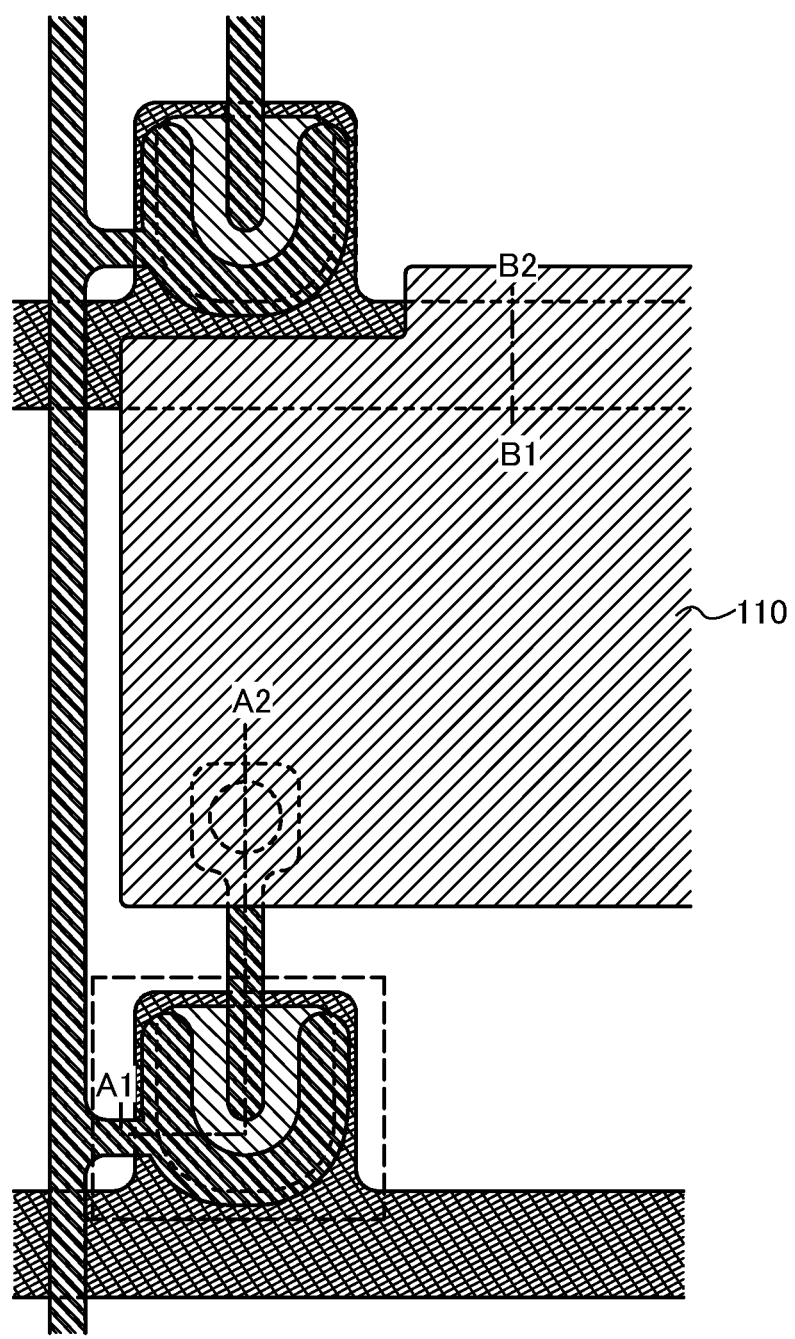
FIG. 12 illustrates a semiconductor device according to Embodiment 3.

The structure according to this embodiment is not limited to the pixel structure in FIG. 10. Another example of the structure is illustrated in FIG. 12. FIG. 12 illustrates the structure in which the pixel electrode and a gate wiring of the adjacent pixel serve as electrodes, and the protective insulating layer and the gate insulating layer serve as dielectrics so that the storage capacitor is formed without the capacitor wiring. In this case, the capacitor wiring and the third terminal which is connected to the capacitor wiring can be omitted.

Note that this embodiment can be implemented in combination with any of the other embodiment as appropriate.

Embodiment 4

In this embodiment, an example in which at least part of a driver circuit and a thin film transistor to be disposed in a pixel portion are formed over one substrate in a display device will be described.

The thin film transistor to be disposed in the pixel portion is formed according to Embodiment 3. Further, the thin film transistor described in Embodiment 3 is an n-channel TFT. Thus, part of a driver circuit that can be formed using n-channel TFTs among driver circuits is formed over the same substrate as the thin film transistor of the pixel portion.

Figure 14A:
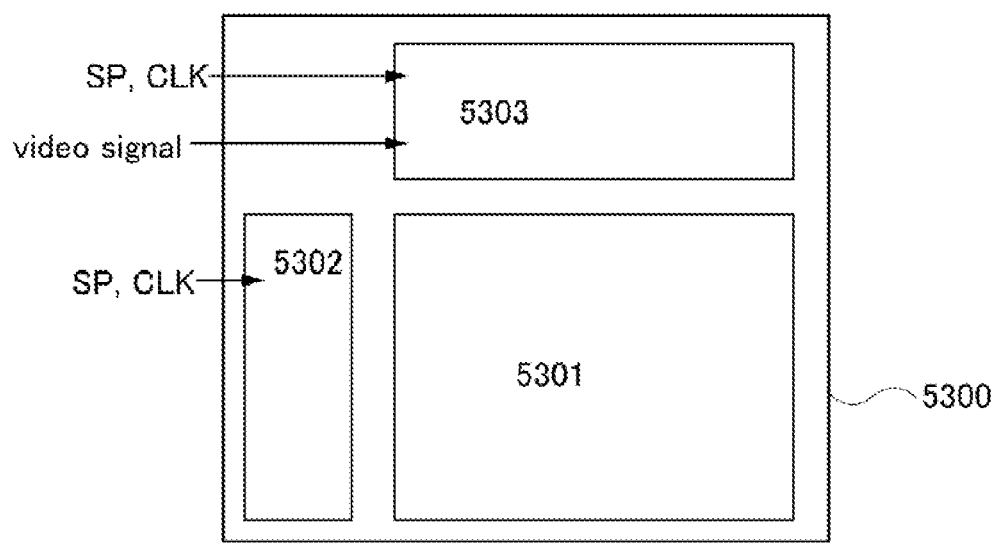
FIGS. 14A and 14B are block diagrams showing semiconductor devices.

FIG. 14A illustrates an example of a block diagram of an active matrix liquid crystal display device, which is an example of a display device. The display device illustrated in FIG. 14A includes, over a substrate 5300, a pixel portion 5301 including a plurality of pixels each provided with a display element; a scanning line driver circuit 5302 that selects a pixel; and a signal line driver circuit 5303 that controls a video signal input to the selected pixel.

In addition, the thin film transistor described in Embodiment 3 is an n-channel TFT, and a signal line driver circuit including the n-channel TFT is described with reference to FIG. 15.

Figure 15:
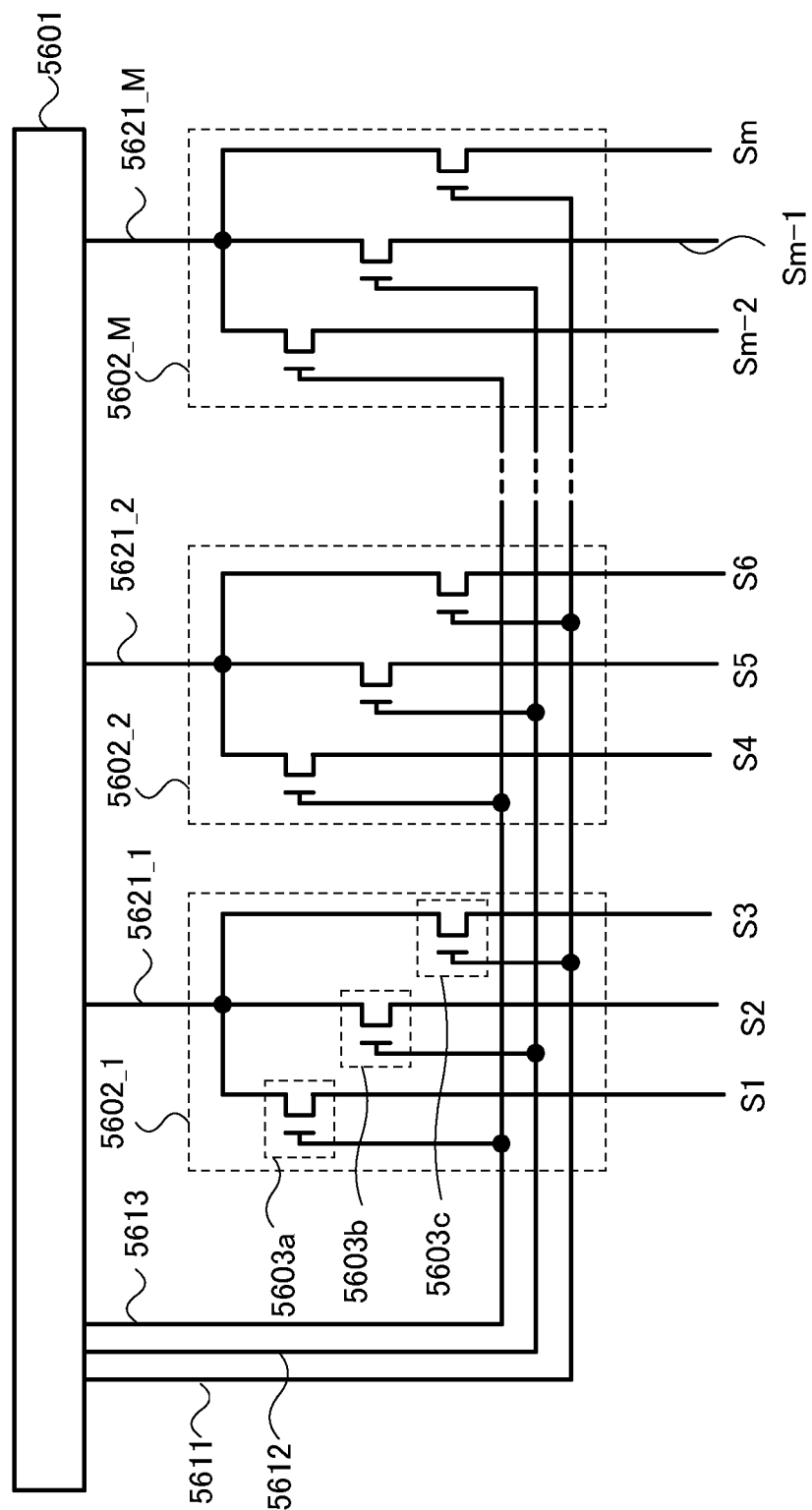
FIG. 15 illustrates a bloke diagram showing a structure of a signal line driver circuit.

The signal line driver circuit illustrated in FIG. 15 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603a, a second thin film transistor 5603b, and a third thin film transistor 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the switch groups 5602_1 to 5602_M are connected to the wirings 5621_1 to 5621_M, respectively. Each of the wirings 5621_1 to 5621_M is connected to three signal lines (a signal line Sm—2, a signal line Sm—1, and a signal line Sm (m=3M)) via the first thin film transistor 5603a, the second thin film transistor 5603b, and the third thin film transistor 5603c. For example, a wiring 5621_J of the J-th column (any one of the wirings 5621_1 to 5621_M) is connected to a signal line Sj-2, a signal line Sj-1, and a signal line Sj (j=3J) via the first thin film transistor 5603a, the second thin film transistor 5603b, and the third thin film transistor 5603c which are included in the switch group 5602_J.

A signal is input to each of the first wiring 5611, the second wiring 5612, and the third wiring 5613.

Note that the driver IC 5601 is preferably formed using a single crystal semiconductor. The switch groups 5602_1 to 5602_M are preferably formed over the same substrate as the pixel portion. Therefore, the driver IC 5601 and the switch groups 5602_1 to 5602_M are preferably connected through an FPC or the like. Alternatively, the driver IC 5601 may be formed using a single crystal semiconductor formed over the same substrate as the pixel portion by a method such as bonding.

Figure 16:
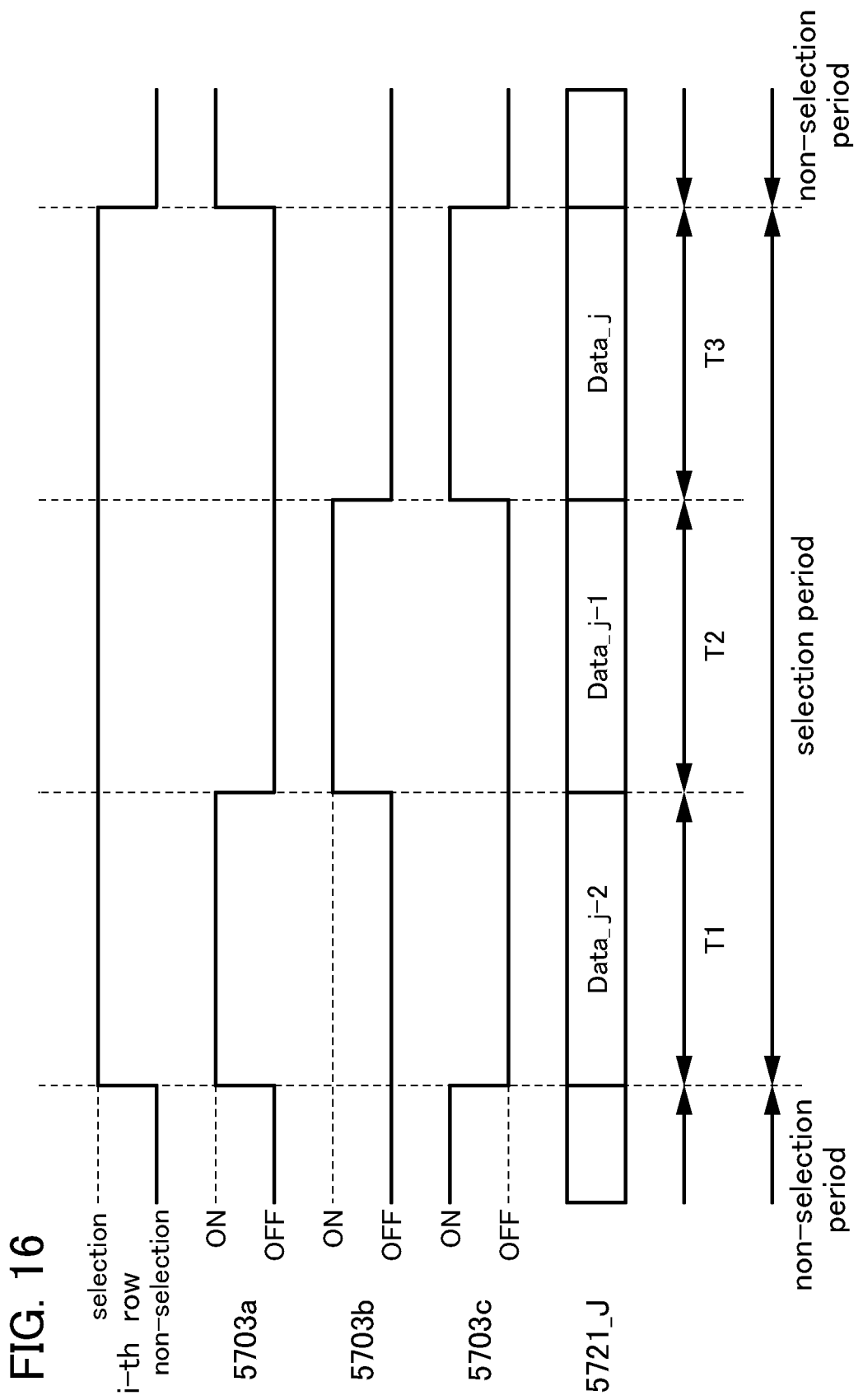
FIG. 16 is a timing chart showing operation of the signal line driver circuit.

Next, operation of the signal line driver circuit illustrated in FIG. 15 is described with reference to a timing chart in FIG. 16. The timing chart in FIG. 16 shows the case where a scanning line Gi of the i-th stage is selected. A selection period of the scanning line Gi of the i-th stage is divided into a first sub-selection period T1, a second sub-selection period T2, and a third sub-selection period T3. In addition, the signal line driver circuit in FIG. 15 operates as shown in FIG. 16 even when a scanning line of another stage is selected.

Note that the timing chart in FIG. 16 shows the case where the wiring 5621_J in the J-th column is connected to the signal line Sj-2, the signal line Sj-1, and the signal line Sj via the first thin film transistor 5603a, the second thin film transistor 5603b, and the third thin film transistor 5603c, respectively.

The timing chart in FIG. 16 shows timing at which the scanning line Gi of the i-th stage is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj-2, a video signal input to the wiring 5621_J in the second sub-selection period T2 is input to the signal line Sj-1, and a video signal input to the wiring 5621_J in the third sub-selection period T3 is input to the signal line Sj. In addition, in the first sub-selection period T1, the second sub-selection period T2, and the third sub-selection period T3, the video signals input to the wiring 5621_J are denoted by Data_j-2, Data_j-1, and Data_j, respectively.

As shown in FIG. 16, in the first sub-selection period T1, the first thin film transistor 5603a is turned on, and the second thin film transistor 5603b and the third thin film transistor 5603c are turned off. At this time, Data_j-2 input to the wiring 5621_J is input to the signal line Sj-2 via the first thin film transistor 5603a. In the second sub-selection period T2, the second thin film transistor 5603b is turned on, and the first thin film transistor 5603a and the third thin film transistor 5603c are turned off. At this time, Data_j-1 input to the wiring 5621_J is input to the signal line Sj-1 via the second thin film transistor 5603b. In the third sub-selection period T3, the third thin film transistor 5603c is turned on, and the first thin film transistor 5603a and the second thin film transistor 5603b are turned off. At this time, Data_j input to the wiring 5621_J is input to the signal line Sj via the third thin film transistor 5603c.

As described above, in the signal line driver circuit in FIG. 15, by dividing one gate selection period into three, video signals can be input to three signal lines from one wiring 5621 in one gate selection period. Therefore, in the signal line driver circuit in FIG. 15, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 15 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in the respective sub-selection periods as illustrated in FIG. 15.

For example, when a video signal is input to each of three or more signal lines from one wiring in each of three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 17:
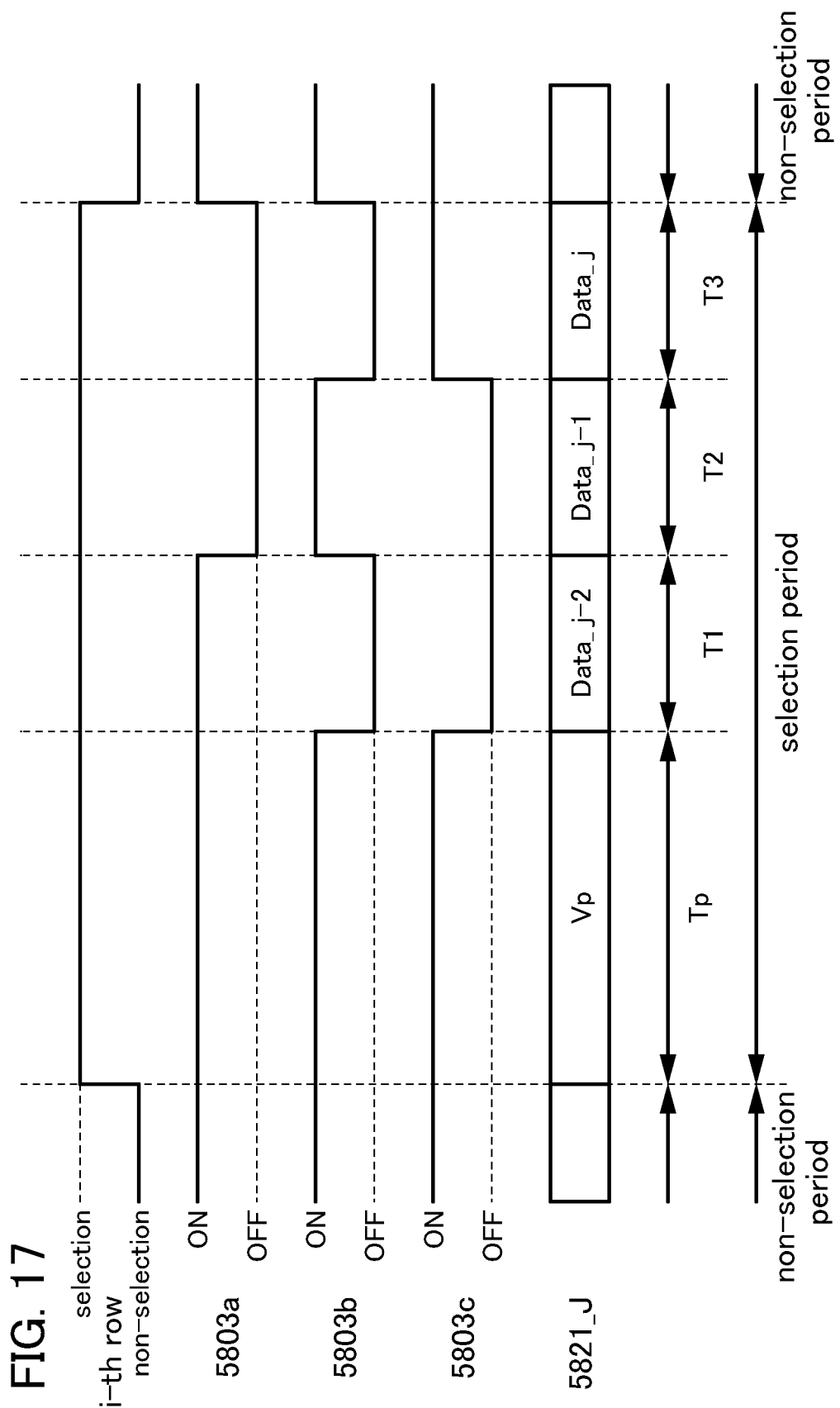
FIG. 17 is a timing chart showing operation of the signal line driver circuit.

As another example, one selection period may be divided into a precharge period Tp, the first sub-selection period T1, the second sub-selection period T2, and the third sub-selection period T3 as illustrated in a timing chart in FIG. 17. The timing chart in FIG. 17 illustrates timing at which the scanning line Gi of the i-th stage is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 17, the first thin film transistor 5603a, the second thin film transistor 5603b, and the third thin film transistor 5603c are tuned on in the precharge period Tp. At this time, precharge voltage Vp input to the wiring 5621_J is input to the signal line Sj-2, the signal line Sj-1, and the signal line Sj via the first thin film transistor 5603a, the second thin film transistor 5603b, and the third thin film transistor 5603c, respectively. In the first sub-selection period T1, the first thin film transistor 5603a is turned on, and the second thin film transistor 5603b and the third thin film transistor 5603c are turned off. At this time, Data_j-2 input to the wiring 5621_J is input to the signal line Sj-2 via the first thin film transistor 5603*a*. In the second sub-selection period T2, the second thin film transistor 5603*b* is turned on, and the first thin film transistor 5603*a* and the third thin film transistor 5603*c* are turned off. At this time, Data_j-1 input to the wiring 5621_J is input to the signal line Sj-1 via the second thin film transistor 5603*b*. In the third sub-selection period T3, the third thin film transistor 5603*c* is turned on, and the first thin film transistor 5603*a* and the second thin film transistor 5603*b* are turned off. At this time, Data_j input to the wiring 5621_J is input to the signal line Sj via the third thin film transistor 5603*c*.

As described above, in the signal line driver circuit in FIG. 15 to which the timing chart in FIG. 17 is applied, the video signal can be written to the pixel at high speed because the signal line can be precharged by providing a precharge selection period before a sub-selection period. Note that portions in FIG. 17 which are similar to those of FIG. 16 are denoted by common reference numerals and detailed description of the portions which are the same and portions which have similar functions is omitted.

Further, a structure of a scanning line driver circuit is described. The scanning line driver circuit includes a shift register and a buffer. In addition, the scanning line driver circuit may include a level shifter in some cases. In the scanning line driver circuit, when a clock signal (CLK) and a start pulse signal (SP) are input to the shift register, a selection signal is produced. The generated selection signal is buffered and amplified by the buffer, and the resulting signal is supplied to a corresponding scanning line. Gate electrodes of transistors in pixels of one line are connected to the scanning line. Further, since the transistors in the pixels of one line have to be turned on at the same time, a buffer which can feed a large current is used.

One mode of a shift register which is used for part of a scanning line driver circuit is described with reference to FIG. 18 and FIG. 19.

Figure 18:
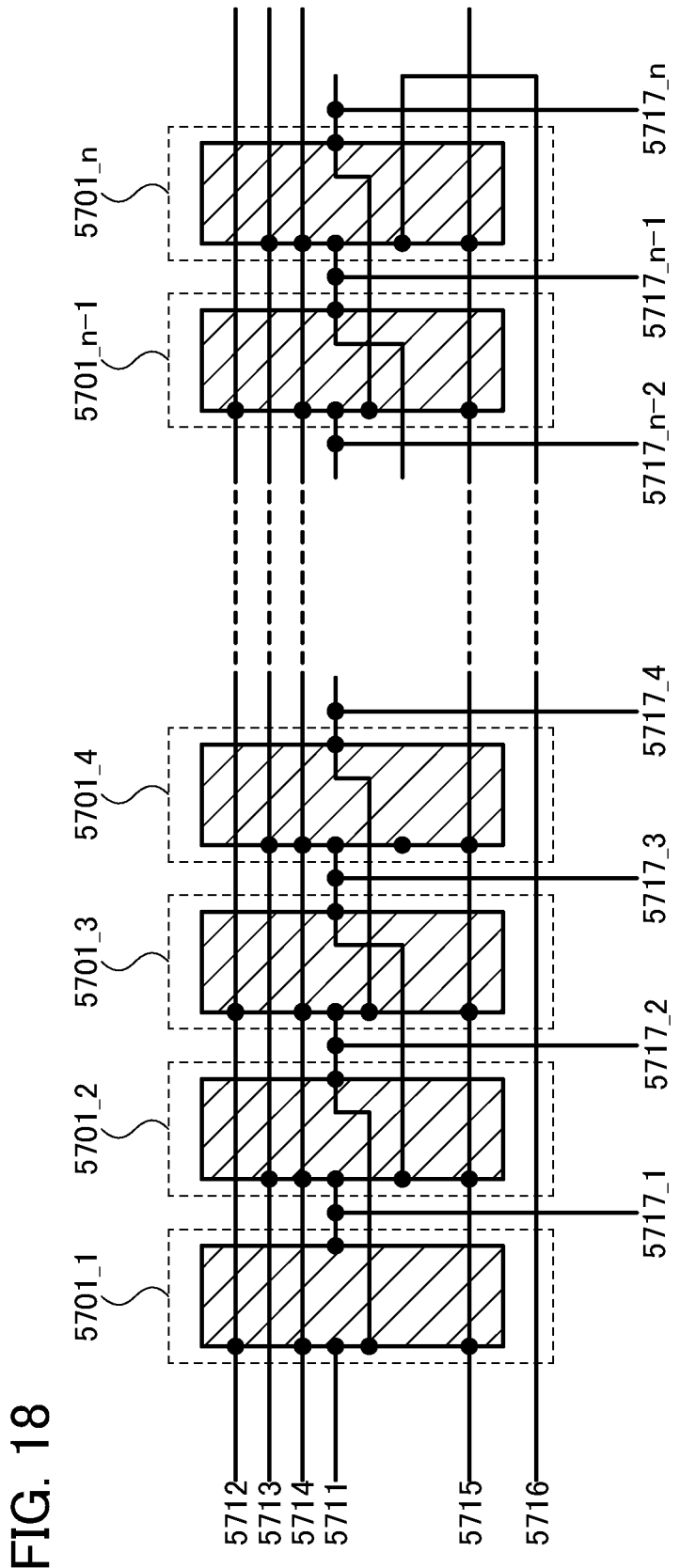
FIG. 18 is a diagram showing a structure of a shift register.

FIG. 18 illustrates a circuit structure of the shift register. The shift register illustrated in FIG. 18 includes a plurality of flip-flops which are flip-flops 5701_1 to 5701_*n*. In addition, the shift register is operated with input of a first clock signal, a second clock signal, a start pulse signal, and a reset signal.

The connection relation of the shift register illustrated in FIG. 18 is described. The flip-flop 5701_1 of a first stage is connected to a first wiring 5711, a second wiring 5712, a fourth wiring 5714, a fifth wiring 5717, a seventh wiring 5717_1, and a seventh wiring 5717_2. The flip-flop 5717_2 of a second stage is connected to a third wiring 5713, the fourth wiring 5714, the fifth wiring 5715, the seventh wiring 5717_1, the seventh wiring 5717_2, and a seventh wiring 5717_3.

In a similar manner, the flip-flop 5701_*i* (any one of the flip-flops 5701_1 to 5701_*n*) of an i-th stage is connected to one of the second wiring 5712 and the third wiring 5713, the fourth wiring 5714, the fifth wiring 5715, a seventh wiring 5717_*i*−1, a seventh wiring 5717_*i*, and a seventh wiring 5717_*i*+1. Here, when the "i" is an odd number, the flip-flop 5701_*i* of the i-th stage is connected to the second wiring 5712; when the "i" is an even number, the flip-flop 5701_*i* of the i-th stage is connected to the third wiring 5713.

The flip-flop 5701_*n* of an n-th stage is connected to one of the second wiring 5712 and the third wiring 5713, the fourth wiring 5714, the fifth wiring 5715, a seventh wiring 5717_*n*−1, the seventh wiring 5717_*n*, and a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power source line and a second power source line, respectively.

Figure 19:
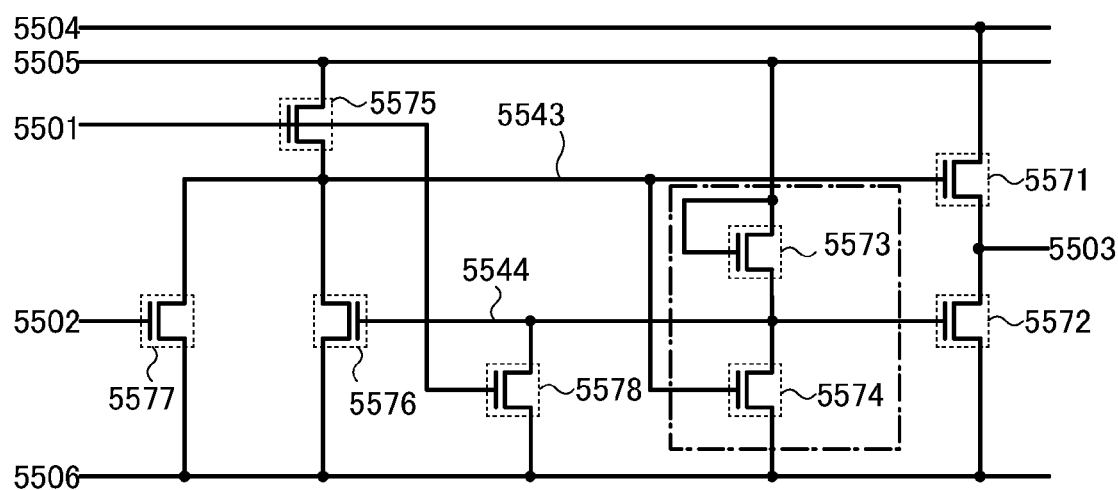
FIG. 19 is a diagram showing a connection structure of a flip flop shown in FIG. 18.

Next, FIG. 19 illustrates details of the flip-flop illustrated in FIG. 18. A flip-flop illustrated in FIG. 19 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage (Vgs) exceeds the threshold voltage (Vth).

In addition, the flip-flop illustrated in FIG. 19 includes a first wiring 5501, a second wiring 5502, a third wiring 5503, a fourth wiring 5504, a fifth wiring 5505, and a sixth wiring 5506.

Note that all thin film transistors here are enhancement-mode n-channel transistors; however, the present invention is not limited thereto. For example, the driver circuit can be operated using depression-mode n-channel transistors.

Next, a connection structure of the flip-flop illustrated in FIG. 18 is described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506 and a second electrode of the second thin film transistor 5572 is connected to the third wiring 5503.

A first electrode and a gate electrode of the third thin film transistor 5573 are connected to the fifth wiring 5505 and a second electrode of the third thin film transistor 5573 is connected to the gate electrode of the second thin film transistor 5572.

A first electrode of the fourth thin film transistor 5574 is connected to the sixth wiring 5506, a gate electrode of the fourth thin film transistor 5574 is connected to the gate electrode of the first thin film transistor 5571, and a second electrode of the fourth thin film transistor 5574 is connected to the gate electrode of the second thin film transistor 5572.

A first electrode of the fifth thin film transistor 5575 is connected to the fifth wiring 5505, a gate electrode of the fifth thin film transistor 5575 is connected to the first wiring 5501, and a second electrode of the fifth thin film transistor 5575 is connected to the gate electrode of the first thin film transistor 5571.

A first electrode of the sixth thin film transistor 5576 is connected to the sixth wiring 5506, a gate electrode of the sixth thin film transistor 5576 is connected to the gate electrode of the second thin film transistor 5572, and a second electrode of the sixth thin film transistor 5576 is connected to the gate electrode of the first thin film transistor 5571.

A first electrode of the seventh thin film transistor 5577 is connected to the sixth wiring 5506, a gate electrode of the seventh thin film transistor 5577 is connected to the second wiring 5502, and a second electrode of the seventh thin film transistor 5577 is connected to the gate electrode of the first thin film transistor 5571.

A first electrode of the eighth thin film transistor 5578 is connected to the sixth wiring 5506, a gate electrode of the eighth thin film transistor 5578 is connected to the first wiring

5501, and a second electrode of the eighth thin film transistor 5578 is connected to the gate electrode of the second thin film transistor 5572.

Note that a point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. A point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power source line and a second power source line, respectively.

In the flip flop 5701_$i$ of the i-th stage, the first wiring 5501 in FIG. 19 is connected to the seventh wiring 5717_$i$–1 in FIG. 18. The second wiring 5502 in FIG. 19 is connected to the seventh wiring 5717_$i$+1 in FIG. 18. The third wiring 5503 in FIG. 19 is connected to the seventh wiring 5717_$i$. The sixth wiring 5506 in FIG. 19 is connected to the fifth wiring 5715.

If the "i" is an odd number, the fourth wiring 5504 in FIG. 19 is connected to the second wiring 5712 in FIG. 18; if the "i" is an even number, the fourth wiring 5504 in FIG. 19 is connected to the third wiring 5713 in FIG. 18. In addition, the fifth wiring 5505 in FIG. 19 is connected to the fourth wiring 5714 in FIG. 18.

Note that in the flip flop 5701_1 of the first stage, the first wiring 5501 in FIG. 19 is connected to the first wiring 5711 in FIG. 18. In addition, in the flip flop 5701_$n$ of the n-th stage, the second wiring 5502 in FIG. 19 is connected to the sixth wiring 5716 in FIG. 18.

Note that the signal line driver circuit and the scanning line driver circuit can be formed using only the n-channel TFTs described in Embodiment 3. The n-channel TFT described in Embodiment 3 has high mobility, and thus a driving frequency of a driver circuit can be increased. In addition, in the n-channel TFT illustrated in Embodiment 3, since parasitic capacitance is reduced by the source and the drain region formed using an In—Ga—Zn—O based non-single-crystal film, the frequency characteristics (referred to as f characteristics) are high. For example, a scanning line driver circuit using the n-channel TFT described in Embodiment 3 can operate at high speed, and thus a frame frequency can be increased and insertion of black images and the like can be realized.

In addition, when the channel width of the transistor in the scanning line driver circuit is increased or a plurality of scanning line driver circuits are provided, a higher frame frequency can be realized. When a plurality of scanning line driver circuits are provided, a scanning line driver circuit for driving even-numbered scanning lines is provided on one side and a scanning line driver circuit for driving odd-numbered scanning lines is provided on the opposite side; thus, increase in frame frequency can be realized. In addition, output of a signal to one scanning line by a plurality of scanning line driver circuits has an advantage of upsizing of the display device.

Figure 14B:
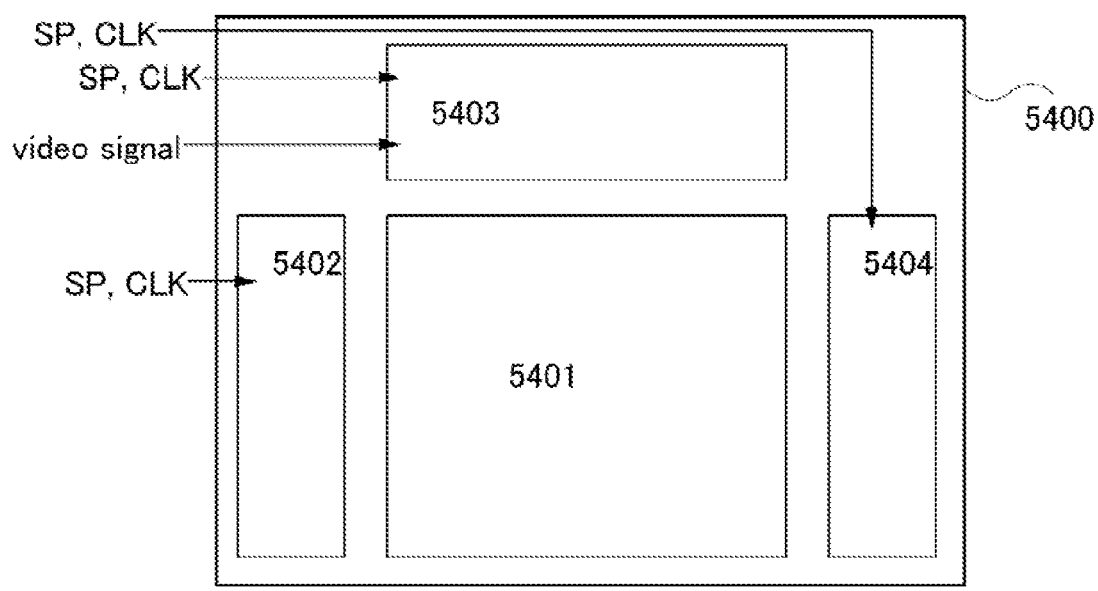

Further, when an active matrix light-emitting display device, which is an example of a display device, is manufactured, a plurality of transistors are arranged in at least one pixel, and thus a plurality of scanning line driver circuits are preferably arranged. FIG. 14B is a block diagram illustrating an example of an active matrix light-emitting display device.

The light-emitting display device illustrated in FIG. 14B includes, over a substrate 5400, a pixel portion 5401 having a plurality of pixels each provided with a display element, a first scanning line driver circuit 5402 and a second scanning line driver circuit 5404 that select a pixel, and a signal line driver circuit 5403 that controls input of a video signal to the selected pixel.

When the video signal input to a pixel of the display device illustrated in FIG. 14B is a digital signal, a pixel is in a light-emitting state or a non-light-emitting state by switching of on/off of a transistor. Thus, grayscale can be displayed using an area ratio grayscale method or a time ratio grayscale method. An area ratio grayscale method refers to a driving method by which one pixel is divided into a plurality of sub-pixels and each sub-pixel is driven independently based on a video signal so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than liquid-crystal elements. In the case of displaying with a time gray scale method, one frame period is divided into a plurality of sub-frame periods. Then, in accordance with video signals, the light-emitting element in the pixel is set in a light-emitting state or a non-light-emitting state in each sub-frame period. By dividing one frame into a plurality of sub-frames, the total length of time, in which pixels emit light in one frame period, can be controlled with video signals so that gray scales are displayed.

In the light-emitting display device illustrated in FIG. 14B, in the case where two switching TFTs are arranged in one pixel, the first scanning line driver circuit 5402 generates a signal which is input to a first scanning line serving as a gate wiring of one switching TFT, and the second scanning line driver circuit 5404 generates a signal which is input to a second scanning line serving as a gate wiring of the other switching TFT; however, one scanning line driver circuit may generate both the signals which is input to the first scanning line and the signal which is input to the second scanning line. In addition, for example, there is a possibility that a plurality of scanning lines used for controlling the operation of the switching element are provided in each pixel, depending on the number of the switching TFTs included in one pixel. In that case, one scanning line driver circuit may generate all signals that are input to the plurality of scanning lines, or a plurality of scanning line driver circuits may generate signals that are input to the plurality of scanning lines.

In addition, also in the light-emitting display device, a part of a driver circuit that can include n-channel TFTs among driver circuits can be formed over the same substrate as the thin film transistors of the pixel portion. Alternatively, the signal line driver circuit and the scanning line driver circuit can be formed using only the n-channel TFTs described in Embodiment 3.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. For example, electrophoretic displays include a plurality of microcapsules dispersed in a solvent or a solute, each microcapsule includes a first particle which is positively charged and a second particle which is negatively charged. In this case, by applying an electric field to the microcapsules, the particles in the microcapsules are moved in opposite directions to each other and only the color of the particles concentrated on one side can be exhibited. Note that the first particle and the second particle each include pigment and do not move without an electric field. Moreover, the colors of the first particle and the second particle are different from each other (including colorless or achroma).

In this way, an electrophoretic display is a display that utilizes a system in which particles are moved by an electric field or the like. An electrophoretic display does not need a polarizer and a counter substrate, which are required in a liquid crystal display device, whereby both the thickness and weight of the electrophoretic display can be reduced remarkably.

A solution obtained by dispersing the aforementioned microcapsules throughout a solvent is referred to as electronic ink. This electronic ink can be printed on a surface of glass, plastic, cloth, paper, or the like. Furthermore, by use of a color filter or particles that have a pigment, color display is possible, as well.

When a plurality of microcapsules are arranged over an active matrix substrate and the microcapsules are interposed between an electrode formed over the active matrix substrate and another electrode, an active matrix display device is completed. The active matrix display device can perform display by application of an electric field to the microcapsules. As the active matrix substrate, for example, the active matrix substrate with the use of the thin film transistor obtained in Embodiment 3 can be used.

Note that the first particle and the second particle in the microcapsule may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

Through the above process, a highly reliable display device can be manufactured as a semiconductor device.

This embodiment can be implemented in combination with any of the other embodiments as appropriate.

Embodiment 5

In this embodiment, a thin film transistor is manufactured, and a semiconductor device having a display function (also referred to as a display device) can be manufactured using the thin film transistor for a pixel portion and further for a driver circuit. Further, a part or whole of a driver circuit can be formed over the same substrate as a pixel portion, using the thin film transistor according to an embodiment of the present invention, whereby a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Further, a display medium whose contrast is changed by an electric effect, such as electronic ink, can be used.

In addition, the display device includes a panel in which the display element is sealed, and a module in which an IC including a controller or the like is mounted on the panel. The display device includes an element substrate corresponding to one mode before the display element is completed in a manufacturing process of the display device, and the element substrate is provided with a means for supplying current to the display element in each of a plurality of pixels. Specifically, the element substrate may be in a state provided with only a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

In this embodiment, a liquid crystal display device is shown as an example of a semiconductor device. The appearance and a cross section of a liquid crystal display panel, which is one embodiment of the semiconductor device of the present invention, will be described with reference to FIGS. 22A1 to 22B. FIGS. 22A1 and 22A2 are top views of a panel in which highly reliable thin film transistors 4010 and 4011 each including an In—Ga—Zn—O based non-single-crystal film, and a liquid crystal element 4013 are sealed between a first substrate 4001 and a second substrate 4006 with a sealant 4005. FIG. 22B is a cross-sectional view along line M-N of FIGS. 22A1 and 22A2.

The sealant 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Therefore, the pixel portion 4002 and the scanning line driver circuit 4004 are sealed together with liquid crystal 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 22A1 illustrates an example of mounting the signal line driver circuit 4003 by a COG method, and FIG. 22A2 illustrates an example of mounting the signal line driver circuit 4003 by a TAB method.

The pixel portion 4002 and the scanning line driver circuit 4004 provided over the first substrate 4001 each include a plurality of thin film transistors. FIG. 22B illustrates the thin film transistor 4010 included in the pixel portion 4002 and the thin film transistor 4011 included in the scanning line driver circuit 4004. Insulating layers 4020 and 4021 are provided over the thin film transistors 4010 and 4011.

Each of the thin film transistors 4010 and 4011 corresponds to the highly reliable thin film transistor described in Embodiment 3, in which an In—Ga—Zn—O based non-single-crystal film is included as a semiconductor layer. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and sandwich the liquid crystal 4008 with the insulating layers 4032 and 4033 interposed therebetween.

Note that the first substrate 4001 and the second substrate 4006 can be formed by using glass, metal (typically, stainless steel), ceramic, or plastic. As an example of plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used. In addition, the counter electrode layer 4031 is electrically connected to a common potential line formed over the same substrate as the thin film transistor 4010. The counter electrode layer 4031 and the common potential line are electrically connected to each other using a common connecting portion, with conductive particles which are arranged between the pair of substrates interposed therebetween. Note that the conductive particles are included in the sealant 4005.

Alternatively, liquid crystal showing a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition in which a chiral agent at 5 wt % or more is mixed is used for the liquid crystal layer 4008 in order to improve the temperature range. The liquid crystal composition which includes liquid crystal showing a blue phase and a chiral agent have such characteristics that the response speed is as short as 10 μs as to 100 μs, the alignment process is unnecessary because the liquid crystal composition has optical isotropy, and viewing angle dependency is small.

Note that the liquid crystal display device described in this embodiment is an example of a transmissive liquid crystal display device; however, the liquid crystal display device described in this embodiment can be applied to a reflective liquid crystal display device and a semi-transmissive liquid crystal display device.

In this embodiment, an example of the liquid crystal display device is described in which a polarizing plate is provided in a position outer than the substrate (on the viewer side) and a coloring layer and the electrode layer used for a display element are provided in a position inner than the substrate; however, the polarizing plate may be provided in an inner position than the substrate. The stacked structure of the polarizing plate and the coloring layer is not limited to this embodiment and may be set as appropriate depending on materials of the polarizing plate and the coloring layer or conditions of manufacturing steps. Further, a light-blocking film functioning as a black matrix may be provided.

In this embodiment, the thin film transistor obtained in Embodiment 3 is covered with the insulating layers functioning as a protective layer and a planarization insulating film (the insulating layers 4020 and 4021) so that unevenness of the surface of the thin film transistor is reduced and reliability of the thin film transistor is improved. Note that the protective film is provided to prevent entry of a contaminant impurity such as an organic substance, a metal substance, or moisture included in the air and is preferably a dense film. The protective film can be formed of a single layer or stacked layers formed using a silicon oxide film, a silicon nitride film, a silicon oxynitride film, a silicon nitride oxide film, an aluminum oxide film, an aluminum nitride film, an aluminum oxynitride film, and/or an aluminum nitride oxide film by a sputtering method. In this embodiment, the protective film is formed by a sputtering method; however, this embodiment is not particularly limited thereto. The protective film may be formed by any of various methods.

Here, the insulating layer 4020 having a stacked-layer structure is formed as the protective film. Here, a silicon oxide film is formed by a sputtering method as a first layer of the insulating layer 4020. The silicon oxide film is used as the protective film, which has an effect to prevent a hillock of an aluminum film used for a source electrode layer and a drain electrode layer.

In addition, an insulating layer is formed as a second layer of the protective film. Here, as a second layer of the insulating layer 4020, a silicon nitride film is formed by a sputtering method. When the silicon nitride film is used as one layer in the protective film, mobile ions of sodium or the like can be prevented from entering a semiconductor region so that variation in electric characteristics of a TFT can be suppressed.

In addition, after forming the protective film, the semiconductor layer may be annealed (at 300° C. to 400° C.).

In addition, the insulating layer 4021 is formed as an insulating film functioning as a planarization film. An organic material having heat resistance, such as polyimide, acrylic, benzocyclobutene, polyamide, or epoxy can be used for the insulating layer 4021. In addition to such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane-based resin is a resin formed from a siloxane-based material as a starting material and having the bond of Si—O—Si. The siloxane-based resin may include, as a substituent, an organic group (e.g., an alkyl group or an aryl group) or a fluoro group. In addition, the organic group may include a fluoro group.

There are no particular limitations on formation method of the insulating layer 4021 and any of the following methods can be employed depending on the material of the insulating layer 4021: a CVD method, a sputtering method, an SOG method, spin coating, dipping, spray coating, a droplet discharge method (e.g., an ink-jet method, screen printing, offset printing, or the like), a doctor knife, a roll coater, a curtain coater, a knife coater, and the like. When the insulating layer 4021 is formed using a material solution, the semiconductor layer may be annealed (at 300° C. to 400° C.) at the same time as a baking step of the insulating layer 4021. The baking step of the insulating layer 4021 serves also as the annealing step of the semiconductor layer, and a display device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, indium tin oxide to which silicon oxide is added, or the like.

In addition, a conductive composition containing a conductive high molecule (also referred to as a conductive polymer) can be used for forming the pixel electrode layer 4030 and the counter electrode layer 4031. The pixel electrode formed of the conductive composition has preferably a sheet resistance of less than or equal to $1.0 \times 10^4$ Ω/square and a transmittance of greater than or equal to 70% at a wavelength of 550 nm Further, the resistivity of the conductive high molecule contained in the conductive composition is preferably less than or equal to 0.1 Ω·cm.

As the conductive high molecule, a so-called π electron conjugated conductive high molecule can be used. As examples thereof, polyaniline or a derivative thereof, polypyrrole or a derivative thereof, polythiophene or a derivative thereof, a copolymer of two or more kinds of them, and the like can be given.

Further, a variety of signals and a potential are supplied to the signal line driver circuit 4003 which is formed separately, the scanning line driver circuit 4004, or the pixel portion 4002 from an FPC 4018.

In this embodiment, a connection terminal electrode 4015 is formed using the same conductive film as the pixel electrode layer 4030 included in the liquid crystal element 4013, and a terminal electrode 4016 is formed with the same conductive film as the source electrode layers and the drain electrode layers of the thin film transistors 4010 and 4011.

The connection terminal electrode 4015 is electrically connected to a terminal included in the FPC 4018 through an anisotropic conductive film 4019.

Note that FIGS. 22A1 to 22B illustrate an example in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 23:
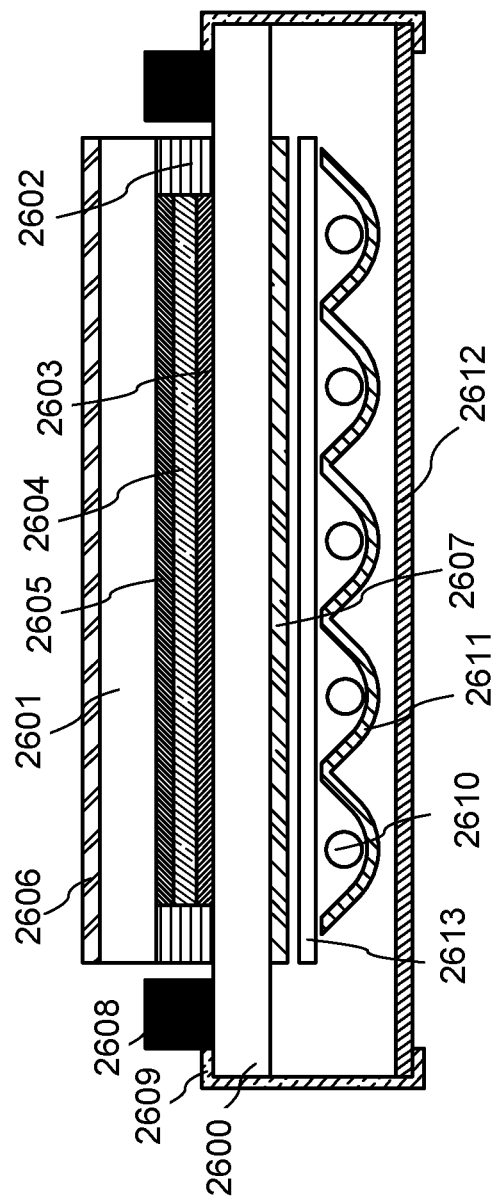
FIG. 23 illustrates a semiconductor device according to Embodiment 6.

FIG. 23 illustrates an example in which a TFT substrate 2600 is used for a liquid crystal display module which corresponds to one mode of the semiconductor device.

FIG. 23 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, a coloring layer 2605, and a polarizing plate 2606 are provided between the substrates to form a display region. The coloring layer 2605 is necessary to perform color display. In the case of the RGB system, coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a highly reliable liquid crystal display device can be manufactured as a semiconductor device.

This embodiment can be implemented in combination with any of the other embodiments as appropriate.

Embodiment 6

In this embodiment, electronic paper is described as an example of a semiconductor device.

Figure 13:
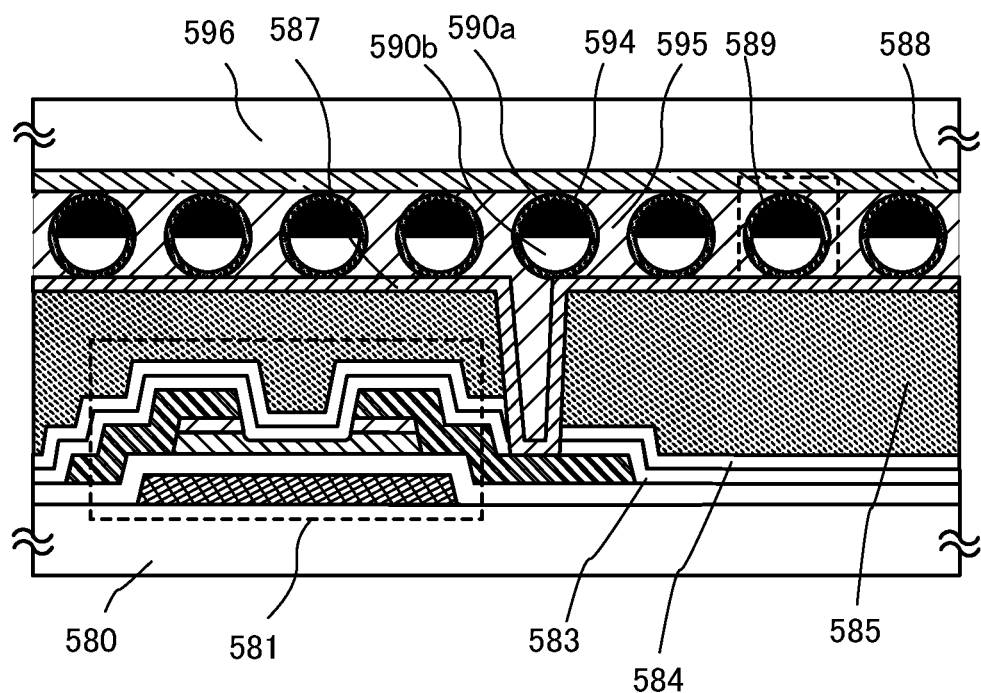
FIG. 13 illustrates a semiconductor device according to Embodiment 4.

FIG. 13 illustrates active matrix electronic paper as an example of a semiconductor device. A thin film transistor 581 used for the semiconductor device can be manufactured in a manner similar to the thin film transistor described in any of Embodiments 1 to 3.

The electronic paper in FIG. 13 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a thin film transistor with a bottom-gate structure, and a source electrode layer or a drain electrode layer is electrically connected to a first electrode layer 587 through a contact hole formed in insulating layers 583, 584, and 585. Between the first electrode layer 587 and a second electrode layer 588, spherical particles 589 each having a black region 590a and a white region 590b are provided, which are surrounded by a cavity 594 filled with liquid. A space around the spherical particles 589 is filled with a filler 595 such as resin (see FIG. 13). In FIG. 13, the first electrode layer 587 corresponds to a pixel electrode, and the second electrode layer 588 corresponds to a common electrode. The second electrode layer 588 is electrically connected to a common potential line provided over the same substrate as the thin film transistor 581. The second electrode layer 588 provided for the substrate 596 and the common potential electrode can be electrically connected to each other using the common connection portion described in the above embodiment, with the conductive particles which are arranged between the pair of substrates interposed therebetween.

Further, instead of the twisting ball, an electrophoretic element can also be used. In this case, a microcapsule having a diameter of approximately 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides, so that white or black can be displayed. A display element using this principle is an electrophoretic display element and is called electronic paper in general. The electrophoretic display element has higher reflectivity than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured as a semiconductor device.

This embodiment can be implemented in combination with any of the structures described in the other embodiments as appropriate.

Embodiment 7

In this embodiment, an example of a light-emitting display device is described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 20:
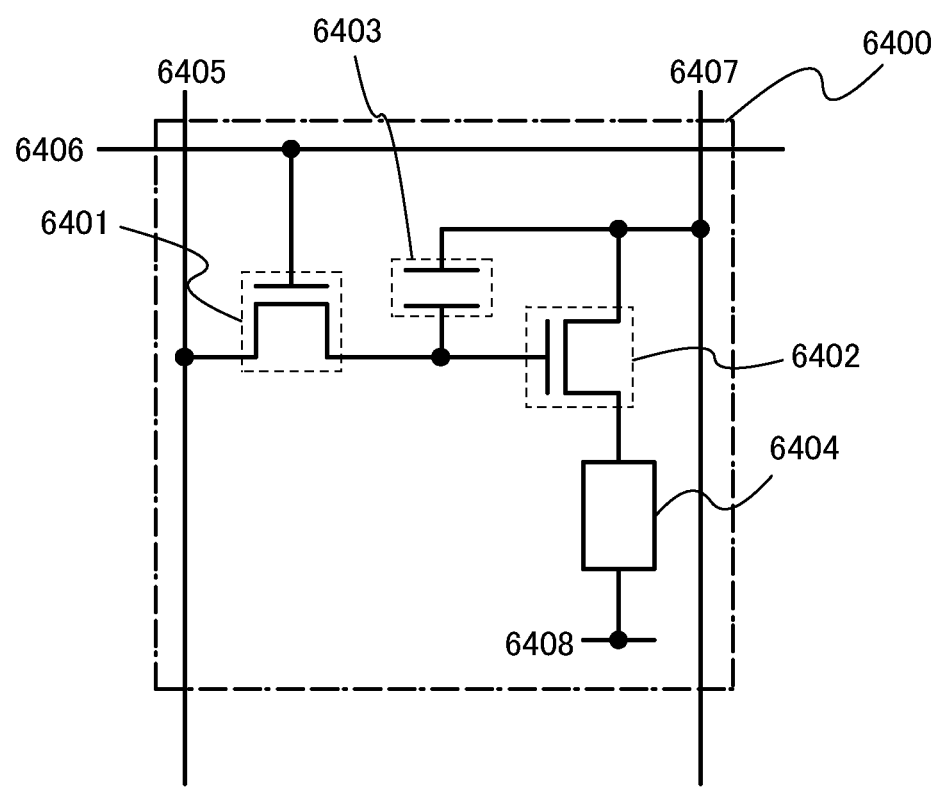
FIG. 20 is a diagram showing an equivalent circuit of a pixel of a semiconductor device according to Embodiment 6.

FIG. 20 illustrates an example of a pixel structure to which digital time grayscale driving can be applied, as an example of a semiconductor device.

A structure and operation of a pixel to which digital time grayscale driving can be applied are described. In this example, one pixel includes two n-channel transistors each of which includes an oxide semiconductor layer (an In—Ga—Zn—O based non-single-crystal film) as a channel formation region.

A pixel 6400 includes a switching transistor 6401, a driver transistor 6402, a light-emitting element 6404, and a capacitor 6403. A gate of the switching transistor 6401 is connected to a scanning line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line formed over the same substrate. A common connection portion where the common electrode 6408 and the common potential line are connected to each other may be have a structure illustrated in FIG. 1A, FIG. 2A, or FIG. 3A.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in a linear region, a voltage higher than the voltage of the power supply line 6407 is applied to the gate of the driver transistor 6402. Note that a voltage higher than or equal to (voltage of the power supply line+Vth of the driver transistor 6402) is applied to the signal line 6405.

In the case of performing analog grayscale driving instead of digital time grayscale driving, the same pixel structure as that in FIG. 20 can be used by changing signal input.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least a forward threshold voltage. The video signal by which the driver transistor 6402 operates in a saturation region is input, so that current can be supplied to the light-emitting element 6404. In order for the driver transistor 6402 to operate in a saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 20 is not limited thereto. For example, a switch, a resistor, a capacitor, a transistor, a logic circuit, or the like may be added to the pixel illustrated in FIG. 20.

Next, structures of the light-emitting element is described with reference to FIGS. 21A to 21C. A cross-sectional structure of a pixel is described by taking an n-channel driving TFT as an example. Driving TFTs 7001, 7011, and 7021 used for semiconductor devices illustrated in FIGS. 21A to 21C can be manufactured in a manner similar to the thin film transistor described in Embodiment 3 and are highly reliable thin film transistors each including an In—Ga—Zn—O based non-single-crystal film as a semiconductor layer.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. A pixel structure of an embodiment of the present invention can be applied to a light-emitting element having any of these emission structures.

A light-emitting element having a top emission structure is described with reference to FIG. 21A.

Figure 21A:
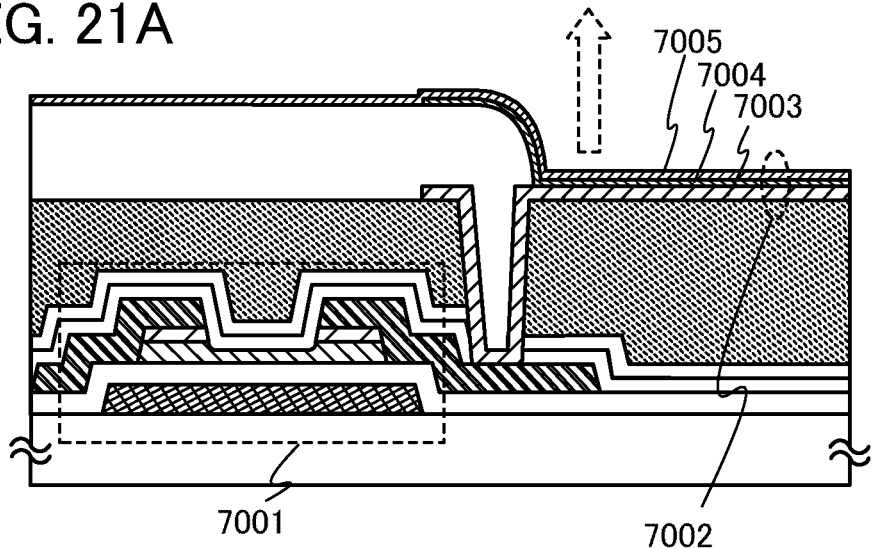
FIGS. 21A, 21B, and 21C illustrate semiconductor devices according to Embodiment 6.

FIG. 21A is a cross-sectional view of a pixel in the case where the driving TFT 7001 is an n-channel TFT and light is emitted from a light-emitting element 7002 to an anode 7005 side. In FIG. 21A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive material such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 21A, light is emitted from the light-emitting element 7002 to the anode 7005 side as indicated by an arrow.

Next, a light-emitting element having a bottom emission structure is described with reference to FIG. 21B. FIG. 21B is a cross-sectional view of a pixel in the case where the driving TFT 7011 is an n-channel transistor and light is emitted from a light-emitting element 7012 to a cathode 7013 side. In FIG. 21B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 21A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 21A, the light-emitting layer 7014 may be formed using either a single layer or a plurality of layers stacked. The anode 7015 is not required to transmit light, but can be formed using a light-transmitting conductive material as in the case of FIG. 21A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 21B, light is emitted from the light-emitting element 7012 to the cathode 7013 side as indicated by an arrow.

Next, a light-emitting element having a dual emission structure will be described with reference to FIG. 21C. In FIG. 21C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 21A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 21A, the light-emitting layer 7024 may be formed using either a single layer or a plurality of layers stacked. The anode 7025 can be formed using a light-transmitting conductive material as in the case of FIG. 21A.

The light-emitting element 7022 corresponds to a region where the cathode 7023, the light-emitting layer 7024, and the anode 7025 overlap with one another. In the case of the pixel illustrated in FIG. 21C, light is emitted from the light-emitting element 7022 to both the anode 7025 side and the cathode 7023 side as indicated by arrows.

Note that, although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 21B:
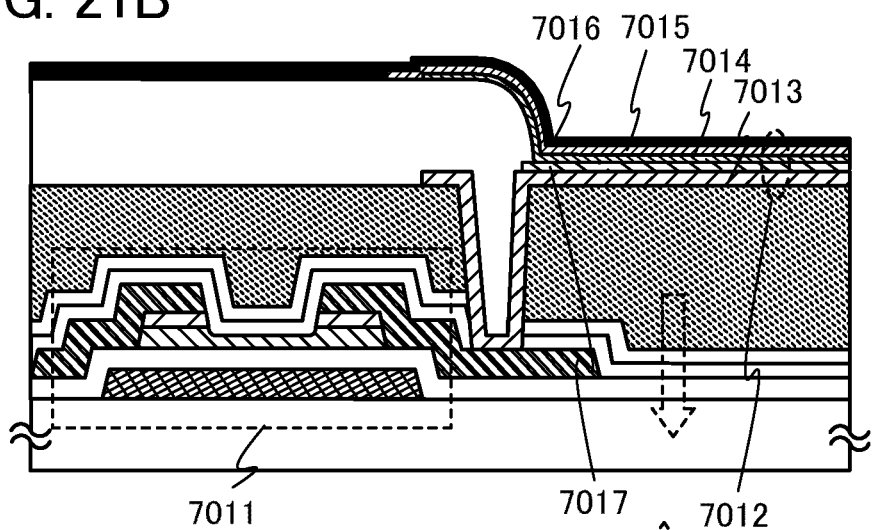
Figure 21C:
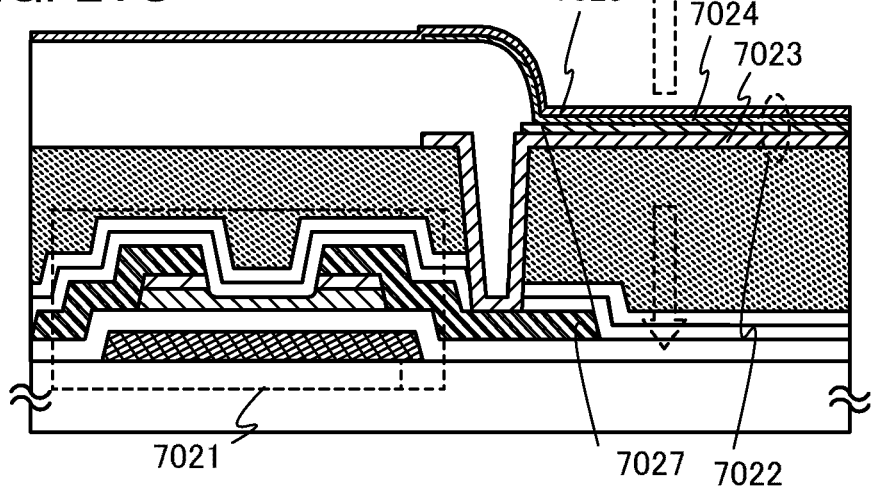

A semiconductor device described in this embodiment is not limited to the structures illustrated in FIGS. 21A to 21C and can be modified in various ways based on the spirit of techniques according to the present invention.

Figure 24A:
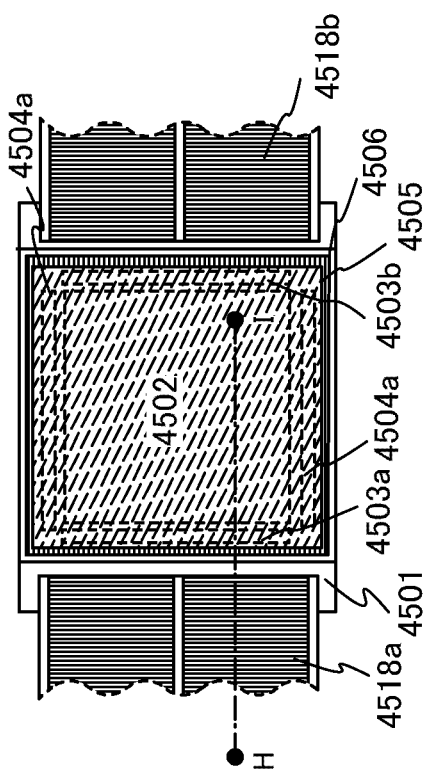
FIGS. 24A and 24B illustrate a semiconductor device according to Embodiment 6.
Figure 24B:
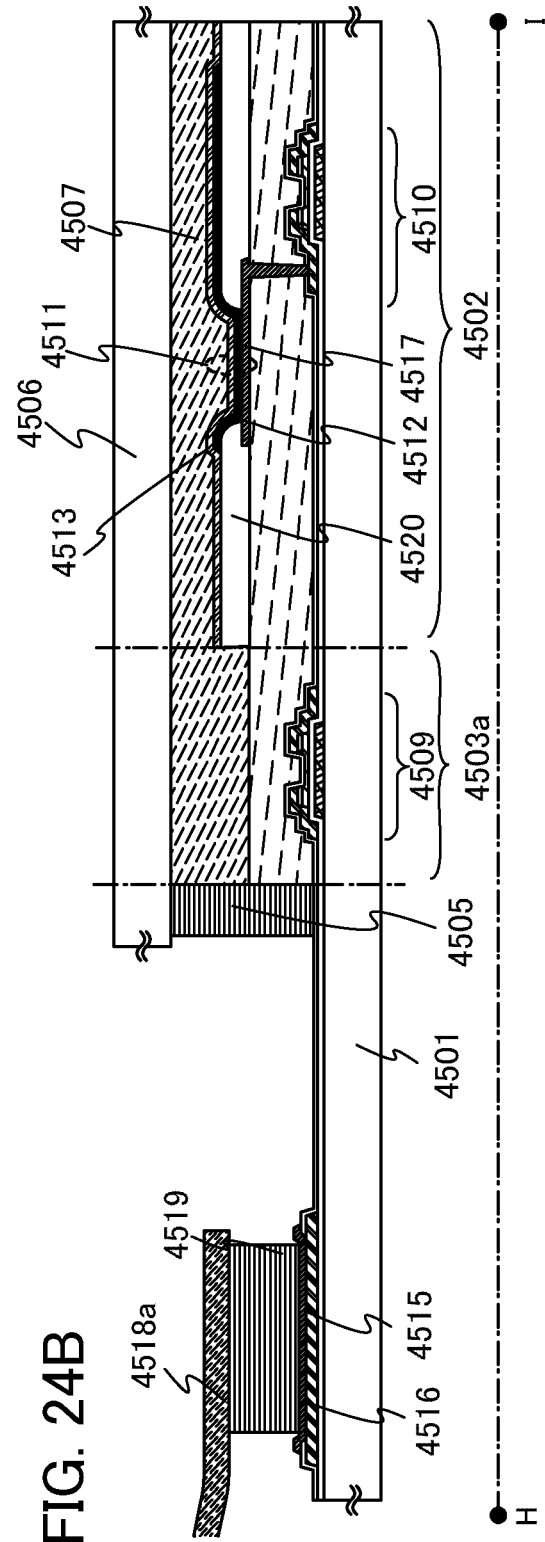

Next, the appearance and the cross section of a light-emitting display panel (also referred to as a light-emitting panel), which is one embodiment of a semiconductor device, are described with reference to FIGS. 24A and 24B. FIG. 24A is a top view of a panel in which highly reliable thin film transistors 4509 and 4510 which are formed over a first substrate 4051 described in Embodiment 3 and each of which includes an In—Ga—Zn—O based non-single-crystal film as a semiconductor layer, and a light-emitting element 4511 are sealed between the first substrate 4510 and a second substrate 4506 with a sealant 4505. FIG. 24B is a cross-sectional view taken along line H-I of FIG. 24A.

A sealant 4505 is provided so as to surround a pixel portion 4502, signal line driver circuits 4503a and 4503b, and scanning line driver circuits 4504a and 4504b which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air as described above.

The pixel portion 4502, the signal line driver circuits 4503a and 4503b, and the scanning line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 24B.

As each of the thin film transistors 4509 and 4510, the highly reliable thin film transistor described in Embodiment 3, in which an In—Ga—Zn—O based non-single-crystal film is included as a semiconductor layer, can be used. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, the electroluminescent layer 4512, and the second electrode layer 4513, but the present invention is not limited to that described in this embodiment. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scanning line driver circuits 4504a and 4504b, or the pixel portion 4502 from FPCs 4518a and 4518b.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be provided as driver circuits formed using a single crystal semiconductor film or polycrystalline semiconductor film over a substrate separately prepared. In addition, only the signal line driver circuits or part thereof, or the scanning line driver circuits or part thereof may be separately formed and mounted. This embodiment is not limited to the structure illustrated in FIGS. 24A and 24B.

Through the above process, a highly reliable light-emitting display device (display panel) can be manufactured as a semiconductor device.

This embodiment can be implemented in combination with any of the other embodiments as appropriate.

Embodiment 8

A semiconductor device according to the present invention can be applied to electronic paper. Electronic paper can be used for electronic devices of a variety of fields as long as they can display data. For example, electronic paper according to the present invention can be applied to an electronic book (e-book) reader, a poster, an advertisement in a vehicle such as a train, displays of various cards such as a credit card, and the like. Examples of the electronic devices are illustrated in FIGS. 25A and 25B and FIG. 26.

Figure 25A:
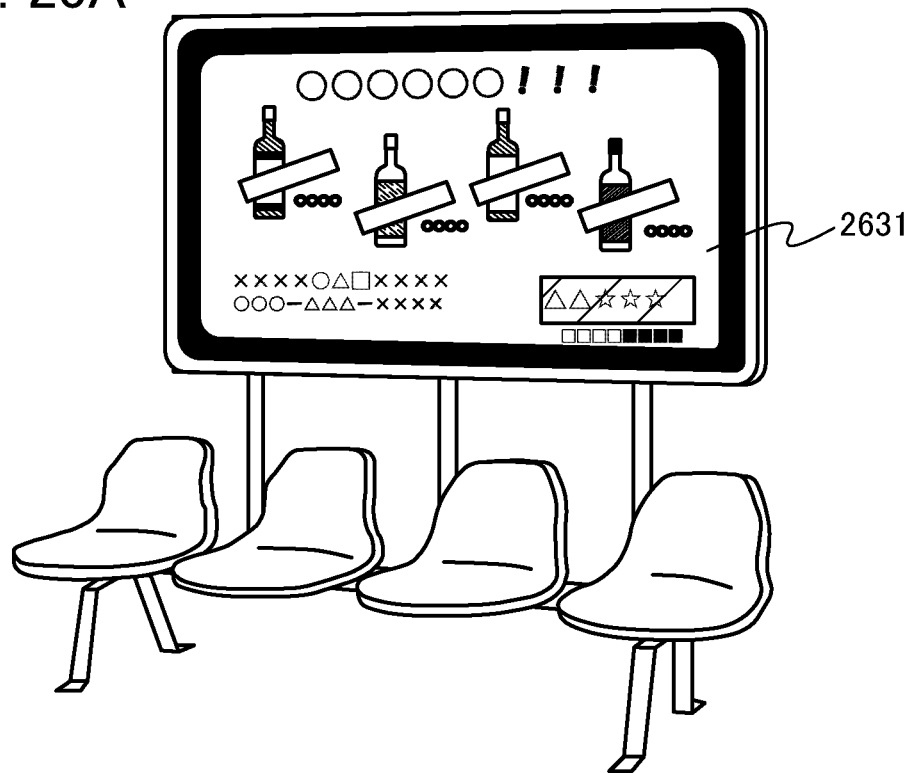
FIGS. 25A and 25B illustrate examples of the usage mode of electronic paper.
Figure 26:
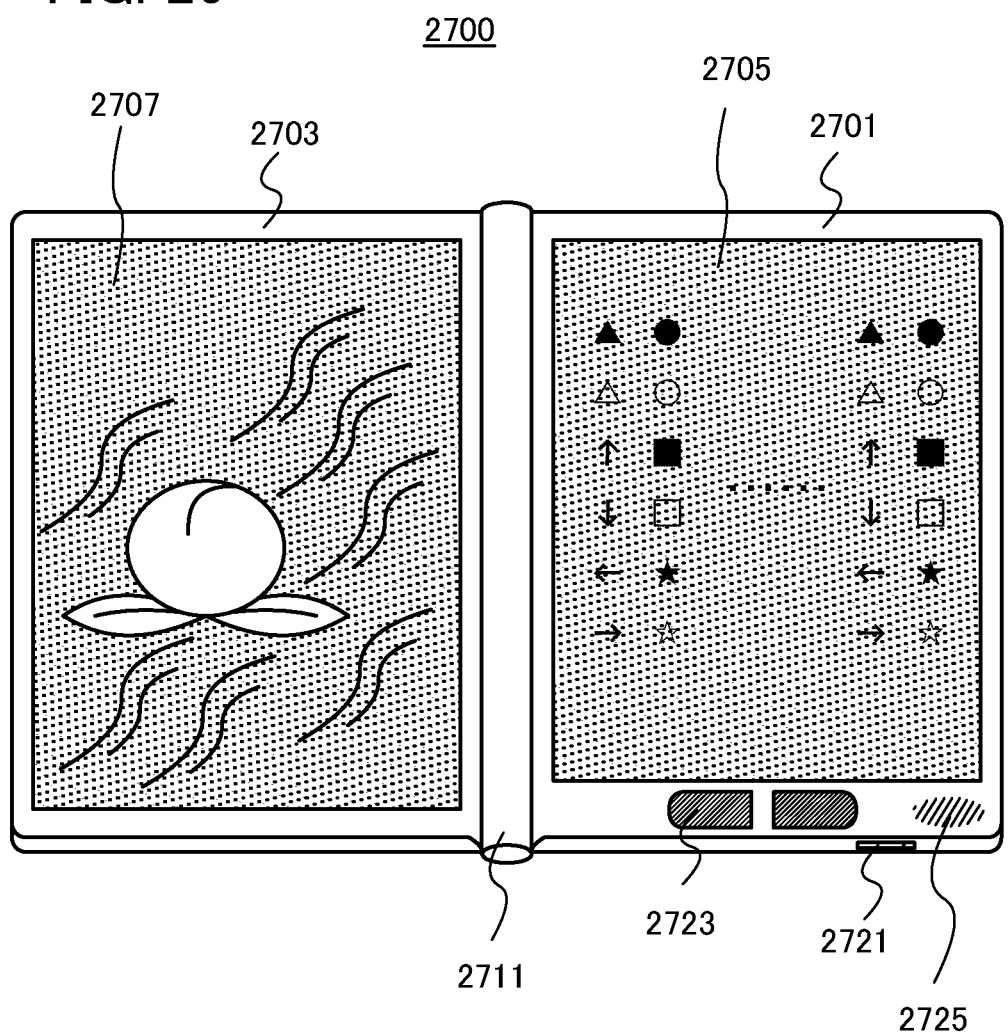
FIG. 26 is an external view illustrating an example of an electronic book.

FIG. 25A illustrates a poster 2631 formed using electronic paper. In the case where an advertising medium is printed paper, the advertisement is replaced by manpower; however, by using electronic paper, the advertising display can be changed in a short time. Further, an image can be stably displayed without being distorted. Note that the poster may be configured to transmit and receive data wirelessly.

Figure 25B:
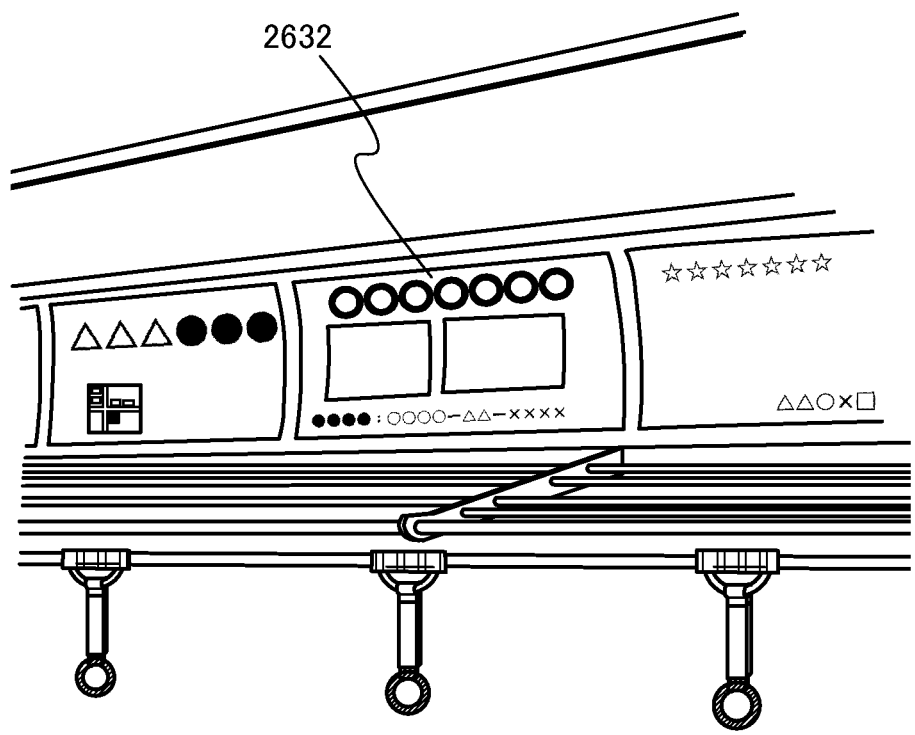

FIG. 25B illustrates an advertisement 2632 in a vehicle such as a train. In the case where an advertising medium is printed paper, the advertisement is replaced by manpower; however, by using electronic paper, the advertising display can be changed in a short time without a lot of manpower.

Further, an image can be stably displayed without being distorted. Note that the advertisement in a vehicle may be configured to transmit and receive data wirelessly.

FIG. 26 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may be configured to display one image or different images. In the case where the display portion 2705 and the display portion 2707 display different images, for example, a display portion on the right side (the display portion 2705 in FIG. 26) can display text and a display portion on the left side (the display portion 2707 in FIG. 26) can display graphics.

FIG. 26 illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as an AC adapter and a USB cable, or the like), a recording medium insert portion, or the like may be provided on the back surface or the side surface of the housing. Further, the electronic book reader 2700 may have a function of an electronic dictionary.

The electronic book reader 2700 may be configured to transmit and receive data wirelessly. The structure can be employed in which desired book data or the like is purchased and downloaded from an electronic book server wirelessly.

Embodiment 9

A semiconductor device according to the present invention can be applied to a variety of electronic devices (including an amusement machine). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 27A:
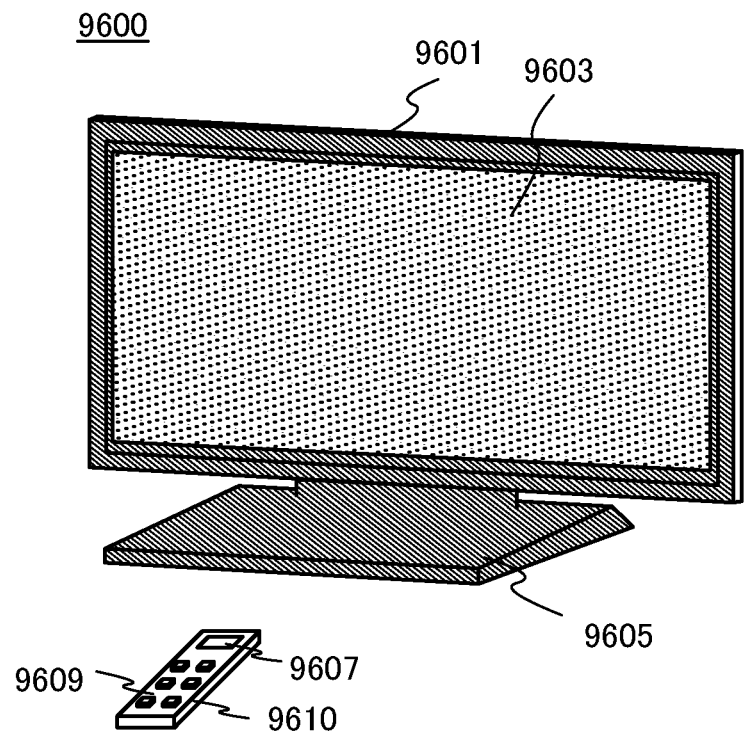
FIG. 27A is an external view of a television device and FIG. 27B is an external view of a digital photo frame.

FIG. 27A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated with an operation switch of the housing 9601 or a separate remote controller 9610. Channels and volume can be controlled with operation keys 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 27B:
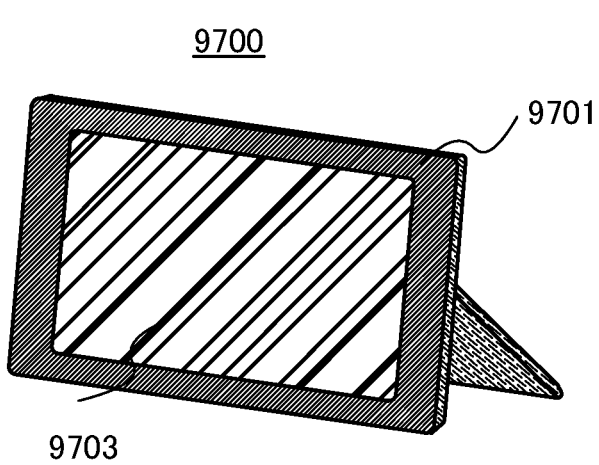

FIG. 27B illustrates an example of a digital photo frame 9700. For example, in the digital photo frame 9700, a display portion 9703 is incorporated in a housing 9701. The display portion 9703 can display various images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 28A:
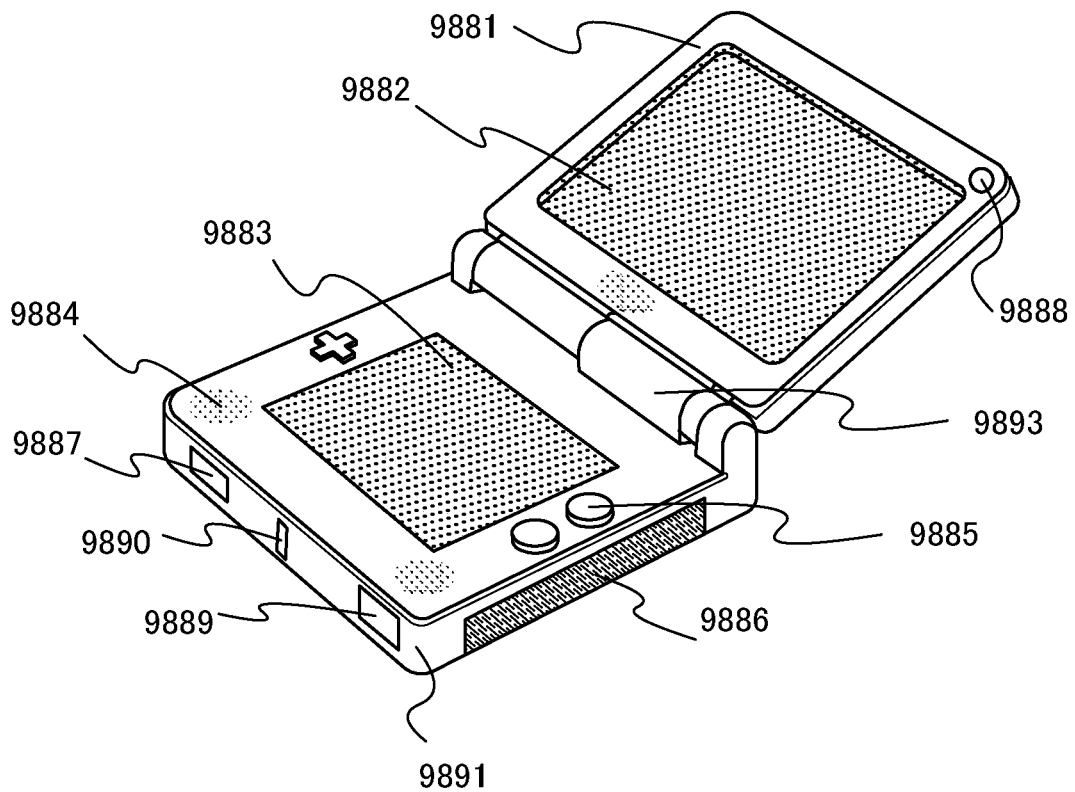
FIGS. 28A and 28B are external views illustrating examples of game machines.

FIG. 28A is a portable game machine and includes two housings, a housing 9881 and a housing 9891, which are connected with a joint portion 9893 so that the portable game machine can be opened or folded. A display portion 9882 is incorporated in the housing 9881, and a display portion 9883 is incorporated in the housing 9891. In addition, the portable game machine illustrated in FIG. 28A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. Needless to say, the structure of the portable game machine is not limited to that described above. The portable game machine may have a structure in which additional accessory equipment is provided as appropriate as long as at least a semiconductor device according to the present invention is provided. The portable game machine illustrated in FIG. 28A has a function of reading a program or data stored in a recording medium to display it on the display portion, and a function of sharing information with another portable game machine by wireless communication. Note that a function of the portable game machine illustrated in FIG. 28A is not limited to those described above, and the portable game machine can have a variety of functions.

Figure 28B:
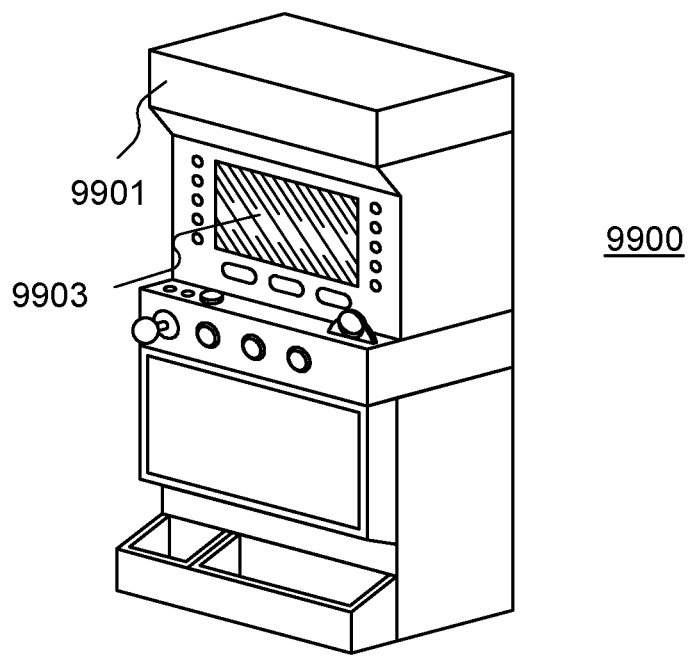

FIG. 28B illustrates an example of a slot machine 9900 which is a large-sized amusement machine. In the slot machine 9900, a display portion 9903 is incorporated in a housing 9901. In addition, the slot machine 9900 is provided with operation means such as a start lever and a stop switch, a coin slot, a speaker, or the like. Needless to say, the structure of the slot machine 9900 is not limited to the above-described structure. The slot machine may have a structure in which additional accessory equipment is provided as appropriate as long as at least a semiconductor device according to the present invention is provided.

Figure 29A:
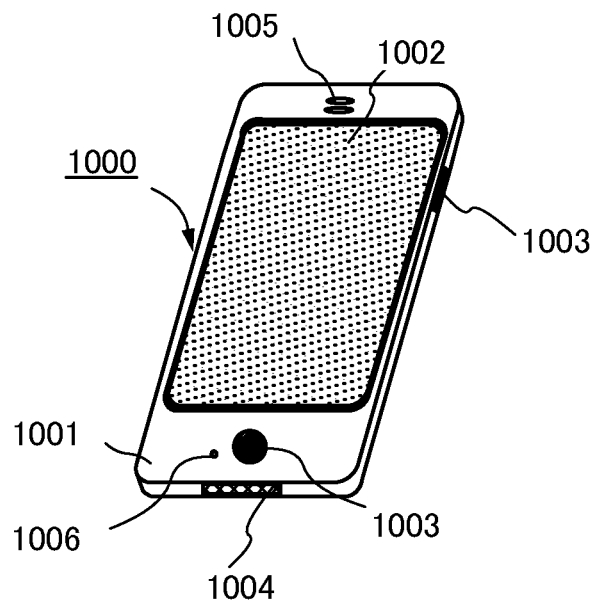
FIGS. 29A and 29B are external views illustrating examples of mobile phones.

FIG. 29A illustrates an example of a mobile phone handset 1000. The mobile phone handset 1000 is provided with a display portion 1002 incorporated in a housing 1001, operation buttons 1003, an external connection port 1004, a speaker 1005, a microphone 1006, and the like.

When the display portion 1002 of the mobile phone handset 1000 illustrated in FIG. 29A is touched with a finger or the like, data can be input into the mobile phone handset 1000. Further, operations such as making calls and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode which is a combination of the two modes, that is, a combination of the display mode and the input mode.

For example, in the case of making a call or texting, a text input mode mainly for inputting text is selected for the display portion 1002 so that characters displayed on a screen can be inputted. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display on the screen of the display portion 1002 can be automatically changed by determining the orientation of the mobile phone handset 1000 (whether the mobile phone handset 1000 is placed horizontally or vertically for a landscape mode or a portrait mode).

The screen modes are changed by touching the display portion 1002 or using the operation buttons 1003 of the housing 1001. Alternatively, the screen modes may be changed depending on the kind of the image displayed on the display portion 1002. For example, when a signal of an image displayed on the display portion is the one of moving image data, the screen mode is changed to the display mode. When the signal is the one of text data, the screen mode is changed to the input mode.

Further, in the input mode, when input by touching the display portion 1002 is not performed for a certain period while a signal detected by the optical sensor in the display portion 1002 is detected, the screen mode may be controlled so as to be changed from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 29B:
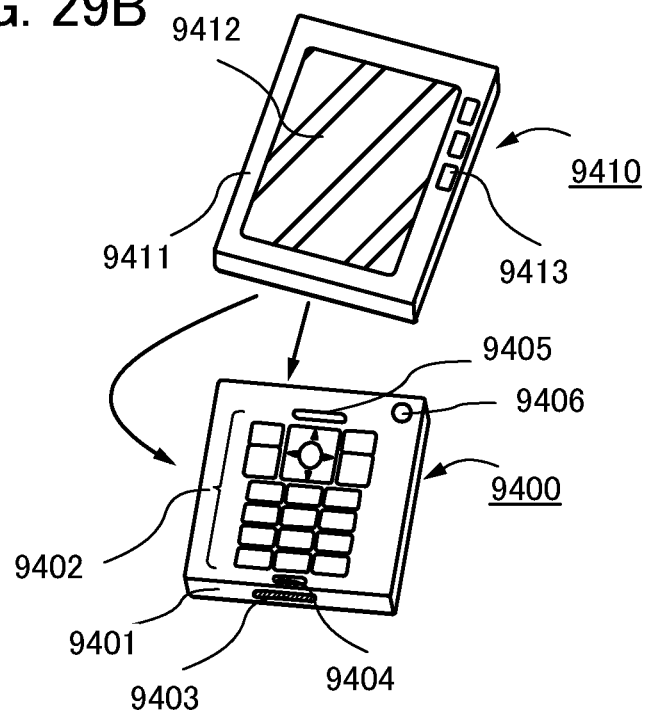

FIG. 29B also illustrates an example of a mobile phone handset. The mobile phone handset in FIG. 29B includes a display device 9410 and a communication device 9400. The display device 9410 includes a housing 9411 including a display portion 9412 and operation buttons 9413. The communication device 9400 includes a housing 9401 including operation buttons 9402, an external input terminal 9403, a microphone 9404, a speaker 9405, and a light-emitting portion 9406 which emits light when an incoming call is received. The display device 9410 having a display function can be detached from the communication device 9400 in two directions indicated by arrows. Therefore, the display device 9410 and the communication device 9400 having a telephone function can be attached to each other along either minor axes thereof or major axes thereof. When only the display function is need, the display device 9410 can be used independently while the communication device 9400 is detached from the display device 9410. The communication device 9400 and the display device 9410 each can transmit and receive images or input information by wireless communication or wired communication and each have a rechargeable battery.

Example 1

In this example, results obtained by dry etching of an oxide semiconductor layer and an insulating film with the use of a chlorine gas and an oxygen gas are described.

Samples used in this example are described. As a first oxide semiconductor layer, an In—Ga—Zn—O based non-single-crystal film with a thickness of 150 nm was formed over a glass substrate by a sputtering method. Formation conditions were as follows: the pressure was 0.4 Pa, the power was 500 W, the formation temperature was 25° C., the flow rate of an argon gas was 10 sccm, the flow rate of oxygen was 5 sccm, and a distance between the substrate and a target was 170 mm The target including $In_2O_3$, $Ga_2O_3$, and ZnO at a ratio of 1:1:1 (In:Ga:Zn=1:1:0.5) was used. The composition of the first oxide semiconductor layer obtained by these formation conditions was measured by inductively coupled plasma mass spectrometry (ICP-MS). The result of the measurement was $InGa_{0.94}Zn_{0.40}O_{3.31}$.

Next, as a second oxide semiconductor layer whose conductivity is higher than that of the first oxide semiconductor layer, an In—Ga—Zn—O based non-single-crystal film with a thickness of 150 nm was formed over a glass substrate by a sputtering method. Formation conditions were as follows: the pressure was 0.4 Pa, the power was 500 W, the formation temperature was 25° C., the flow rate of an argon gas was 40 sccm, and a distance between the substrate and a target was 170 mm The target including $In_2O_3$, $Ga_2O_3$, and ZnO at a ratio of 1:1:1 (In:Ga:Zn=1:1:0.5) was used. The composition of the second oxide semiconductor layer obtained by these formation conditions was measured by inductively coupled plasma mass spectrometry. The result of the measurement was $InGa_{0.95}Zn_{0.41}O_{3.33}$.

Next, as an insulating film, a silicon oxynitride film with a thickness of 200 nm was formed over a glass substrate by a CVD method. Formation conditions were as follows: the pressure was 39.99 Pa, the formation temperature was 400° C., the flow rate of silane was 4 sccm, the flow rate of $N_2O$ was 800 sccm, the RF power was 150 W, and a distance between electrodes was 28 mm.

Then, the respective etching rates of the first oxide semiconductor layer, the second oxide semiconductor layer, and the insulating film were measured. The first oxide semiconductor layer, the second oxide semiconductor layer, and the insulating film which had been formed were etched using masks such as photo resists so that each film remains (half etching). After that, the amount of the first oxide semiconductor etched, the amount of the second oxide semiconductor layer etched, and the amount of the insulating film etched were measured by a step-height measurement apparatus, and then, their respective etching rates (nm/min) were calculated from the relation between the amount of the film etched and the time needed for the etching.

The etching was performed by an ICP etching method on the conditions that the ICP power was 1500 W (the size of an electrode: 370 mm×470 mm), the RF bias was 200 W, the pressure was 1.5 Pa, and the substrate temperature was −10° C. In this etching, four different conditions at the different flow rates of a chlorine gas and an oxygen gas which were etching gases were employed (the flow rate of a chlorine gas:the flow rate of an oxygen gas=100 sccm:0 sccm, 85 sccm:15 sccm, 70 sccm:30 sccm, and 55 sccm:45 sccm). The respective etching rates of the conditions were calculated.

The calculation results of the etching rates are shown in FIG. 4. In FIG. 4, a horizontal axis represents the content (volume %) of an oxygen gas in an etching gas (the total of the chlorine gas and the oxygen gas), a vertical axis on the left side represents an etching rate (nm/min), and a vertical axis on the right side represents a selectivity. In addition, in FIG. 4, a circle represents the etching rate of the first oxide semiconductor layer, a triangle represents the etching rate of the second oxide semiconductor layer, a square represents the etching rate of the insulating film, and a cross represents the selectivity. Note that the selectivity shown in FIG. 4 is the etching rate of the first oxide semiconductor layer with respect to the etching rate of the insulating film.

From the results shown in FIG. 4, a significant difference in the etching rate between the first oxide semiconductor layer and the second oxide semiconductor layer was not observed even though the content (volume %) of the oxygen gas in the etching gas was increased. On the other hand, the results showed that the etching rate of the insulating film was decreased when the content (volume %) of the oxygen gas in the etching gas was increased. In particular, the results showed that when the content of the oxygen gas in the etching gas is 15 volume % or more, the etching rate of the insulating film was decreased.

In addition, it was understood that the selectivity of the first oxide semiconductor layer with respect to the insulating film (a ratio of the etching rate of the first oxide semiconductor layer with respect to the etching rate of the insulating film) was determined, which showed that the selectivity was increased to 4.2 at the maximum with addition of oxygen to the etching gas although the etching rate was less than 1 without addition of oxygen to the etching gas as shown in FIG. 4. Further, a significant difference in the etching rate between the first oxide semiconductor layer and the second oxide semiconductor layer is not observed. Therefore, as for the selectivity of the second oxide semiconductor layer with respect to the insulating film, the result similar to the result relating to the selectivity of the first oxide semiconductor layer with respect to the insulating film is obtained.

As described above, it was understood that when the rate of an oxygen gas added in the etching gas was increased, the etching rate of the insulating film was able to be smaller than those of the first oxide semiconductor layer and the second oxide semiconductor layer. In addition, it was understood that when the content of an oxygen gas in the etching gas was 15 volume % or more, each selectivity of the first oxide semiconductor layer and the second oxide semiconductor layer with respect to the insulating film was able to be increased. In this manner, by inclusion of an oxygen gas in the etching gas, the selectivity of the oxide semiconductor layer with respect to the insulating film can be increased. Accordingly, when part of an oxide semiconductor layer formed over an insulating film (the part near the surface of the oxide semiconductor layer) is removed (channel-etched), damage to exposed part of the insulating film can be suppressed.

This application is based on Japanese Patent Application serial no. 2008-271598 filed with Japan Patent Office on Oct. 22, 2008, the entire contents of which are hereby incorporated by reference.

What is claimed is:

1. A method for manufacturing a semiconductor device comprising:
    forming a semiconductor layer comprising an oxide semiconductor including indium;
    processing the semiconductor layer by wet etching to form an island-shaped semiconductor layer;
    forming a conductive layer over and in contact with a top surface of the island-shaped semiconductor layer; and
    processing the island-shaped semiconductor layer by dry etching to form a recessed portion in the island-shaped semiconductor layer.

2. The method for manufacturing a semiconductor device according to claim 1,
    wherein an etchant for wet etching is a mixed solution including acetic acid, nitric acid, and phosphoric acid.

3. The method for manufacturing a semiconductor device according to claim 1,
    wherein the dry etching is performed by using a gas selected from the group consisting of boron chloride ($BCl_3$), silicon chloride ($SiCl_4$), carbon tetrachloride ($CCl_4$), carbon tetrafluoride ($CF_4$), sulfur fluoride ($SF_6$), nitrogen fluoride ($NF_3$), trifluoromethane ($CHF_3$), hydrogen bromide (HBr), and oxygen ($O_2$), any of these gases to which a rare gas such as helium (He), argon (Ar) is added, or chlorine ($Cl_2$).

4. The method for manufacturing a semiconductor device according to claim 1, further comprising:
    after processing the island-shaped semiconductor layer, heating the island-shaped semiconductor layer at 200 to 600° C.

5. The method for manufacturing a semiconductor device according to claim 1,
    wherein the island-shaped semiconductor layer comprises a crystal grain of the oxide semiconductor.

6. The method for manufacturing a semiconductor device according to claim 1,
    wherein the island-shaped semiconductor layer comprises a crystal grain of the oxide semiconductor, and
    wherein a diameter of the crystal grain is 1 to 10 nm.

7. The method for manufacturing a semiconductor device according to claim 1,
    wherein the oxide semiconductor is an In—Ga—Zn—O based oxide semiconductor.

8. The method for manufacturing a semiconductor device according to claim 1,
    wherein the dry etching is performed by using a gas including chlorine and oxygen.

9. A method for manufacturing a semiconductor device comprising:
    forming a gate electrode;
    forming a gate insulating layer over the gate electrode;
    forming a semiconductor layer comprising an oxide semiconductor including indium over the gate insulating layer;
    processing the semiconductor layer by wet etching to form an island-shaped semiconductor layer;
    forming a conductive layer over the island-shaped semiconductor layer;
    processing the conductive layer by first dry etching to form a first conductive layer and a second conductive layer; and
    processing the island-shaped semiconductor layer by second dry etching to form a recessed portion in the island-shaped semiconductor layer.

10. The method for manufacturing a semiconductor device according to claim 9, wherein an etchant for wet etching is a mixed solution including acetic acid, nitric acid, and phosphoric acid.

11. The method for manufacturing a semiconductor device according to claim 9,
wherein the first dry etching and the second dry etching are performed by using a gas selected from the group consisting of boron chloride ($BCl_3$), silicon chloride ($SiCl_4$), carbon tetrachloride ($CCl_4$), carbon tetrafluoride ($CF_4$), sulfur fluoride ($SF_6$), nitrogen fluoride ($NF_3$), trifluoromethane ($CHF_3$), hydrogen bromide (HBr), and oxygen ($O_2$), any of these gases to which a rare gas such as helium (He), argon (Ar) is added, or chlorine ($Cl_2$).

12. The method for manufacturing a semiconductor device according to claim 9, further comprising:
after processing the island-shaped semiconductor layer, heating the island-shaped semiconductor layer at 200 to 600° C.

13. The method for manufacturing a semiconductor device according to claim 9,
wherein the island-shaped semiconductor layer comprises a crystal grain of the oxide semiconductor.

14. The method for manufacturing a semiconductor device according to claim 9,
wherein the island-shaped semiconductor layer comprises a crystal grain of the oxide semiconductor, and
wherein a diameter of the crystal grain is 1 to 10 nm.

15. The method for manufacturing a semiconductor device according to claim 9,
wherein the oxide semiconductor is an In—Ga—Zn—O based oxide semiconductor.

16. The method for manufacturing a semiconductor device according to claim 9,
wherein the second dry etching is performed by using a gas including chlorine and oxygen.

17. The method for manufacturing a semiconductor device, according to claim 9,
wherein the gate insulating layer includes a silicon oxide.

18. A method for manufacturing a semiconductor device comprising:
forming a gate electrode;
forming a gate insulating layer over the gate electrode;
forming a semiconductor layer comprising an oxide semiconductor including indium over the gate insulating layer;
processing the semiconductor layer by wet etching to form an island-shaped semiconductor layer;
forming a conductive layer over the island-shaped semiconductor layer;
processing the conductive layer by dry etching to form a first conductive layer and a second conductive layer; and
processing the island-shaped semiconductor layer by the dry etching to form a recessed portion in the island-shaped semiconductor layer.

19. The method for manufacturing a semiconductor device according to claim 18,
wherein an etchant for wet etching is a mixed solution including acetic acid, nitric acid, and phosphoric acid.

20. The method for manufacturing a semiconductor device according to claim 18,
wherein the dry etching is performed by using a gas selected from the group consisting of boron chloride ($BCl_3$), silicon chloride ($SiCl_4$), carbon tetrachloride ($CCl_4$), carbon tetrafluoride ($CF_4$), sulfur fluoride ($SF_6$), nitrogen fluoride ($NF_3$), trifluoromethane ($CHF_3$), hydrogen bromide (HBr), and oxygen ($O_2$), any of these gases to which a rare gas such as helium (He), argon (Ar) is added, or chlorine ($Cl_2$).

21. The method for manufacturing a semiconductor device according to claim 18, further comprising:
after processing the island-shaped semiconductor layer, heating the island-shaped semiconductor layer at 200 to 600° C.

22. The method for manufacturing a semiconductor device according to claim 18,
wherein the island-shaped semiconductor layer comprises a crystal grain of the oxide semiconductor.

23. The method for manufacturing a semiconductor device according to claim 18,
wherein the island-shaped semiconductor layer comprises a crystal grain of the oxide semiconductor, and
wherein a diameter of the crystal grain is 1 to 10 nm.

24. The method for manufacturing a semiconductor device according to claim 18,
wherein the oxide semiconductor is an In—Ga—Zn—O based oxide semiconductor.

25. The method for manufacturing a semiconductor device according to claim 18,
wherein the dry etching is performed by using a gas including chlorine and oxygen.

26. The method for manufacturing a semiconductor device, according to claim 18,
wherein the gate insulating layer includes a silicon oxide.

27. The method for manufacturing a semiconductor device according to claim 9, further comprising:
forming a second semiconductor layer over the semiconductor layer;
wherein the second semiconductor layer is processed together with the semiconductor layer by the wet etching to form the island-shaped semiconductor layer and a second island-shaped semiconductor layer over the island-shaped semiconductor layer;
wherein the conductive layer is formed over the second island-shaped semiconductor layer; and
wherein the second island-shaped semiconductor layer is processed together with the island-shaped semiconductor layer by the second dry etching to form the recessed portion in the island-shaped semiconductor layer.

28. The method for manufacturing a semiconductor device according to claim 18, further comprising:
forming a second semiconductor layer over the semiconductor layer;
wherein the second semiconductor layer is processed together with the semiconductor layer by the wet etching to form a the island-shaped semiconductor layer and a second island-shaped semiconductor layer over the island-shaped semiconductor layer;
wherein the conductive layer is formed over the second island-shaped semiconductor layer; and
wherein the second island-shaped semiconductor layer is processed together with the island-shaped semiconductor layer by the dry etching to form the recessed portion in the island-shaped semiconductor layer.

29. The method for manufacturing a semiconductor device according to claim 9, further comprising:
performing a radical treatment to the recessed portion under an atmosphere comprising oxygen.

30. The method for manufacturing a semiconductor device according to claim 8,
  wherein a content of the oxygen in the gas including chlorine and oxygen is 15 volume % or more.

31. The method for manufacturing a semiconductor device according to claim 16,
  wherein a content of the oxygen in the gas including chlorine and oxygen is 15 volume % or more.

32. The method for manufacturing a semiconductor device according to claim 25,
  wherein a content of the oxygen in the gas including chlorine and oxygen is 15 volume % or more.

33. The method for manufacturing a semiconductor device according to claim 1, further comprising:
  performing a radical treatment including oxygen to the recessed portion.

34. The method for manufacturing a semiconductor device according to claim 18, further comprising:
  performing a radical treatment including oxygen to the recessed portion.

35. A method for manufacturing a semiconductor device comprising:
  forming a gate electrode;
  forming a gate insulating layer over the gate electrode;
  forming a semiconductor layer comprising an oxide semiconductor including indium over the gate insulating layer;
  processing the semiconductor layer by wet etching to form an island-shaped semiconductor layer, wherein the island-shaped semiconductor layer is overlapped with the gate electrode in such a manner that the island-shaped semiconductor layer does not extend beyond any side edge of the gate electrode;
  forming a conductive layer over the island-shaped semiconductor layer; and
  processing the conductive layer by dry etching to form a first conductive layer and a second conductive layer.

36. The method for manufacturing a semiconductor device according to claim 35,
  wherein an etchant for wet etching is a mixed solution including acetic acid, nitric acid, and phosphoric acid.

37. The method for manufacturing a semiconductor device according to claim 35,
  wherein the dry etching is performed by using a gas selected from the group consisting of boron chloride ($BCl_3$), silicon chloride ($SiCl_4$), carbon tetrachloride ($CCl_4$), carbon tetrafluoride ($CF_4$), sulfur fluoride ($SF_6$), nitrogen fluoride ($NF_3$), trifluoromethane ($CHF_3$), hydrogen bromide (HBr), and oxygen ($O_2$), any of these gases to which a rare gas such as helium (He), argon (Ar) is added, or chlorine ($Cl_2$).

38. The method for manufacturing a semiconductor device according to claim 35, further comprising:
  after processing the island-shaped semiconductor layer, heating the island-shaped semiconductor layer at 200 to 600° C.

39. The method for manufacturing a semiconductor device according to claim 35,
  wherein the island-shaped semiconductor layer comprises a crystal grain of the oxide semiconductor.

40. The method for manufacturing a semiconductor device according to claim 35,
  wherein the island-shaped semiconductor layer comprises a crystal grain of the oxide semiconductor, and
  wherein a diameter of the crystal grain is 1 to 10 nm.

41. The method for manufacturing a semiconductor device according to claim 35,
  wherein the oxide semiconductor is an In—Ga—Zn—O based oxide semiconductor.

42. The method for manufacturing a semiconductor device according to claim 35,
  wherein the dry etching is performed by using a gas including chlorine and oxygen.

43. The method for manufacturing a semiconductor device, according to claim 35,
  wherein the gate insulating layer includes a silicon oxide.

44. A method for manufacturing a semiconductor device comprising:
  forming a gate electrode;
  forming a gate insulating layer comprising a first oxide insulator over the gate electrode;
  forming a semiconductor layer comprising an oxide semiconductor including indium over the gate insulating layer;
  processing the semiconductor layer by wet etching to form an island-shaped semiconductor layer, wherein the island-shaped semiconductor layer is overlapped with the gate electrode in such a manner that the island-shaped semiconductor layer does not extend beyond any side edge of the gate electrode;
  forming a conductive layer over the island-shaped semiconductor layer;
  processing the conductive layer by dry etching to form a first conductive layer and a second conductive layer;
  forming a first insulating layer comprising a second oxide insulator over the semiconductor layer, the first conductive layer and the second conductive layer;
  forming a second insulating layer comprising a third oxide insulator over the first insulating layer;
  forming a third insulating layer comprising an organic insulator over the second insulating layer; and
  forming a pixel electrode over the third insulating layer so as to be electrically connected to one of the first conductive layer and the second conductive layer.

45. The method for manufacturing a semiconductor device according to claim 44,
  wherein an etchant for wet etching is a mixed solution including acetic acid, nitric acid, and phosphoric acid.

46. The method for manufacturing a semiconductor device according to claim 44,
  wherein the dry etching is performed by using a gas selected from the group consisting of boron chloride ($BCl_3$), silicon chloride ($SiCl_4$), carbon tetrachloride ($CCl_4$), carbon tetrafluoride ($CF_4$), sulfur fluoride ($SF_6$), nitrogen fluoride ($NF_3$), trifluoromethane ($CHF_3$), hydrogen bromide (HBr), and oxygen ($O_2$), any of these gases to which a rare gas such as helium (He), argon (Ar) is added, or chlorine ($Cl_2$).

47. The method for manufacturing a semiconductor device according to claim 44, further comprising:
  after processing the island-shaped semiconductor layer, heating the island-shaped semiconductor layer at 200 to 600° C.

48. The method for manufacturing a semiconductor device according to claim 44,
  wherein the island-shaped semiconductor layer comprises a crystal grain of the oxide semiconductor.

49. The method for manufacturing a semiconductor device according to claim 44,
  wherein the island-shaped semiconductor layer comprises a crystal grain of the oxide semiconductor, and
  wherein a diameter of the crystal grain is 1 to 10 nm.

50. The method for manufacturing a semiconductor device according to claim 44,
   wherein the oxide semiconductor is an In—Ga—Zn—O based oxide semiconductor.

51. The method for manufacturing a semiconductor device according to claim 44,
   wherein the dry etching is performed by using a gas including chlorine and oxygen.

52. The method for manufacturing a semiconductor device according to claim 44,
   wherein the first oxide insulator is a silicon oxide,
   wherein the second oxide insulator is a silicon oxide, and
   wherein the third oxide insulator is a silicon nitride.

53. The method for manufacturing a semiconductor device according to claim 52, wherein the first insulating layer and the second insulating layer are in contact with each other.

54. The method for manufacturing a semiconductor device according to claim 1, wherein the step of processing the island-shaped semiconductor layer by dry etching is performed after the step of forming the conductive layer.

* * * * *

UNITED STATES PATENT AND TRADEMARK OFFICE
CERTIFICATE OF CORRECTION

PATENT NO. : 8,912,040 B2
APPLICATION NO. : 13/012987
DATED : December 16, 2014
INVENTOR(S) : Hideomi Suzawa et al.

It is certified that error appears in the above-identified patent and that said Letters Patent is hereby corrected as shown below:

In the Specification

At column 25, line 52, "10 µs as to" should be --10 µs to--;

At column 32, line 35, "A1" should be --Al--;

At column 38, line 24, "mm" should be --mm.--;

At column 38, line 39, "mm" should be --mm.--;

In the Claims

In claim 28, at column 42, line 53, "form a the" should be --form the--.

Signed and Sealed this
Twelfth Day of May, 2015

Michelle K. Lee
*Director of the United States Patent and Trademark Office*